United States Patent
Kondo

(10) Patent No.: US 11,043,530 B2
(45) Date of Patent: Jun. 22, 2021

(54) LIGHT-EMITTING COMPONENT HAVING LIGHT-ABSORBING LAYER, LIGHT-EMITTING DEVICE, AND IMAGE FORMING APPARATUS

(71) Applicant: FUJIFILM Business Innovation Corp., Tokyo (JP)

(72) Inventor: Takashi Kondo, Kanagawa (JP)

(73) Assignee: FUJIFILM Business Innovation Corp., Tokyo (JP)

(*) Notice: Subject to any disclaimer, the term of this patent is extended or adjusted under 35 U.S.C. 154(b) by 226 days.

(21) Appl. No.: 15/891,381

(22) Filed: Feb. 8, 2018

(65) Prior Publication Data
US 2018/0234583 A1 Aug. 16, 2018

(30) Foreign Application Priority Data

| Feb. 13, 2017 | (JP) | JP2017-024433 |
| Sep. 21, 2017 | (JP) | JP2017-181724 |
| Sep. 21, 2017 | (JP) | JP2017-181727 |
| Sep. 21, 2017 | (JP) | JP2017-181730 |

(51) Int. Cl.
*H01L 29/74* (2006.01)
*H01L 31/111* (2006.01)
(Continued)

(52) U.S. Cl.
CPC ....... *H01L 27/15* (2013.01); *G03G 15/04054* (2013.01); *G03G 15/04072* (2013.01);
(Continued)

(58) Field of Classification Search
CPC ......... H01L 21/02532; H01L 21/02546; H01L 21/30612; H01L 29/125; H01L 29/127; H01L 29/2003; H01L 29/267; H01L 29/36; H01L 29/66401; H01L 29/7412; H01L 29/744; H01L 29/745; H01L 31/1113; H01L 33/0016; H01L 33/0041; H01L 33/0062; H01L 33/0066; H01L 33/06; H01L 33/30; H01L 33/32; H01S 5/026; H01S 5/042; H01S 5/062; H01S 5/18361;
(Continued)

(56) References Cited

U.S. PATENT DOCUMENTS

| 7,948,004 B2 | 5/2011 | Suzuki | |
| 2010/0231682 A1* | 9/2010 | Ohno | B41J 2/451 347/238 |
| 2015/0349197 A1* | 12/2015 | Watanabe | H01L 33/06 257/13 |

FOREIGN PATENT DOCUMENTS

| JP | 101238962 | 9/1989 |
| JP | 2001308385 | 11/2001 |
| JP | 2009286048 | 12/2009 |

* cited by examiner

*Primary Examiner* — Jami Valentine Miller
*Assistant Examiner* — Dilinh P Nguyen
(74) *Attorney, Agent, or Firm* — JCIPRNET

(57) ABSTRACT

A light-emitting component includes a light-emitting element, a driving thyristor, and a light-absorbing layer. The light-emitting element emits light of a predetermined wavelength. The driving thyristor causes the light-emitting element to emit light or causes an amount of light emitted by the light-emitting element to increase, upon entering an on-state. The light-absorbing layer is disposed between the light-emitting element and the driving thyristor such that the light-emitting element and the driving thyristor are stacked, and absorbs light emitted by the driving thyristor.

19 Claims, 24 Drawing Sheets

(51) Int. Cl.

| | | |
|---|---|---|
| H01L 27/15 | (2006.01) | |
| H01L 33/00 | (2010.01) | |
| H01L 29/745 | (2006.01) | |
| H01S 5/062 | (2006.01) | |
| H01S 5/32 | (2006.01) | |
| G03G 15/04 | (2006.01) | |
| H01S 5/183 | (2006.01) | |
| H04N 1/40 | (2006.01) | |
| H01S 5/026 | (2006.01) | |
| H01S 5/042 | (2006.01) | |
| H01S 5/20 | (2006.01) | |
| H05B 45/00 | (2020.01) | |
| H04N 1/028 | (2006.01) | |
| H01L 21/02 | (2006.01) | |
| H01L 21/306 | (2006.01) | |
| H01L 29/12 | (2006.01) | |
| H01L 29/20 | (2006.01) | |
| H01L 29/267 | (2006.01) | |
| H01L 29/36 | (2006.01) | |
| H01L 29/66 | (2006.01) | |
| H01L 29/744 | (2006.01) | |
| H01L 33/06 | (2010.01) | |
| H01L 33/30 | (2010.01) | |
| H01L 33/32 | (2010.01) | |
| H01S 5/187 | (2006.01) | |
| H01S 5/343 | (2006.01) | |
| G03G 15/043 | (2006.01) | |
| G03G 15/18 | (2006.01) | |
| H01L 25/065 | (2006.01) | |
| H01L 29/45 | (2006.01) | |
| H01L 33/40 | (2010.01) | |
| H01L 33/44 | (2010.01) | |
| H01L 33/62 | (2010.01) | |

(52) U.S. Cl.
CPC .. *H01L 21/02532* (2013.01); *H01L 21/02546* (2013.01); *H01L 21/30612* (2013.01); *H01L 29/125* (2013.01); *H01L 29/127* (2013.01); *H01L 29/2003* (2013.01); *H01L 29/267* (2013.01); *H01L 29/36* (2013.01); *H01L 29/66401* (2013.01); *H01L 29/744* (2013.01); *H01L 29/745* (2013.01); *H01L 29/7412* (2013.01); *H01L 31/1113* (2013.01); *H01L 33/0016* (2013.01); *H01L 33/0041* (2013.01); *H01L 33/0062* (2013.01); *H01L 33/0066* (2013.01); *H01L 33/06* (2013.01); *H01L 33/30* (2013.01); *H01L 33/32* (2013.01); *H01S 5/026* (2013.01); *H01S 5/0261* (2013.01); *H01S 5/042* (2013.01); *H01S 5/062* (2013.01); *H01S 5/187* (2013.01); *H01S 5/18361* (2013.01); *H01S 5/2022* (2013.01); *H01S 5/2027* (2013.01); *H01S 5/32* (2013.01); *H01S 5/34313* (2013.01); *H01S 5/34333* (2013.01); *H04N 1/02865* (2013.01); *H04N 1/40025* (2013.01); *H04N 1/40056* (2013.01); *H05B 45/00* (2020.01); *G03G 15/043* (2013.01); *G03G 15/18* (2013.01); *G03G 2215/0404* (2013.01); *G03G 2215/0409* (2013.01); *H01L 21/0262* (2013.01); *H01L 21/02631* (2013.01); *H01L 25/0655* (2013.01); *H01L 29/452* (2013.01); *H01L 33/40* (2013.01); *H01L 33/44* (2013.01); *H01L 33/62* (2013.01); *H01L 2933/0025* (2013.01); *H01S 5/0421* (2013.01); *H01S 5/06203* (2013.01); *H01S 5/18313* (2013.01); *H01S 5/18369* (2013.01); *H01S 5/18377* (2013.01); *H01S 5/2059* (2013.01); *H01S 2304/02* (2013.01); *H01S 2304/04* (2013.01)

(58) Field of Classification Search
CPC ...... H01S 5/187; H01S 5/2022; H01S 5/2027; H01S 5/32; H01S 5/34313; H01S 5/34333; H04N 1/02865; H04N 1/40025; H04N 1/40056; H05B 45/00; G03G 15/04054; G03G 15/04072; G03G 15/043; G03G 15/18
USPC ........................................................ 257/146
See application file for complete search history.

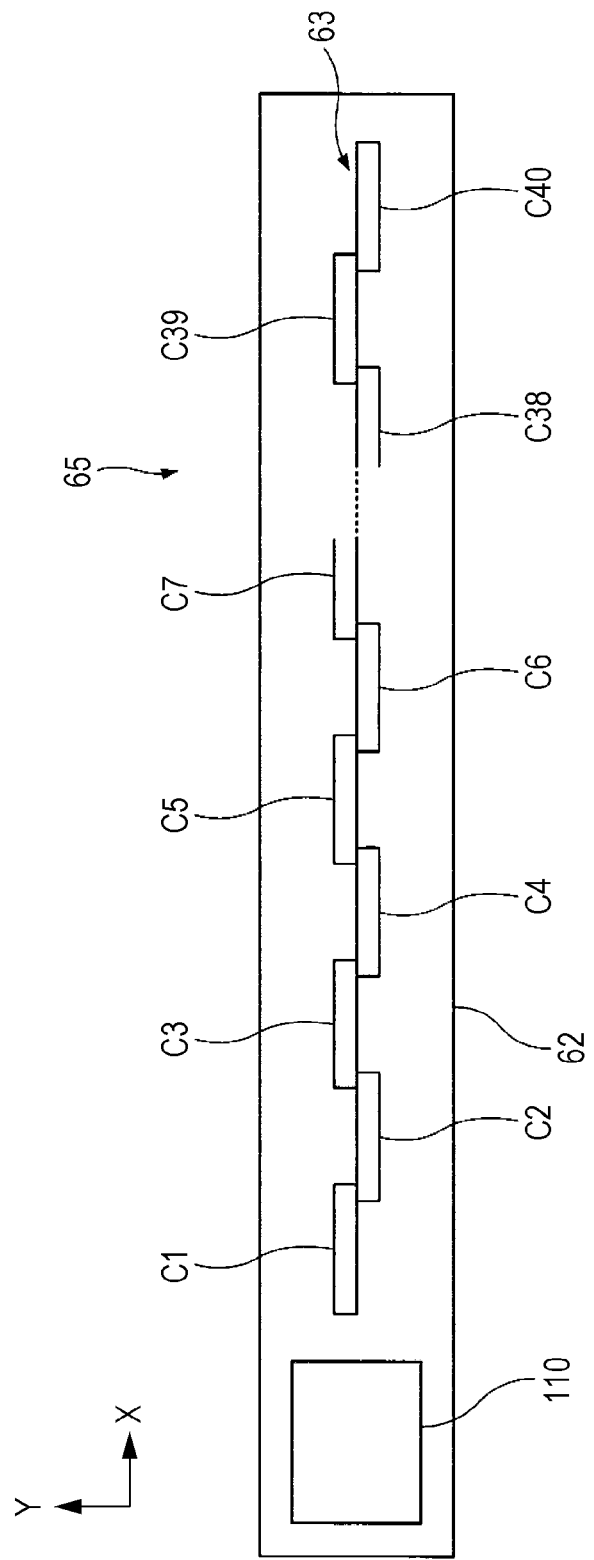

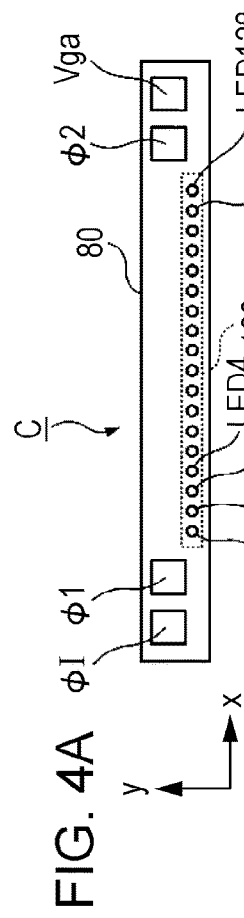
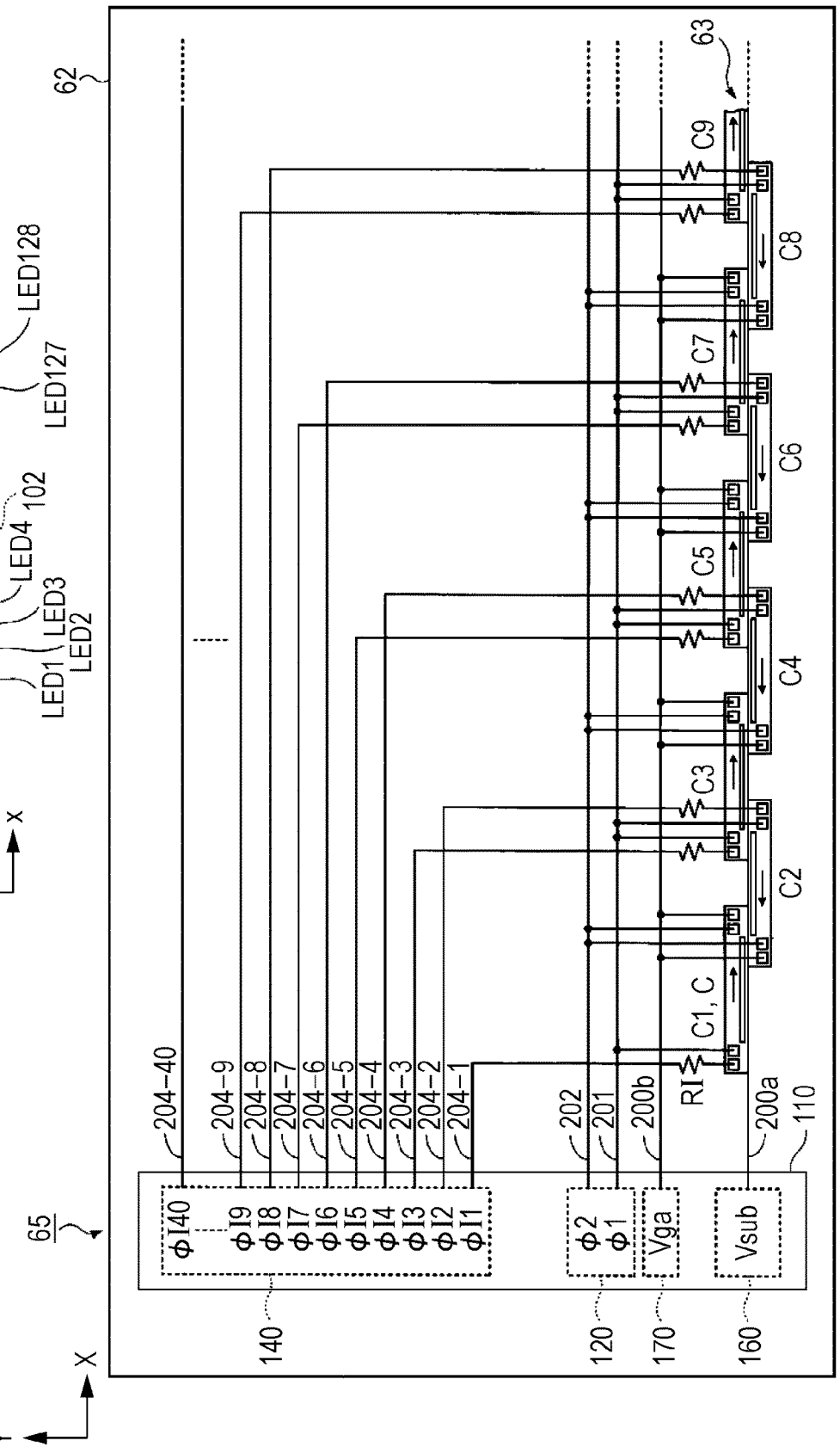

LIGHT-EMITTING COMPONENT HAVING LIGHT-ABSORBING LAYER, LIGHT-EMITTING DEVICE, AND IMAGE FORMING APPARATUS

CROSS-REFERENCE TO RELATED APPLICATIONS

This application is based on and claims priority under 35 USC 119 from Japanese Patent Application No. 2017-024433 filed Feb. 13, 2017, No. 2017-181724 filed Sep. 21, 2017, No. 2017-181727 filed Sep. 21, 2017, and No. 2017-181730 filed Sep. 21, 2017.

BACKGROUND

Technical Field

The present invention relates to a light-emitting component, a light-emitting device, and an image forming apparatus.

SUMMARY

According to an aspect of the invention, there is provided a light-emitting component including a light-emitting element, a driving thyristor, and a light-absorbing layer. The light-emitting element emits light of a predetermined wavelength. The driving thyristor causes the light-emitting element to emit light or causes an amount of light emitted by the light-emitting element to increase, upon entering an on-state. The light-absorbing layer is disposed between the light-emitting element and the driving thyristor such that the light-emitting element and the driving thyristor are stacked, and absorbs light emitted by the driving thyristor.

BRIEF DESCRIPTION OF THE DRAWINGS

Exemplary embodiments of the present invention will be described in detail based on the following figures, wherein:

FIG. 3 is a top view of an example of a light-emitting device;

FIGS. 4A and 4B illustrate an example of a configuration of a light-emitting chip, an example of a configuration of a signal generation circuit of the light-emitting device, and an example of a configuration of wires (lines) on a circuit board;

FIG. 6A is a plan layout view of the light-emitting chip and FIG. 6B is a cross-sectional view taken along line VIB-VIB illustrated in FIG. 6A;

FIG. 8A illustrates the case where the light-absorbing layer is constituted by a single n-type semiconductor layer, FIG. 8B illustrates the case where the light-absorbing layer is constituted by a single p-type semiconductor layer, FIG. 8C illustrates the case where the light-absorbing layer is constituted by plural n-type semiconductor layers, FIG. 8D illustrates the case where the light-absorbing layer is constituted by plural p-type semiconductor layers, and FIG. 8E illustrates the case where the light-absorbing layer is constituted by an n-type semiconductor layer and a p-type semiconductor layer;

DETAILED DESCRIPTION

Exemplary embodiments of the present invention will be described in detail below with reference to the accompanying drawings.

Note that a chemical symbol is used to represent a substance below in such a manner that Al is used for aluminum.

First Exemplary Embodiment

Image Forming Apparatus 1

Figure 1:
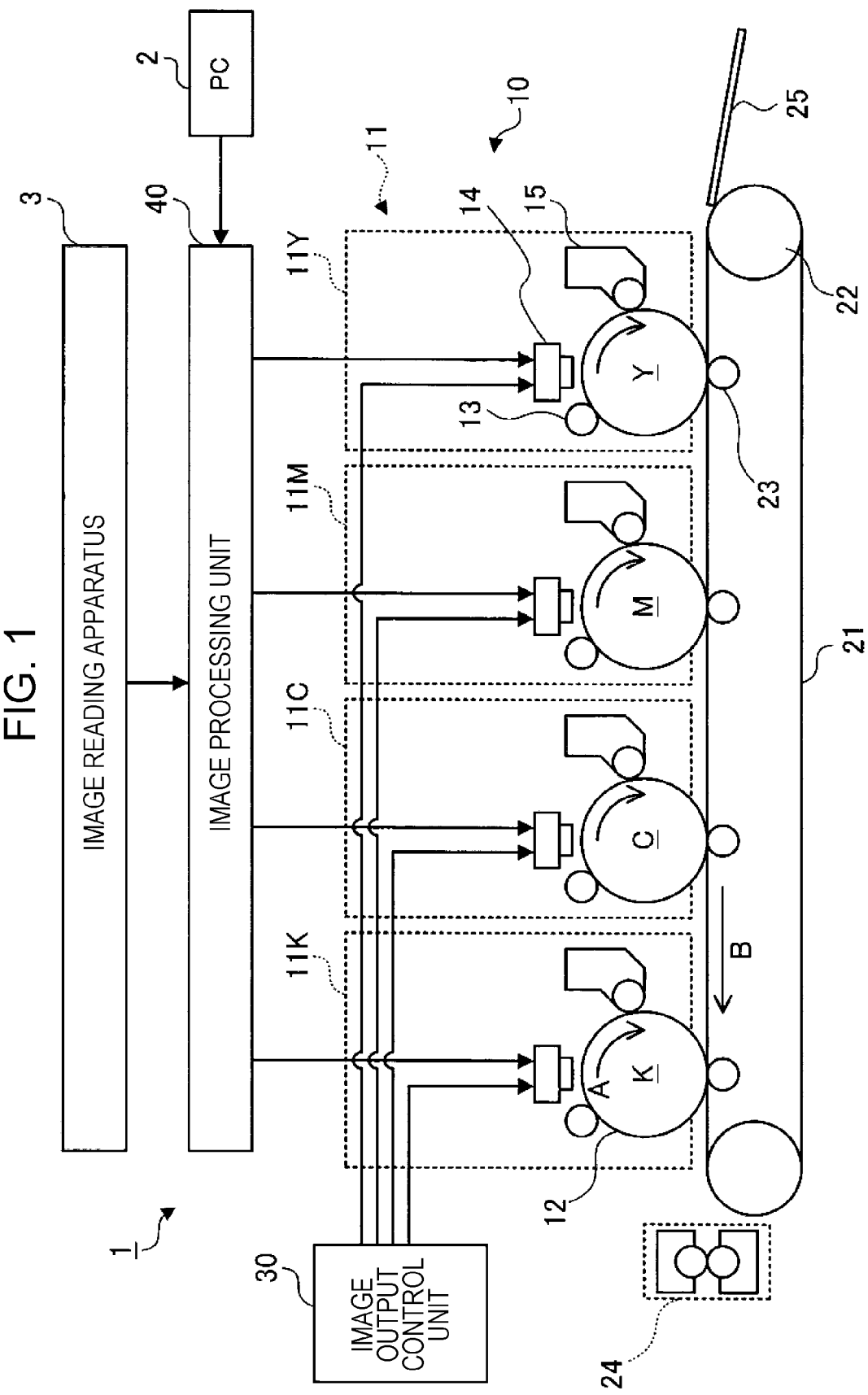
FIG. 1 illustrates an example of an overall configuration of an image forming apparatus to which a first exemplary embodiment is applied.

FIG. 1 illustrates an example of an overall configuration of an image forming apparatus 1 to which a first exemplary embodiment is applied. The image forming apparatus 1 illustrated in FIG. 1 is an image forming apparatus generally called a tandem type. The image forming apparatus 1 includes an image forming process unit 10, an image output control unit 30, and an image processing unit 40. The image forming process unit 10 forms an image in accordance with image data of each color. The image output control unit 30 controls the image forming process unit 10. The image processing unit 40 is connected to, for example, a personal computer (PC) 2 and an image reading apparatus 3 and performs predetermined image processing on image data received from the PC 2 and the image reading apparatus 3.

The image forming process unit 10 includes image forming units 11Y, 11M, 11C, and 11K that are disposed in parallel to each other with a predetermined space therebetween. The image forming units 11Y, 11M, 11C, and 11K are referred to as image forming units 11 when they are not distinguished from one another. Each of the image forming units 11 includes a photoconductor drum 12, a charger 13, a printhead 14, and a developer 15. The photoconductor drum 12, which is an example of an image bearing member, bears an electrostatic latent image and a toner image formed thereon. The charger 13, which is an example of a charging member, charges the surface of the photoconductor drum 12 to a predetermined potential. The printhead 14 exposes the photoconductor drum 12 that has been charged by the charger 13 to light. The developer 15, which is an example of a developing member, develops the electrostatic latent image obtained by the printhead 14. The image forming units 11Y, 11M, 11C, and 11K form toner images of yellow (Y), magenta (M), cyan (C), and black (K), respectively.

The image forming process unit 10 also includes a sheet transporting belt 21, a drive roll 22, transfer rolls 23, and a fixer 24 to transfer the toner images of the respective colors formed on the photoconductor drums 12 of the respective image forming units 11Y, 11M, 11C, and 11K onto a recording sheet 25 so that the toner images are superimposed together. The recording sheet 25 is an example of a transferred-image-receiving medium. The sheet transporting belt 21 transports the recording sheet 25. The drive roll 22 drives the sheet transporting belt 21. Each of the transfer rolls 23, which is an example of a transfer member, transfers the corresponding toner image on the corresponding photoconductor drum 12 onto the recording sheet 25. The fixer 24 fixes the toner images on the recording sheet 25.

In the image forming apparatus 1, the image forming process unit 10 performs an image forming operation in accordance with various control signals supplied thereto from the image output control unit 30. Under control of the image output control unit 30, the image processing unit 40 performs image processing on image data received from the PC 2 or the image reading apparatus 3 and supplies the resultant image data to the image forming units 11. Then, for example, in the image forming unit 11K for black (K), the photoconductor drum 12 is charged to a predetermined potential by the charger 13 while rotating in a direction of an arrow A and is exposed to light by the printhead 14 that emits light on the basis of the image data supplied thereto from the image processing unit 40. Consequently, an electrostatic latent image for an image of black (K) is formed on the photoconductor drum 12. The electrostatic latent image formed on the photoconductor drum 12 is then developed by the developer 15, and consequently a toner image of black (K) is formed on the photoconductor drum 12. Toner images of yellow (Y), magenta (M), and cyan (C) are formed in the image forming units 11Y, 11M, and 11C, respectively.

The toner images of the respective colors formed on the respective photoconductor drums 12 in the corresponding image forming units 11 are sequentially transferred electrostatically onto the recording sheet 25 that is fed in response to a movement of the sheet transporting belt 21 moving in a direction of an arrow B, by a transfer electric field applied to the transfer rolls 23. Consequently, a combined toner image in which the toner images of the respective colors are superimposed together is formed on the recording sheet 25.

Then, the recording sheet 25 having the electrostatically transferred combined toner image is transported to the fixer 24. The combined toner image on the recording sheet 25 transported to the fixer 24 undergoes a heat/pressure-based fixing process performed by the fixer 24 and is fixed on the recording sheet 25. Then, the recording sheet 25 is discharged from the image forming apparatus 1.

Printhead 14

Figure 2:
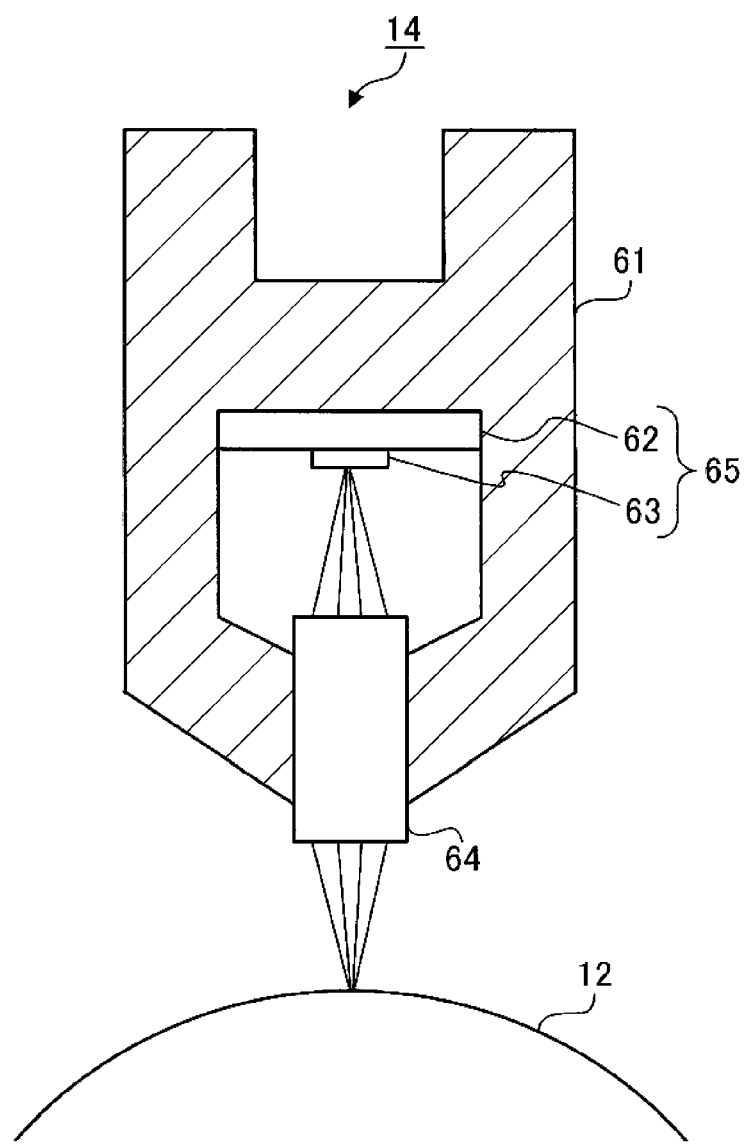
FIG. 2 is a cross-sectional view illustrating an example of a configuration of a printhead.

FIG. 2 is a cross-sectional view illustrating an example of a configuration of the printhead 14. The printhead 14, which is an example of an exposure device, includes a housing 61, a light-emitting device 65, and a rod lens array 64. The light-emitting device 65, which is an example of a light-emitting device, includes a light source unit 63 including plural light-emitting elements that expose the photoconductor drum 12 to light. In the first exemplary embodiment, the light-emitting elements are light-emitting diodes (LEDs), each of which is an example of a light-emitting element. The rod lens array 64, which is an example of an optical system, focuses the light emitted from the light source unit 63 onto the surface of the photoconductor drum 12 to form an image thereon.

The light-emitting device 65 includes a circuit board 62 on which the light source unit 63 described above, a signal generation circuit 110 (described later with reference to FIG. 3) that drives the light source unit 63, and so forth are mounted.

The housing 61 is formed of a metal, for example. The housing 61 supports the circuit board 62 and the rod lens array 64 to set the light-emitting surface of the light-emitting elements of the light source unit 63 to be a focal plane of the rod lens array 64. In addition, the rod lens array 64 is disposed in an axial direction of the photoconductor drum 12 (which is a main scanning direction and an X direction in FIGS. 3 and 4B described later).

Light-Emitting Device 65

FIG. 3 is a top view of an example of the light-emitting device 65.

In the light-emitting device 65 illustrated by way of example in FIG. 3, the light source unit 63 includes 40 light-emitting chips C1 to C40 arranged in two lines in the X direction which is the main scanning direction on the circuit board 62 to form a staggered pattern. The light-emitting chips C1 to C40, each of which is an example of a light-emitting component, are referred to as light-emitting chips C when they are not distinguished from one another. The light-emitting chips C1 to C40 may have an identical configuration.

Herein, a symbol "-" or a word "to" is used to indicate plural components that are distinguished from one another using numbers and indicates that the plural components include components that are assigned the numbers preceding and following the symbol "-" or the word "to" and components that are assigned numbers between the preceding and following numbers. For example, the light-emitting chips C1-C40 (C1 to C40) include the light-emitting chip C1 through the light-emitting chip C40 in the numbered order.

In the first exemplary embodiment, 40 light-emitting chips C in total are used; however, the number of light-emitting chips C is not limited to 40.

The light-emitting device 65 includes the signal generation circuit 110 that drives the light source unit 63. The signal generation circuit 110 is constituted by an integrated circuit (IC), for example. Note that the light-emitting device 65 need not necessarily include the signal generation circuit 110. In such a case, the signal generation circuit 110 is provided outside the light-emitting device 65 and supplies control signals for controlling the light-emitting chips C or the like to the light-emitting device 65 through a cable or the like. The description is given herein on the assumption that the light-emitting device 65 includes the signal generation circuit 110.

An arrangement of the light-emitting chips C will be described in detail later.

FIGS. 4A and 4B illustrate an example of a configuration of each of the light-emitting chips C, an example of a configuration of the signal generation circuit 110 of the light-emitting device 65, and an example of a configuration of wires (lines) on the circuit board 62. Specifically, FIG. 4A illustrates the configuration of the light-emitting chip C, and FIG. 4B illustrates the configuration of the signal generation circuit 110 of the light-emitting device 65 and the configuration of wires (lines) on the circuit board 62. Note that FIG. 4B illustrates the light-emitting chips C1 to C9 among the light-emitting chips C1 to C40.

First, the configuration of the light-emitting chip C illustrated in FIG. 4A will be described.

The light-emitting chip C includes a light-emitting unit 102 including plural light-emitting elements arranged in a line along long sides to be closer to one of the long sides on a front surface of a substrate 80 that has a rectangular shape. In the first exemplary embodiment, the plural light-emitting elements are light-emitting diodes LED1 to LED128. The light-emitting diodes LED1 to LED128 are referred to as light-emitting diodes LED when they are not distinguished from one another. The light-emitting chip C further includes terminals ($\phi 1$, $\phi 2$, Vga, and $\phi I$) at respective ends of a long-side direction on the front surface of the substrate 80. The terminals are plural bonding pads for receiving various control signals, for example. These terminals are disposed in an order of the terminal $\phi I$ and the terminal $\phi 1$ from one of the ends of the substrate 80 and in an order of the terminal Vga and the terminal $\phi 2$ from the other end of the substrate 80. The light-emitting unit 102 is disposed between the terminals $\phi 1$ and $\phi 2$. A back-surface electrode 91 (see FIGS. 6A and 6B described later), which serves as a terminal Vsub, is also disposed on a back surface of the substrate 80. A direction in which the light-emitting elements (i.e., the light-emitting diodes LED1-LED128) are arranged on the front surface of the substrate 80 is defined as an x direction, and a direction perpendicular to the x direction is defined as a y direction.

Note that the expression "arranged in a line" refers not only to a state in which plural light-emitting elements are arranged in a line as illustrated in FIG. 4A but also to a state in which the plural light-emitting elements are shifted from each other by different displacement amounts in a direction perpendicular to the direction of the line. For example, the light-emitting elements may be arranged to be shifted from each other by a displacement amount in a direction perpendicular to the direction of the line. In addition, sets of adjacent light-emitting elements or of plural light-emitting elements may be arranged in a zigzag pattern.

The configuration of the signal generation circuit 110 of the light-emitting device 65 and the configuration of wires (lines) on the circuit boards 62 will be described next with reference to FIG. 4B.

As described above, the signal generation circuit 110 and the light-emitting chips C1 to C40 are mounted on the circuit board 62 of the light-emitting device 65, and wires (lines) that connect the signal generation circuit 110 and the respective light-emitting chips C1 to C40 to each other are provided on the circuit board 62.

The configuration of the signal generation circuit 110 will be described first.

The signal generation circuit 110 receives various control signals and pieces of image data that have been subjected to image processing respectively from the image output control unit 30 and the image processing unit 40 (see FIG. 1). The signal generation circuit 110 rearranges the pieces of image data and corrects an amount of light on the basis of the pieces of image data and the various control signals.

The signal generation circuit 110 includes a transfer signal generation unit 120 that sends a first transfer signal $\phi 1$ and a second transfer signal $\phi 2$ to the light-emitting chips C1 to C40 on the basis of the various control signals.

The signal generation circuit 110 also includes a turn-on signal generation unit 140 that sends turn-on signals $\phi I1$ to $\phi I40$ to the light-emitting chips C1 to C40 on the basis of the various control signals, respectively. The turn-on signals $\phi I1$ to $\phi I40$ are referred to as turn-on signals $\phi I$ when they are not distinguished from each other.

The signal generation circuit 110 further includes a reference potential supplying unit 160 and a power supply potential supplying unit 170. The reference potential supplying unit 160 supplies a reference positional Vsub, which serves as a reference of the potential, to the light-emitting chips C1 to C40. The power supply potential supplying unit 170 supplies a power supply potential Vga for driving the light-emitting chips C1 to C40.

The arrangement of the light-emitting chips C1 to C40 will be described next.

Odd-numbered light-emitting chips C1, C3, C5, . . . are arranged in a line in a long-side direction of the substrate 80 with a space interposed therebetween. Even-numbered light-emitting chips C2, C4, C6, . . . are also arranged in a line in the long-side direction of the substrate 80 with a space interposed therebetween. The odd-numbered light-emitting chips C1, C3, C5, . . . and the even-numbered light-emitting chips C2, C4, C6, . . . are arranged in a staggered pattern with being rotated by 180° from each other so that the long sides close to the light-emitting units 102 on the adjacent odd-numbered and even-numbered light-emitting chips C face each other. Positions of the light-emitting chips C are set such that the light-emitting diodes LED of the light-emitting chips C are arranged in the main scanning direction (X direction) at predetermined intervals. Note that a direction in which the light-emitting elements of the light-emitting unit 102 illustrated in FIG. 4A are arranged (i.e., the numbered order of the light-emitting diodes LED1 to LED128 in the first exemplary embodiment) is indicated using an arrow in each of the light-emitting chips C1 to C40 in FIG. 4B.

The wires (lines) that connect the signal generation circuit 110 and the light-emitting chips C1 to C40 to each other will be described.

A power supply line 200a is provided on the circuit board 62. The power supply line 200a is connected to the back-surface electrodes 91 (see FIGS. 6A and 6B described later) which serve as the terminals Vsub disposed on the back surfaces of the substrates 80 of the respective light-emitting chips C and supplies the reference potential Vsub.

A power supply line 200b is also provided on the circuit board 62. The power supply line 200b supplies the power supply potential Vga for driving. The power supply line 200b connects the power supply potential supplying unit 170 of the signal generation circuit 110 and the terminals Vga provided in the respective light-emitting chips C to each other.

A first transfer signal line 201 and a second transfer signal line 202 are provided on the circuit board 62. The first transfer signal line 201 is used to send the first transfer signal φ1 from the transfer signal generation unit 120 of the signal generation circuit 110 to the terminals φ1 of the respective light-emitting chips C1 to C40. The second transfer signal line 202 is used to send the second transfer signal φ2 from the transfer signal generation unit 120 of the signal generation circuit 110 to the terminals φ2 of the respective light-emitting chips C1 to C40. The first transfer signal φ1 and the second transfer signal φ2 are sent to the light-emitting chips C1 to C40 in common (in parallel).

In addition, turn-on signal lines 204-1 to 204-40 are provided on the circuit board 62. The turn-on signal lines 204-1 to 204-40 are used to send the turn-on signals φI1 to φI40 from the turn-on signal generation unit 140 of the signal generation circuit 110 to the terminals φI of the light-emitting chips C1 to C40 through respective current-limiting resistors RI, respectively. The turn-on signal lines 204-1 to 204-40 are referred to as turn-on signal lines 204 when they are not distinguished from one another.

As described above, the reference potential Vsub and the power supply potential Vga are supplied to all the light-emitting chips C1 to C40 on the circuit board 62 in common. The first transfer signal φ1 and the second transfer signal φ2 are also sent to the light-emitting chips C1 to C40 in common (in parallel). On the other hand, the turn-on signals φI1 to φI40 are individually sent to the light-emitting chips C1 to C40, respectively.

Light-Emitting Chip C

Figure 5:
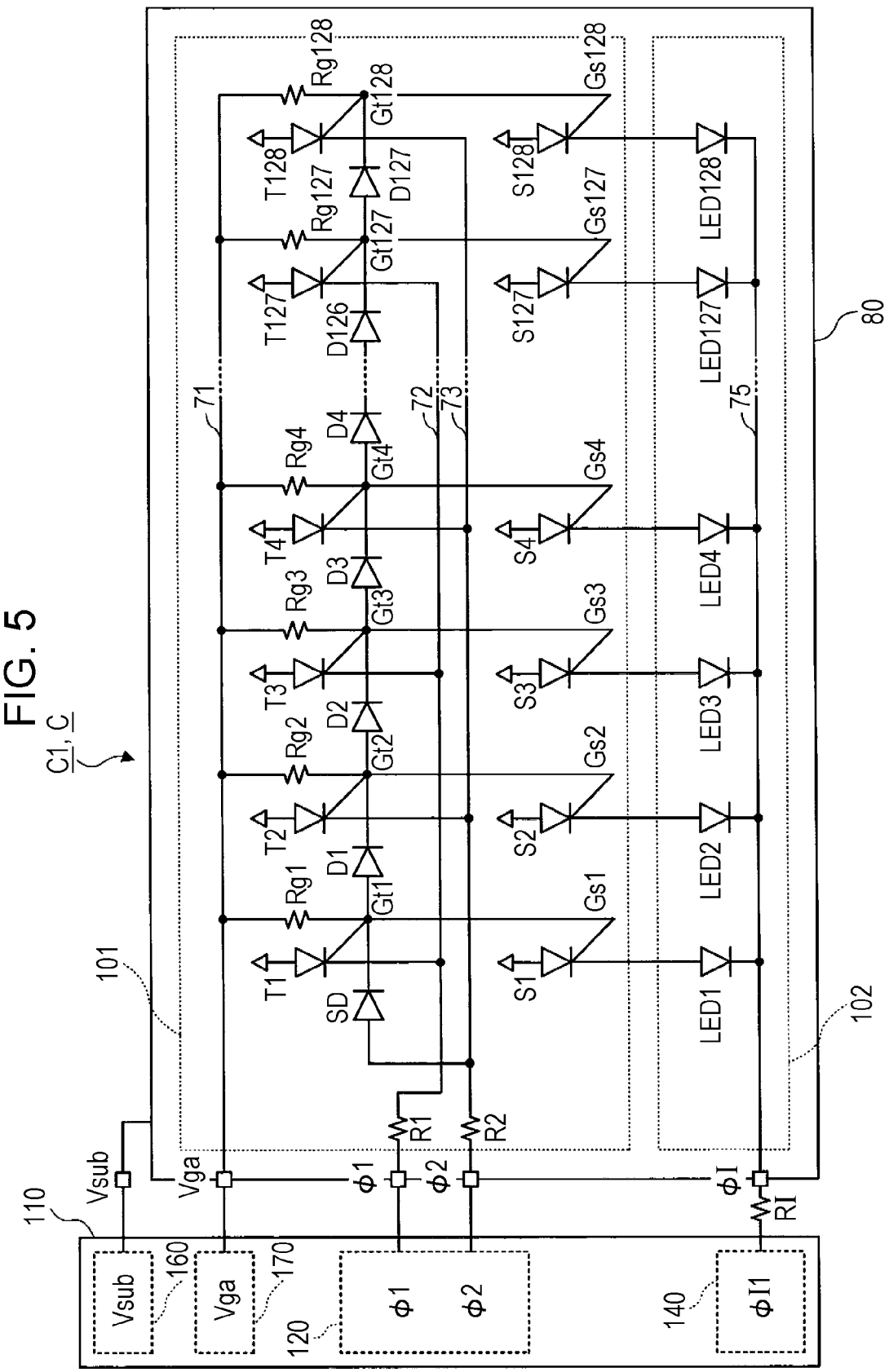
FIG. 5 is an equivalent circuit diagram illustrating a circuit configuration of the light-emitting chip in which a self-scanning light-emitting device (SLED) array according to the first exemplary embodiment is mounted.

FIG. 5 is an equivalent circuit diagram illustrating a circuit configuration of the light-emitting chip C in which an SLED array according to the first exemplary embodiment is mounted. Elements described below are arranged in accordance with the layout (see FIGS. 6A and 6B described later) on the light-emitting chip C except for the terminals (φ1, φ2, Vga, and φI). Note that the positions of the terminals (φ1, φ2, Vga, and φI) are different from those illustrated in FIG. 4A because the terminals are illustrated on the left end in FIG. 5 in order to describe connections with the signal generation circuit 110. The terminal Vsub provided on the back surface of the substrate 80 is illustrated outside the substrate 80 as an extended terminal.

The light-emitting chips C will be described in relationship with the signal generation circuit 110 by using the light-emitting chip C1 by way of example. Accordingly, the light-emitting chip C is referred to as the light-emitting chip C1(C) in FIG. 5. The other light-emitting chips C2 to C40 have the same or substantially the same configuration as the light-emitting chip C1.

The light-emitting chip C1(C) includes the light-emitting unit 102 (see FIG. 4A) including the light-emitting diodes LED1 to LED128.

The light-emitting chip C1(C) also includes driving thyristors S1 to S128, which are referred to driving thyristors S when they are not distinguished from one another. The light-emitting diodes LED1 to LED128 are connected to the driving thyristors S1 to S128, respectively, such that the light-emitting diode LED and the driving thyristor that are assigned the same number are connected in series.

Figure 6B:
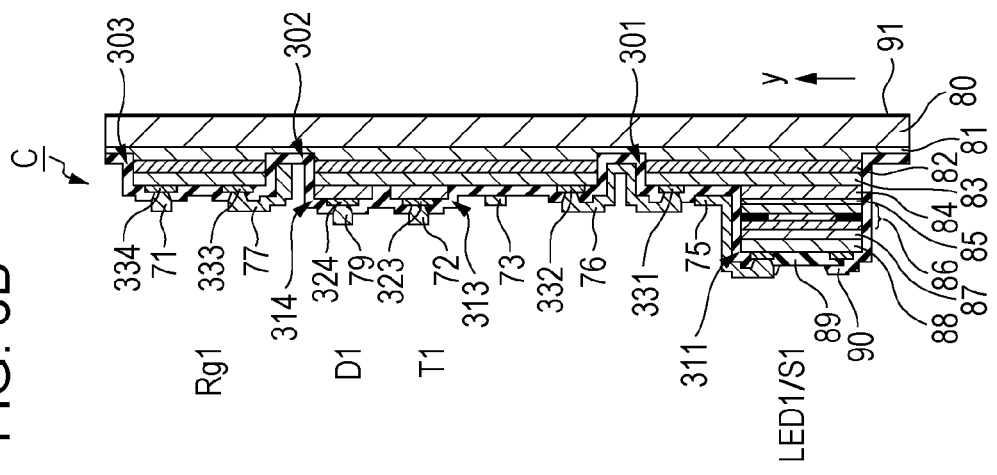
FIGS. 6A and 6B are examples of a plan layout view and a cross-sectional view of the light-emitting chip according to the first exemplary embodiment, specifically.

As illustrated in FIG. 6B described later, the light-emitting diodes LEDs that are arranged in a line on the substrate 80 are stacked on the respective driving thyristors S. Thus, the driving thyristors S1 to S128 are also arranged in a line. Since the driving thyristors S set (control) on/off of the respective light-emitting diodes LED as described later, the driving thyristors S are elements that drive the respective light-emitting diodes LED. Note that the driving thyristors S are sometimes simply referred to as thyristors.

The light-emitting chip C1(C) further includes transfer thyristors T1 to T128 that are also arranged in a line just like the light-emitting diodes LED1 to LED128 and the driving thyristors S1 to S128. The transfer thyristors T1 to T128 are referred to as transfer thyristors T when they are not distinguished from one another.

Although the description is given here by using the transfer thyristors T as an example of transfer elements, the transfer elements may be any other circuit elements that sequentially turn on. For example, a shift register or a circuit element including a combination of plural transistors may be alternatively used.

In addition, the light-emitting chip C1(C) includes coupling diodes D1 to D127 disposed between respective pairs of the transfer thyristors T1 to T128 in the numbered order. The coupling diodes D1 to D127 are referred to as coupling diodes D when they are not distinguished from one another.

Furthermore, the light-emitting chip C1(C) includes power supply line resistors Rg1 to Rg128, which are referred to as power supply line resistors Rg when they are not distinguished from one another.

The light-emitting chip C1(C) also includes a start diode SD. In addition, the light-emitting chip C1(C) includes current-limiting resistors R1 and R2 that are provided to prevent an excessive current from flowing through a first transfer signal line 72 (described later) used to send the first transfer signal φ1 and through a second transfer signal line 73 (described later) used to send the second transfer signal φ2.

In this example, the driving thyristors S1 to S128, the transfer thyristors T1 to T128, the power supply line resistors Rg1 to Rg128, the coupling diodes D1 to D127, the start diode SD, and the current-limiting resistors R1 and R2 constitute a transfer unit 101.

The light-emitting diodes LED1 to LED128 of the light-emitting unit 102 and the driving thyristors S1 to S128 and the transfer thyristors T1 to T128 of the transfer unit 101 are arranged in the numbered order from the left in FIG. 5. Further, the coupling diodes D1 to D127 and the power supply line resistors Rg1 to Rg128 are also arranged in the numbered order from the left in FIG. 5.

The transfer unit 101 and the light-emitting unit 102 are arranged in this order from the top in FIG. 5.

In the first exemplary embodiment, the number of light-emitting diodes LED of the light-emitting unit 102 and the number of driving thyristors S, the number of transfer thyristors T, and the number of power supply line resistors Rg of the transfer unit 101 are set equal to 128. The number of coupling diodes D is equal to 127, which is less than the number of transfer thyristors T by 1.

The numbers of light-emitting diodes LED and other elements are not limited to the above numbers and may be set equal to predetermined numbers. The number of transfer thyristors T may be greater than the number of light-emitting diodes LED.

Each of the light-emitting diodes LED is a two-terminal semiconductor element having an anode terminal (anode) and a cathode terminal (cathode). Each of the thyristors (the driving thyristors S and the transfer thyristors T) is a three-terminal semiconductor element having an anode terminal (anode), a gate terminal (gate), and a cathode terminal (cathode). Each of the coupling diode D and the start diode SD is a two-terminal semiconductor element having an anode terminal (anode) and a cathode terminal (cathode).

Note that the light-emitting diodes LED, the thyristors (the driving thyristors S and the transfer thyristors T), the coupling diode D, and the start diode SD do not necessarily have the anode terminal, the gate terminal, or the cathode terminal that is formed as an electrode in some cases. Thus, hereinafter, the anode terminal, the gate terminal, and the cathode terminal are sometimes referred to as an anode, a gate, or a cathode, respectively.

Electrical connections between the elements of the light-emitting chip C1(C) will be described next.

The anodes of the transfer thyristors T and the driving thyristors S are connected to the substrate 80 of the light-emitting chip C1(C) (anode-common).

These anodes are connected to the power supply line 200a (see FIG. 4A) through the back-surface electrode 91 (see FIG. 6B described later) which is the terminal Vsub provided on the back surface of the substrate 80. This power supply line 200a is supplied with the reference potential Vsub from the reference potential supplying unit 160.

Note that this connection is a configuration implemented when a p-type substrate is used as the substrate 80. When an n-type substrate is used, the polarity is reversed. When an intrinsic (i-type) substrate that is not doped with any impurities is used, a terminal connected to the power supply line 200a that supplies the reference potential Vsub is provided on the side of the substrate on which the transfer unit 101 and the light-emitting unit 102 are disposed.

The cathodes of the odd-numbered transfer thyristors T1, T3, . . . are connected to the first transfer signal line 72 along the line of the transfer thyristors T. The first transfer signal line 72 is connected to the terminal φ1 through the current-limiting resistor R1. The first transfer signal line 201 (see FIG. 4B) is connected to the terminal φ1, and the first transfer signal φ1 is sent to the terminal φ1 from the transfer signal generation unit 120.

On the other hand, the cathodes of the even-numbered transfer thyristors T2, T4, . . . are connected to the second transfer signal line 73 along the line of the transfer thyristors T. The second transfer signal line 73 is connected to the terminal φ2 through the current-limiting resistor R2. The second transfer signal line 202 (see FIG. 4B) is connected to the terminal φ2, and the second transfer signal φ2 is sent to the terminal φ2 from the transfer signal generation unit 120.

The cathodes of the light-emitting diodes LED1 to LED128 are connected to a turn-on signal line 75. The turn-on signal line 75 is connected to the terminal φI. The terminal φI of the light-emitting chip C1 is connected to the turn-on signal line 204-1 through the current-limiting resistor RI that is provided outside the light-emitting chip C1(C), and the turn-on signal φI1 is sent to the terminal φI from the turn-on signal generation unit 140 (see FIG. 4B). The turn-on signal φI1 supplies a current for turning on the light-emitting diodes LED1 to LED128. Note that the turn-on signal lines 204-2 to 204-40 are respectively connected to the terminals φI of the other light-emitting chips C2 to C40 through the respective current-limiting resistors RI, and the turn-on signals φI2 to φI40 are sent to the respective terminals φI from the turn-on signal generation unit 140 (see FIG. 4B).

Gates Gt1 to Gt128 of the transfer thyristors T1 to T128 are connected to gates Gs1 to Gs128 of the driving thyristors S1 to S128, respectively, to have a one-to-one correspondence. The gates Gt1 to Gt128 are referred to as gates Gt when they are not distinguished from one another, and the gates Gs1 to Gs128 are referred to as gates Gs when they are not distinguished from one another. Thus, each pair of gates assigned the same number among the gates Gt1 to Gt128 and the gates Gs1 to Gs128 has an electrically equal potential. For example, the expression "gate Gt1 (gate Gs1)" indicates that the gate Gt1 and the gate Gs1 have an equal potential.

Each of the coupling diodes D1 to D127 is connected between a corresponding pair of gates Gt, which are two of the gates Gt1 to Gt128 of the transfer thyristors T1 to T128 in the numbered order. That is, the coupling diodes D1 to D127 are connected in series so that each of the coupling diodes D1 to D127 is interposed between a corresponding pair among the gates Gt1 to Gt128. The coupling diode D1 is connected so that current flows from the gate Gt1 to the gate Gt2. The same applies to the other coupling diodes D2 to D127.

The gates Gt (gates Gs) of the transfer thyristors T are connected to a power supply line 71 through the respective power supply line registers Rg provided for the corresponding transfer thyristors T. The power supply line 71 is connected to the terminal Vga. The power supply line 200b (see FIG. 4B) is connected to the terminal Vga, and the terminal Vga is supplied with the power supply potential Vga from the power supply potential supplying unit 170.

The gate Gt1 of the transfer thyristor T1 is connected to the cathode terminal of the start diode SD. The anode of the start diode SD is connected to the second transfer signal line 73.

Figure 6A:
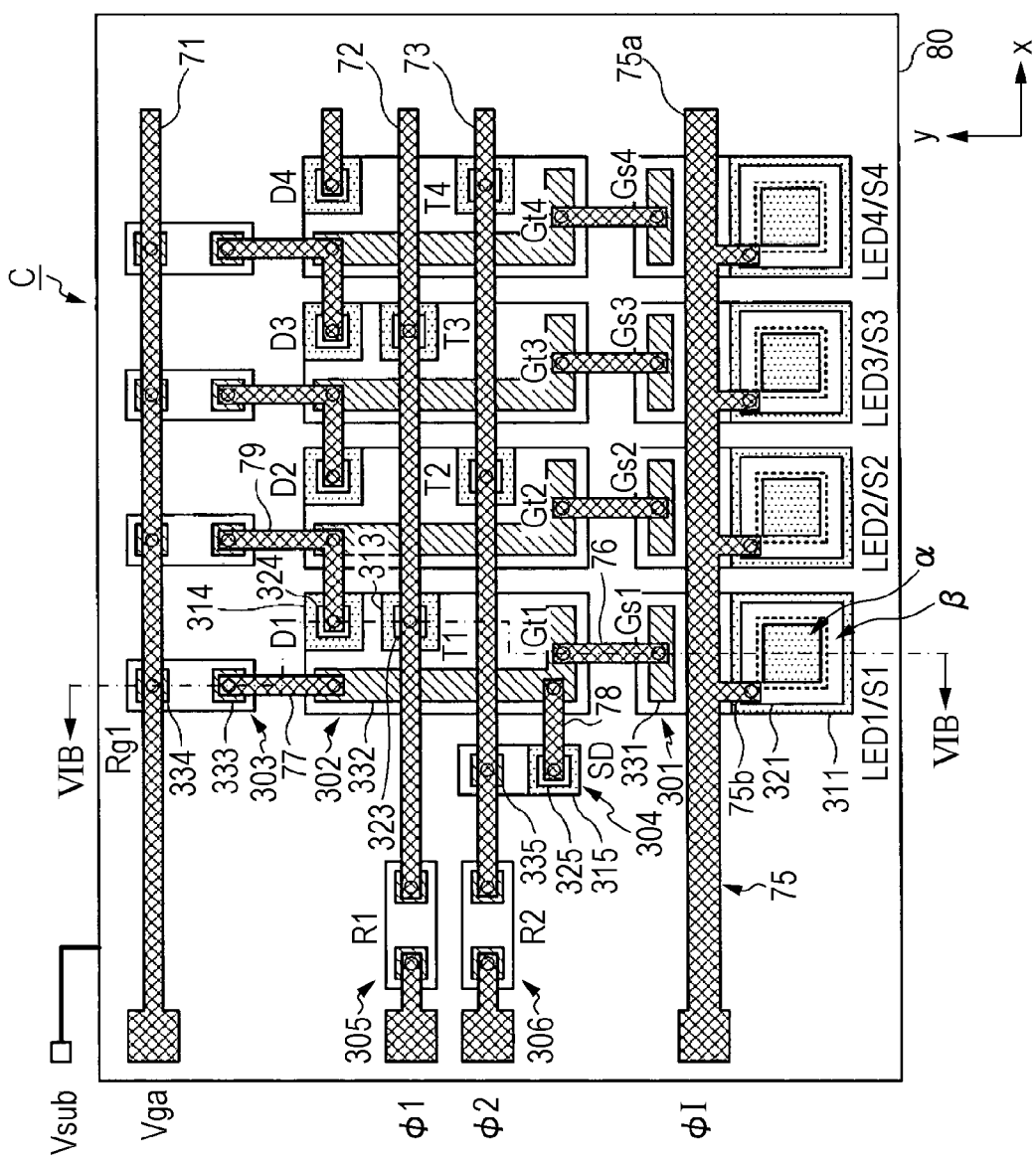

FIGS. 6A and 6B are an example of a plan layout view and a cross-sectional view of the light-emitting chip C according to the first exemplary embodiment. Specifically, FIG. 6A is a plan layout view of the light-emitting chip C, and FIG. 6B is a cross-sectional view taken along line VIB-VIB illustrated in FIG. 6A. Since connections between the light-emitting chips C and the signal generation circuit 110 are not illustrated in FIGS. 6A and 6B, it is not necessarily to use the light-emitting chip C1 by way of example. Thus, the term "light-emitting chip C" is used.

FIG. 6A mainly illustrates a portion around the light-emitting diodes LED1 to LED4, the driving thyristors S1 to S4, and the transfer thyristors T1 to T4. Note that the terminals ($\phi1$, $\phi2$, Vga, and $\phi I$) are illustrated at the left end portion in FIG. 6A for convenience of explanation, and these positions of the terminals are different from those illustrated in FIG. 4A. The terminal Vsub (the back-surface electrode 91) disposed on the back surface of the substrate 80 is illustrated outside the substrate 80 as an extended terminal. When the terminals are disposed in accordance with FIG. 4A, the terminals $\phi2$ and Vga and the current-limiting resistor R2 are disposed at a right end portion of the substrate 80. In addition, the start diode SD may be disposed on the right end portion of the substrate 80.

FIG. 6B, which is a cross-sectional view taken along line VIB-VIB illustrated in FIG. 6A, illustrates the light-emitting diode LED1/the driving thyristor S1, the transfer thyristor T1, the coupling diode D1, and the power supply line resistor Rg1 sequentially from the bottom. Note that the light-emitting diode LED1 and the driving thyristor S1 are stacked together. Herein, the stack of the light-emitting diode LED1 and the driving thyristor S1 is referred to as the light-emitting diode LED1/the driving thyristor S1. The same applies to the other cases.

FIGS. 6A and 6B illustrate major elements and terminals using reference signs thereof. Note that a direction in which the light-emitting diodes LED (light-emitting diodes LED1 to LED4) are arranged on the front surface of the substrate 80 is defined as an x direction, and a direction perpendicular to the x direction is defined as a y direction. A direction from the back surface to the front surface of the substrate 80 is defined as a z direction.

First, the cross-sectional structure of the light-emitting chip C is described with reference to FIG. 6B.

A p-type anode layer 81 (the p-anode layer 81), an n-type gate layer 82 (the n-gate layer 82), a p-type gate layer 83 (the p-gate layer 83), and an n-type cathode layer (the n-cathode layer 84) are sequentially disposed on the p-type substrate 80 (substrate 80) from the bottom. Note that the aforementioned terms in parentheses are used below. The same applies to the other cases.

A light-absorbing layer 85 is disposed on the n-cathode layer 84.

Further, a p-type anode layer 86 (the p-anode layer 86), a light-emitting layer 87, and an n-type cathode layer 88 (the n-cathode layer 88) are disposed on the light-absorbing layer 85.

A light exit protection layer 89 is disposed above the light-emitting diode LED1. The light exit protection layer 89 is formed of an insulating material that transmits light (outgoing light) from the light-emitting diode LED1.

In the light-emitting chip C, a protection layer 90 is disposed to cover the upper surface and the side surfaces of these islands as illustrated in FIG. 6B. The protection layer 90 is formed of a light-transmitting insulating material. These islands are connected to lines such as the power supply line 71, the first transfer signal line 72, the second transfer signal line 73, and the turn-on signal line 75 via through-holes (illustrated as circles in FIG. 6A) formed in the protection layer 90. A description of the protection layer 90 and the through-holes will be omitted below.

As illustrated in FIG. 6B, the back-surface electrode 91 serving as the terminal Vsub is disposed on the back surface of the substrate 80.

The p-anode layer 81, the n-gate layer 82, the p-gate layer 83, the n-cathode layer 84, the light-absorbing layer 85, the p-anode layer 86, the light-emitting layer 87, and the n-cathode layer 88 are semiconductor layers and are sequentially stacked one on top of the other by epitaxial growth. To form plural mutually isolated islands (islands 301, 302, 303, . . . described later), the semiconductor layers between the islands are removed by etching (mesa etching). Note that the p-anode layer 81 may be isolated or may be not isolated. In FIG. 6B, the p-anode layer 81 is partially isolated in the thickness direction. In addition, the p-anode layer 81 may also serve as the substrate 80.

The driving thyristor S, the transfer thyristor T, the coupling diode D, the power supply line resistor Rg (the driving thyristor S1, the transfer thyristor T1, the coupling diode D1, and the power supply line resistor Rg1 in FIG. 6B) are constituted using the p-anode layer 81, the n-gate layer 82, the p-gate layer 83, and the n-cathode layer 84.

The terms "p-anode layer 81", "n-gate layer 82", "p-gate layer 83", and "n-cathode layer 84" correspond to functions (operations) in the case where these layers constitute the driving thyristor S and the transfer thyristor T. That is, the p-anode layer 81 functions as the anode, the n-gate layer 82 and the p-gate layer 83 function as the gates, and the n-cathode layer 84 functions as the cathode. These layers function (operate) differently when they constitute the coupling diode D and the power supply line resistor Rg as described later.

The light-emitting diode LED (the light-emitting diode LED1 in FIG. 6B) is constituted by the p-anode layer 86, the light-emitting layer 87, and the n-cathode layer 88.

The terms "p-anode layer 86" and "n-cathode layer 88" similarly correspond to functions (operations) in the case where these layers constitute the light-emitting diode LED. That is, the p-anode layer 86 functions as the anode, and the n-cathode layer 88 functions as the cathode.

As described below, the plural islands include those not including some of the plural layers, which are the p-anode layer 81, the n-gate layer 82, the p-gate layer 83, the n-cathode layer 84, the light-absorbing layer 85, the p-anode layer 86, the light-emitting layer 87, and the n-cathode layer 88. For example, the island 302 does not include a part or entirety of the light-absorbing layer 85, the p-anode layer 86, the light-emitting layer 87, and the n-cathode layer 88. Note that when the light-absorbing layer 85 is of n-type or includes an n-type layer that is in contact with the n-cathode layer 84, the island 302 may include the entirety or part of the n-type light-absorbing layer 85 or the n-type layer included in the light-absorbing layer 85.

The plural islands include those not including a part of a layer. For example, the island 302 includes the p-anode layer 81, the n-gate layer 82, the p-gate layer 83, and the n-cathode layer 84 but it includes the n-cathode layer 84 only partially.

A plan layout of the light-emitting chip C will be described next with reference to FIG. 6A.

In the island 301, the driving thyristor S1 and the light-emitting diode LED1 are disposed. In the island 302, the transfer thyristor T1 and the coupling diode D1 are disposed. In the island 303, the power supply line resistor Rg1 is disposed. In an island 304, the start diode SD is disposed. In an island 305, the current-limiting resistor R1 is disposed. In an island 306, the current-limiting resistor R2 is disposed.

Plural islands similar to the islands 301, 302, and 303 are formed in parallel in the light-emitting chip C. In these islands, the driving thyristors S1, S3, S4, . . . ; the light-emitting diodes LED2, LED3, LED4, . . . ; the transfer thyristors T2, T3, T4, . . . ; the coupling diodes D2, D3, D4, . . . ; etc. are provided in the same manner as in the islands 301, 302, and 303.

Now, the islands 301 to 306 are described in detail with reference to FIGS. 6A and 6B.

As illustrated in FIG. 6A, the driving thyristor S1 and the light-emitting diode LED1 are disposed in the island 301.

The driving thyristor S1 is constituted by the p-anode layer 81, the n-gate layer 82, the p-gate layer 83, and the n-cathode layer 84. The driving thyristor S1 uses, as an electrode serving as the gate Gs1 (also referred to as the gate terminal Gs1), a p-type ohmic electrode 331 (p-ohmic electrode 331) which is disposed on the p-gate layer 83 that is exposed by removing the n-cathode layer 88, the light-emitting layer 87, the p-anode layer 86, the light-absorbing layer 85, and the n-cathode layer 84.

On the other hand, the light-emitting diode LED1 is constituted by the p-anode layer 86, the light-emitting layer 87, and the n-cathode layer 88. The light-emitting diode LED1 is stacked on the n-cathode layer 84 of the driving thyristor S1 with the light-absorbing layer 85 interposed therebetween. The light-emitting diode LED1 uses, as the cathode electrode, an n-type ohmic electrode 321 (n-ohmic electrode 321) disposed on the cathode layer 88 (region 311).

The p-anode layer 86 includes a current constriction layer 86b (see FIG. 7 described later). The current constriction layer 86b is provided to constrict current that flows through the light-emitting diode LED to a central portion of the light-emitting diode LED. Since a circumferential portion of the light-emitting diode LED often has a defect resulting from mesa etching, non-radiative recombination is likely to occur. Thus, the current constriction layer 86b is provided so that the central portion of the light-emitting diode LED serves as a current passing portion (region) α in which current easily flows and the circumferential portion of the light-emitting diode LED serves as a current blocking portion (region) β in which current does not easily flow. As illustrated in the light-emitting diode LED1 in FIG. 6A, the portion inside a dash line corresponds to the current passing portion α, and the portion outside the dash line corresponds to the current blocking portion β.

To extract light from the central portion of the light-emitting diode LED1, the n-ohmic electrode 321 is provided at the circumferential portion of the light-emitting diode LED1 so that an opening is provided at the central portion.

Note that the current constriction layer 86b will be described later.

Since the current constriction layer 86b reduces electric power consumed by non-radiative recombination, power consumption decreases and light extraction efficiency improves. Note that the light extraction efficiency indicates an amount of light that is successfully extracted per certain amount of power consumption.

The transfer thyristor T1 and the coupling diode D1 are disposed in the island 302.

The transfer thyristor T1 is constituted by the p-anode layer 81, the n-gate layer 82, the p-gate layer 83, and the n-cathode layer 84. That is, the transfer thyristor T1 uses, as the cathode terminal, an n-ohmic electrode 323 disposed on the n-cathode layer 84 (region 313) that is exposed by removing the n-cathode layer 88, the light-emitting layer 87, the p-anode layer 86, and the light-absorbing layer 85. Note that in the case where the light-absorbing layer 85 is of n-type or the light-absorbing layer 85 includes an n-type layer, the light-absorbing layer 85 or the n-type layer included in the light-absorbing layer 85 may be left unremoved and the n-ohmic electrode 232 may be disposed on the light-absorbing layer 85 or the n-type layer included in the light-absorbing layer 85.

Further, the transfer thyristor T uses, as the terminal serving as the gate Gt1 (also referred to as the gate terminal Gt1), a p-ohmic electrode 332 disposed on the p-gate layer 83 exposed by removing the n-cathode layer 84.

Likewise, the coupling diode D1 disposed in the island 302 is constituted by the p-gate layer 83 and the n-cathode layer 84. That is, the coupling diode D1 uses, as the cathode terminal, an n-ohmic electrode 324 disposed on the n-cathode layer 84 (region 314) exposed by removing the n-cathode layer 88, the light-emitting layer 87, the p-anode layer 86, and the light-absorbing layer 85. Note that in the case where the light-absorbing layer 85 is of n-type or the light-absorbing layer 85 includes an n-type layer, the light-absorbing layer 85 or the n-type layer included in the light-absorbing layer 85 may be left unremoved and the n-ohmic electrode 324 may be disposed on the light-absorbing layer 85 or the n-type layer included in the light-absorbing layer 85. Further, the coupling diode D1 uses, as the anode terminal, the p-ohmic electrode 332 disposed on the p-gate layer 83 exposed by removing the n-cathode layer 84. In this example, the anode terminal of the coupling diode D1 is identical to the gate Gt1 (gate terminal Gt1).

The power supply line resistor Rg1 disposed in the island 303 is constituted by the p-gate layer 83. In this example, the p-gate layer 83 located between a p-ohmic electrode 333 and a p-ohmic electrode 344 disposed on the p-gate layer 83 exposed by removing the n-cathode layer 88, the light-emitting layer 87, the p-anode layer 86, the light-absorbing layer 85, and the n-cathode layer 84 serves as the resistor.

The start diode SD disposed in the island 304 is constituted by the p-gate layer 83 and the n-cathode layer 84. That is, the start diode SD uses, as the cathode terminal, an n-ohmic electrode 325 disposed on the n-cathode layer 84 (region 315) exposed by removing the n-cathode layer 88, the light-emitting layer 87, the p-anode layer 86, and the light-absorbing layer 85. Note that in the case where the light-absorbing layer 85 is of n-type or the light-absorbing layer 85 includes an n-type layer, the light-absorbing layer 85 or the n-type layer included in the light-absorbing layer 85 may be left unremoved and the n-ohmic electrode 325 may be disposed on the light-absorbing layer 85 or the n-type layer included in the light-absorbing layer 85. Further, the start diode SD uses, as the anode terminal, a p-ohmic electrode 335 disposed on the p-gate layer 83 exposed by removing the n-cathode layer 84.

The current-limiting resistor R1 disposed in the island 305 and the current-limiting resistor R2 disposed in the island 306 are provided in the same manner as the power supply line resistor Rg1 disposed in the island 303. The p-gate layer 83 located between two p-ohmic electros (assigned no reference signs) serve as the resistors.

Connections between the elements will be described with reference to FIG. 6A.

The turn-on signal line 75 has a trunk portion 75a and plural branch portions 75b. The trunk portion 75a extends in a direction of the line of the light-emitting diodes LED. The branch portions 75b branch off from the trunk portion 75a, and one of the branch portions 75b is connected to the n-ohmic electrode 321 which is the cathode terminal of the light-emitting diode LED1 disposed in the island 301. The same applies to the cathode terminals of the other light-emitting diodes LEDs.

The turn-on signal line 75 is connected to the terminal ϕI located near the light-emitting diode LED1.

The first transfer signal line 72 is connected to the n-ohmic electrode 323 which is the cathode terminal of the transfer thyristor T1 disposed in the island 302. The first transfer signal line 72 is also connected to the cathode terminals of the odd-numbered transfer thyristors T disposed in islands that are substantially the same as the island 302. The first transfer signal line 72 is connected to the terminal φ1 through the current-limiting resistor R1 disposed in the island 305.

On the other hand, the second transfer signal line 73 is connected to the n-ohmic electrodes (assigned no reference sign) which are the cathode terminals of the even-numbered transfer thyristors T disposed in islands assigned no reference sign. The second transfer signal line 73 is connected to the terminal φ2 through the current-limiting resistor R2 disposed in the island 306.

The power supply line 71 is connected to the p-ohmic electrode 334 which is one of the terminals of the power supply line resistor Rg1 disposed in the island 303. The power supply line 71 is also connected to one of the terminals of the other power supply line resistors Rg provided in islands that are substantially the same as the island 303. The power supply line 71 is connected to the terminal Vga.

The p-ohmic electrode 331 (the gate terminal Gs1) of the light-emitting diode LED1 disposed in the island 301 is connected to the p-ohmic electrode 332 (the gate terminal Gt1) in the island 302 by a connection line 76.

The p-ohmic electrode 332 (the gate terminal Gt1) is connected to the p-ohmic electrode 333 (the other terminal of the power supply line resistor Rg1) in the island 303 by a connection line 77.

The n-ohmic electrode 324 (the cathode terminal of the coupling diode D1) disposed in the island 302 is connected to the p-ohmic electrode (assigned no reference sign) which is the gate terminal Gt2 of the adjacent transfer thyristor T2 by a connection line 79.

Although a description is omitted here, the same applies to the other light-emitting diodes LED, the other driving thyristors S, the other transfer thyristors T, and the other coupling diodes D.

The p-ohmic electrode 332 (the gate terminal Gt1) in the island 302 is connected to the n-ohmic electrode 325 (the cathode terminal of the start diode SD) disposed in the island 304 by a connection line 78. The p-ohmic electrode 335 (the anode terminal of the start diode SD) is connected to the second transfer signal line 73.

Note that the connections and configurations described above are for the case where the p-type substrate 80 is used. In the case where an n-type substrate is used, the polarity is reversed. In addition, in the case where an i-type substrate is used, a terminal connected to the power supply line 200a that supplies the reference potential Vsub is provided on a side of the substrate on which the transfer unit 101 and the light-emitting unit 102 are disposed. The connections and configurations in this case is the same as those of the case where the p-type substrate is used or of the case where the n-type substrate is used.

Layered Structure of Driving Thyristor S and Light-Emitting Diode LED

Figure 7:
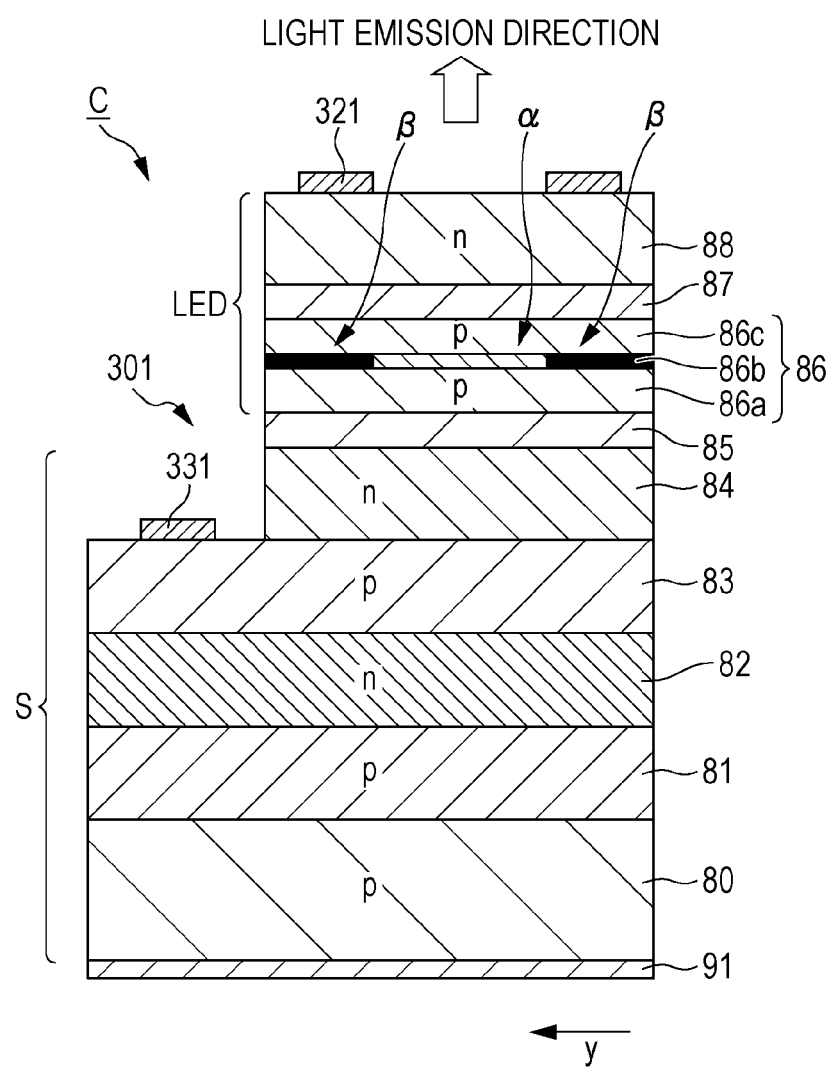
FIG. 7 is an enlarged cross-sectional view of an island in which a driving thyristor and a light-emitting diode are stacked.

FIG. 7 is an enlarged cross-sectional view of the island 301 in which the driving transistor S and the light-emitting diode LED are stacked. Note that FIG. 7 omits illustration of the light exit protection layer 89 and the protection layer 90. The same applies to the other similar drawings.

As described above, the light-emitting diode LED is stacked on the driving thyristor S with the light-absorbing layer 85 interposed therebetween. That is, the driving thyristor S and the light-emitting diode LED are connected in series. The light-emitting diode LED emits light in the z direction which is indicated by an arrow representing the light emission direction.

The light-emitting chip C whose island 301 is illustrated in FIG. 7 is constituted by a semiconductor stack obtained by sequentially disposing the p-anode layer 81, the n-gate layer 82, the p-gate layer 83, the n-cathode layer 84, the light-absorbing layer 85, the p-anode layer 86, the light-emitting layer 87, and the n-cathode layer 88 on the p-type substrate 80 by epitaxial growth. In FIG. 7, these layers are illustrated using n and p.

The driving thyristor S is constituted by the p-anode layer 81, the n-gate layer 82, the p-gate layer 83, and the n-cathode layer 84. That is, the driving thyristor S has a pnpn four-layer structure.

The light-emitting diode LED is constituted by the p-anode layer 86, the light-emitting layer 87, and the n-cathode layer 88.

The case of using p-type GaAs as the substrate 80 is described here by way of example; however, n-type GaAs or intrinsic (i-type) GaAs not doped with any impurities may be alternatively used. In addition, for example, InP, GaN, InAs, sapphire, or S1 may also be alternatively used. When the material of the substrate 80 is changed, a material having a lattice constant that substantially matches that of the substrate (including a strain structure, a strain relaxation layer, and metamorphic growth) is used as a material monolithically stacked on the substrate. For example, InAs, InAsSb, GaInAsSb, or the like is used on an InAs substrate; InP, InGaAsP, or the like is used on an InP substrate; GaN, AlGaN, or InGaN is used on a GaN substrate or a sapphire substrate; and Si, SiGe, GaP, or the like is used on a S1 substrate. Note that in the case where a semiconductor material is attached to another supporting substrate after its crystal growth, the semiconductor material need not have a lattice that substantially matches that of the supporting substrate.

The p-anode layer 81 is formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The n-gate layer 82 is formed of n-type $Al_{0.9}GaAs$ with an impurity concentration of $1\times10^{17}/cm^3$, for example. The Al composition ratio may be changed within a range of 0 to 1. Note that GaInP or the like may be alternatively used.

The p-gate layer 83 is formed of p-type $Al_{0.9}GaAs$ with an impurity concentration of $1\times10^{17}/cm^3$, for example. The Al composition ratio may be changed within a range of 0 to 1. Note that GaInP or the like may be alternatively used.

The n-cathode layer 84 is formed of n-type $Al_{0.9}GaAs$ with an impurity concentration of $1\times10^{18}/cm^3$, for example. The Al composition ratio may be changed within a range of 0 to 1. Note that GaInP or the like may be alternatively used.

The light-absorbing layer 85 will be described later.

The p-anode layer 86 is constituted by a lower p-layer 86a, the current constriction layer 86b, and an upper p-layer 86c that are sequentially stacked. The current constriction layer 86b is constituted by the current passing portion α and the current blocking portion β. As illustrated in FIG. 6A, the current passing portion α is provided at the central portion of the light-emitting diode LED, and the current blocking portion β is provided at the circumferential portion of the light-emitting diode LED.

The lower p-layer 86a and the upper p-layer 86c are formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The current constriction layer 86b is formed of AlAs or p-type AlGaAs with a high composition ratio of Al, for example. Any material may be used as long as Al is oxidized to be $Al_2O_3$ and consequently electrical resistance increases to constrict the current path.

The current blocking portion β of the current constriction layer 86*b* is formed by oxidizing the current constriction layer 86*b* having exposed side faces from the side faces. A portion that remains un-oxidized serves as the current passing portion α.

The current constriction layer 86*b* is oxidized from the side faces in the following manner. For example, Al in the current constriction layer 86*b* formed of AlAs, AlGaAs, or the like is oxidized through steam oxidation at 300 to 400° C., for example. At that time, oxidation progresses from the exposed side faces, and consequently the current blocking portion β formed of $Al_2O_3$, which is an oxide of Al, is formed at the circumferential portion of the light-emitting diode LED.

Note that the current blocking portion β of the p-anode layer 86 may be formed by implanting the hydrogen ion ($H^+$) to the p-anode layer 86 (ion implantation). That is, the current blocking portion β may be formed by implanting $H^+$ to a portion that serves as the current blocking portion β after the formation of the p-anode layer 86.

The light-emitting layer 87 has a quantum well structure in which well layers and barrier layers are alternately stacked one on top of the other. The well layers are formed of GaAs, AlGaAs, InGaAS, GaAsP, AlGaInP, GaInAsP, or GaInAsP, for example. The barrier layers are formed of AlGaAs, GaAs, GaInP, or GaInAsP, for example. Note that the light-emitting layer 87 may be an intrinsic (i-type) layer not doped with any impurities. In addition, the light-emitting layer 87 may have a structure other than the quantum well structure, for example, a quantum wire structure or a quantum dot structure.

The n-cathode layer 88 is formed of n-type $Al_{0.9}GaAs$ with an impurity concentration of $1\times10^{18}/cm^3$, for example. The Al composition ratio may be changed within a range of 0 to 1. Note that GaInP or the like may be alternatively used.

These semiconductor layers are stacked using metal organic chemical vapor deposition (MOCVD) or molecular beam epitaxy (MBE), for example. Consequently, a semiconductor stack is formed.

The n-ohmic electrode 321 is formed of Ge-containing Au (AuGe) that easily forms an ohmic contact with an n-type semiconductor layer such as the n-cathode layer 88, for example.

The p-ohmic electrode 331 is formed of Zn-containing Au (AuZn) that easily forms an ohmic contact with a p-type semiconductor layer such as the p-gate layer 83, for example.

The back-surface electrode 91 is formed of AuZn, for example, just like the p-ohmic electrode 331.

The light exit protection layer 89 is formed of a material that transmits outgoing light, above a light exit surrounded by the n-ohmic electrode 321.

The light exit protection layer 89 is formed of $SiO_2$, SiON, or SiN, for example.

Although the p-ohmic electrode 331 is provided on the p-gate layer 83 and is used as the gate terminal Gs of the driving thyristor S above, the gate terminal of the driving thyristor S may be provided on the n-gate layer 82.

Thyristor

First, a basic operation of a thyristor (the transfer thyristor T or the driving thyristor S) will be described. As described before, a thyristor is a semiconductor element having three terminals, i.e., the anode terminal (anode), the cathode terminal (cathode), and the gate terminal (gate), and is constituted by stacking p-type semiconductor layers (the p-anode layer 81 and the p-gate layer 83) and n-type semiconductor layers (the n-gate layer 82 and the n-cathode layer 84) composed for example of GaAs, GaAlAs, AlAs on the substrate 80. That is, a thyristor has a pnpn structure. A description is given here on the assumption that a forward potential (diffusion potential) of a pn junction formed by a p-type semiconductor layer and an n-type semiconductor layer is equal to 1.5 V, for example.

The following description is given on the assumption that the reference potential Vsub supplied to the back-surface electrode 91 (see FIGS. 5 to 6B) serving as the terminal Vsub is a high-level potential (hereinafter, referred to as "H") of 0 V and the power supply potential Vga supplied to the terminal Vga is a low-level potential (hereinafter, referred to as "L") of −3.3 V.

The anode of the thyristor has the reference potential Vsub ("H" (0 V)) that is supplied to the back-surface electrode 91.

When a potential lower than a threshold voltage (a negative potential having a greater absolute value) is applied to the cathode of a thyristor that is in an off-state in which no current flows between the anode and the cathode, the thyristor enters an on-state (turns on). Note that the threshold voltage of the thyristor is equal to a value obtained by subtracting the forward potential Vd (1.5 V) of the pn junction from the gate potential.

When the thyristor enters the on-state, the gate of the thyristor has a potential close to the potential of the anode terminal. Since the potential of the anode is set to the reference potential Vsub ("H" (0 V)) in this case, the potential of the gate becomes equal to 0 V ("H"). In addition, the cathode of the on-state thyristor has a potential close to a potential obtained by subtracting the forward potential Vd (1.5 V) of the pn junction from the potential of the anode. Since the potential of the anode is set to the reference potential Vsub ("H" (0V)) in this case, the cathode of the on-state thyristor has a potential close to −1.5 V (a negative potential having an absolute value greater than 1.5 V). Note that the potential of the cathode is set in accordance with a relationship with a power supply that supplies current to the on-state thyristor.

When the cathode of the on-state thyristor has a potential (a negative potential having a smaller absolute value, 0 V, or a positive potential) higher than a potential necessary to maintain the thyristor in the on-state (a potential close to −1.5 V), the thyristor enters the off-state (turns off).

On the other hand, when a potential (a negative potential having a greater absolute value) that is lower than the potential necessary to maintain the thyristor in the on-state is continuously applied to the cathode of the on-state thyristor and current that successfully maintains the on-state (maintaining current) is supplied to the thyristor, the thyristor is maintained in the on-state.

The driving thyristor S and the light-emitting diode LED are stacked and are connected in series. Thus, the voltage applied to the cathode (the n-cathode layer 84) of the driving thyristor S is equal to a voltage obtained by dividing the voltage of the turn-on signal ϕI by the driving thyristor S and the light-emitting diode LED. The description is given here on the assumption that the voltage applied to the light-emitting diode LED is equal to −1.7 V. In addition, the description is given on the assumption that −3.3 V is applied to the driving thyristor S when the driving thyristor S is in the off-state. That is, the voltage ("Lo" described later) of the turn-on signal ϕI that is applied to turn on the light-emitting diode LED is equal to −5 V.

Note that the voltage applied to the light-emitting diode LED is changed depending on the wavelength and amount of light to be emitted. In such a case, the voltage ("Lo") of the turn-on signal ϕI may be adjusted.

Since the thyristor is constituted by a semiconductor, such as GaAs, the thyristor emits light between the n-gate layer 82 and the p-gate layer 83 in the on-state. The amount of light emitted by the thyristor is determined by an area of the cathode and current that flows between the cathode and the anode. Thus, if the photoconductor drum 12 is irradiated with light emitted by the thyristor, an undesirable influence may occur in the image quality of an image to be formed.

Therefore, unnecessary light which the photoconductor drum 12 is irradiated with as a result of light emission by the transfer thyristor T may be suppressed by reducing the area of the cathode or blocking the light with an electrode (the n-ohmic electrode 323 of the transfer thyristor T1 illustrated in FIGS. 6A and 6B) in the transfer thyristor T.

On the other hand, since the driving thyristor S and the light-emitting diode LED are stacked, light emitted by the driving thyristor S passes through the light-emitting diode LED and illuminates the photoconductor drum 12. That is, light emitted by the driving thyristor S is superimposed to light emitted by the light-emitting diode LED. In this case, since the emission spectrum of the driving thyristor S and the emission spectrum of the light-emitting diode LED are different in terms of the wavelength range and width, mixing of the light emitted by the driving thyristor S to the light emitted by the light-emitting diode LED disturbs the emission spectrum of the light-emitting diode LED. For example, the emission spectrum of the light-emitting diode LED is narrower than the emission spectrum of the driving thyristor S, making it easier to design the optical system in the printhead 14 or the like. However, if the emission spectrum of the driving thyristor S mixes to the emission spectrum of the light-emitting diode LED, this benefit is no longer provided and an undesirable influence may occur in the image quality of an image to be formed.

Accordingly, in the first exemplary embodiment, the light-absorbing layer 85 that absorbs the light emitted by the driving thyristor S is disposed between the driving thyristor S and the light-emitting diode LED.

Note that the light-absorbing layer 85 need not absorb 100% of the light emitted by the driving thyristor S. That is, it is sufficient if the light-absorbing layer 85 reduces the amount of light emitted by the driving thyristor S so that the light does not cause any undesirable influence in the image quality of an image to be formed even if the photoconductor drum 12 is irradiated with the light emitted by the driving thyristor S.

Light-Absorbing Layer 85

Figure 8B:
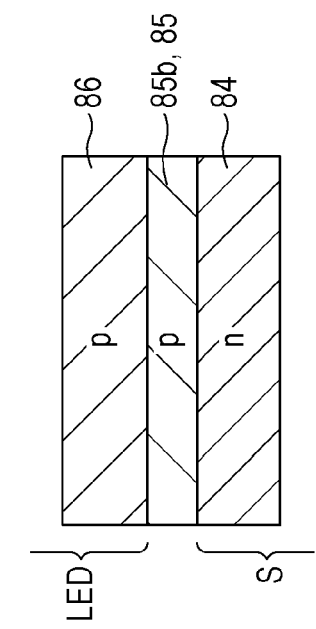
FIGS. 8A to 8E illustrate a light-absorbing layer, specifically.
Figure 8D:
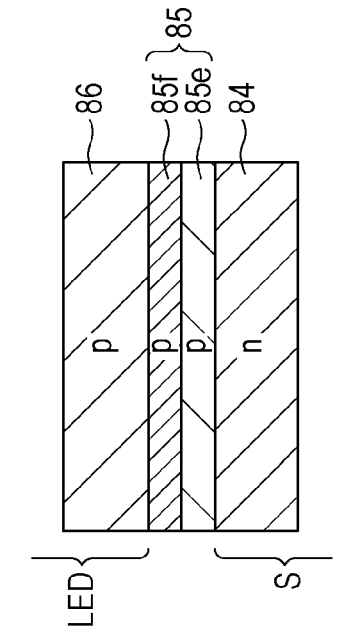
Figure 8A:
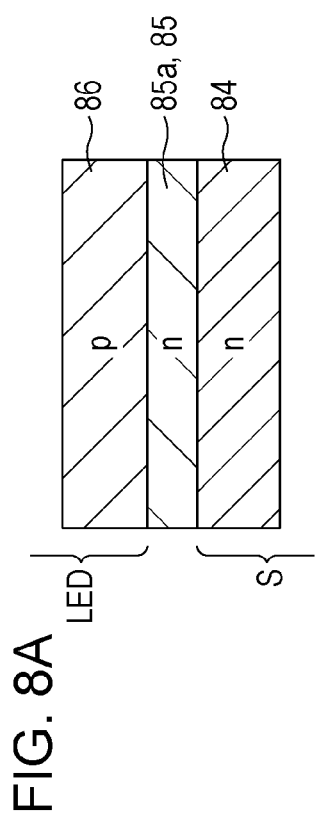
Figure 8C:
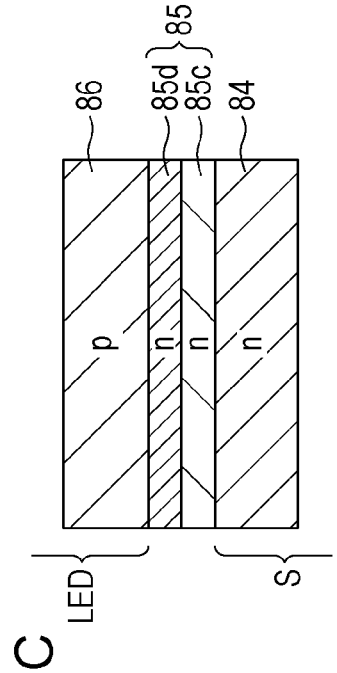
Figure 8E:
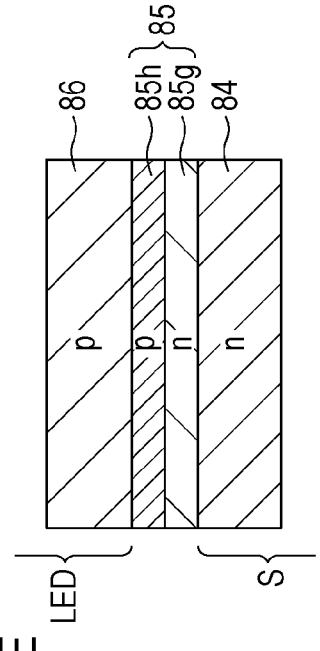

FIGS. 8A to 8E illustrate the light-absorbing layer 85. Specifically, FIG. 8A illustrates the case where the light-absorbing layer 85 is constituted by a single n-type semiconductor layer 85a. FIG. 8B illustrates the case where the light-absorbing layer 85 is constituted by a single p-type semiconductor layer 85b. FIG. 8C illustrates the case where the light-absorbing layer 85 is constituted by plural n-type semiconductor layers 85c and 85d. FIG. 8D illustrates the case where the light-absorbing layer 85 is constituted by plural p-type semiconductor layers 85e and 85f. FIG. 8E illustrates the case where the light-absorbing layer 85 is constituted by an n-type semiconductor layer 85g and a p-type semiconductor layer 85h.

At least one of the semiconductor layers (the n-type semiconductor layers 85a, 85c, 85d, and 85g and the p-type semiconductor layers 85b, 85e, 85f, and 85h) that constitute the light-absorbing layer 85 is a semiconductor layer having a bandgap that is smaller than a bandgap equivalent to the wavelength of the light emitted by the driving thyristor S.

With such a configuration, the light emitted by the driving thyristor S is absorbed by a semiconductor layer of the light-absorbing layer 85 that has a bandgap smaller than the bandgap equivalent to the light emitted by the driving thyristor S.

Note that the wavelength of the light emitted by the driving thyristor S is determined by bandgaps of the n-gate layer 82 and the p-gate layer 83 of the driving thyristor S.

Accordingly, for example, when the n-gate layer 82 and the p-gate layer 83 of the driving thyristor S are formed of AlGaAs, the light-absorbing layer 85 (at least one of the n-type semiconductor layers 85a, 85c, 85d, and 85g and the p-type semiconductor layers 85b, 85e, 85f, and 85h) may be formed of GaAs or InGaAs.

In addition, for example, when the n-gate layer 82 and the p-gate layer 83 of the driving thyristor S are formed of GaAs, the light-absorbing layer 85 (at least one of the n-type semiconductor layers 85a, 85c, 85d, and 85g and the p-type semiconductor layers 85b, 85e, 85f, and 85h) may be formed of InGaAs or InGaNAs.

Further, for example, when the n-gate layer 82 and the p-gate layer 83 of the driving thyristor S are formed of InGaAs, the light-absorbing layer 85 (at least one of the n-type semiconductor layers 85a, 85c, 85d, and 85g and the p-type semiconductor layers 85b, 85e, 85f, and 85h) may be formed of InGaAs or InGaNAs.

Note that thickness of the semiconductor layer(s) (at least one of the n-type semiconductor layers 85a, 85c, 85d, and 85g and the p-type semiconductor layers 85b, 85e, 85f, and 85h) that absorb(s) the light emitted by the driving thyristor S in the light-absorbing layer 85 is set in accordance with an amount of light to be absorbed. For example, the thickness may be from several nanometers (nm) to several hundreds of nanometers (nm).

Current flows more easily through a semiconductor layer having a small bandgap than through a semiconductor layer having a large bandgap. Thus, voltage (rising voltage) applied to the series connection of the driving thyristor S and the light-emitting diode LED to turn on the light-emitting diode LED is reduced by providing the light-absorbing layer 85 including a semiconductor layer having a small bandgap between the n-cathode layer 84 of the driving thyristor S and the p-anode layer 86 of the light-emitting diode LED that form a reverse-direction junction (reverse junction).

Note that the light-absorbing layer 85 may be formed of a III-V compound semiconductor material that has metal properties. For example, InNAs which is a compound of InN and InAs has a negative bandgap energy and has metal properties when the InN composition ratio x is in a range of approximately 0.1 to approximately 0.8.

In addition, for example, InNSb has a negative bandgap energy and has metal properties when the InN composition ratio x is in a range of approximately 0.2 to approximately 0.75.

Such a III-V compound semiconductor material having metal properties absorbs light emitted by the driving thyristor S and reduces resistance between the driving thyristor S and the light-emitting diode LED due to its metal property of conductivity. Consequently, voltage (rising voltage) applied to the series connection of the driving thyristor S and the light-emitting diode LED to turn on the light-emitting diode LED is further reduced.

In addition, the light-absorbing layer 85 (at least one of the n-type semiconductor layers 85a, 85c, 85d, and 85g and the p-type semiconductor layers 85b, 85e, 85f, and 85h) may be a layer having a higher impurity concentration than one of the n-cathode layer 84 that is in contact with the light-absorbing layer 85 on the driving thyristor S side and the p-anode layer 86 that is in contact with the light-absorbing layer 85 on the light-emitting diode LED side. Note that the expression "be in contact with" not only indicates a state of direct contact but also indicates a state that is substantially the same as the state of direct contact in terms of operation, such as a case where an i-type thin film layer that is sufficiently thinner than the light-absorbing layer 85 is interposed between the layers.

When the impurity concentration of a semiconductor layer increases, the numbers of electrons and holes (free carriers) that are able to freely move in the semiconductor layer increase and light is more likely to be absorbed (free carrier absorption).

In this case, the semiconductor layer absorbs light regardless of its bandgap. That is, the wavelength dependency is small for the light to be absorbed.

For example, free carrier absorption occurs at an impurity concentration of $1 \times 10^{18}/cm^3$ or greater. The thickness of the semiconductor layer (at least one of the n-type semiconductor layers 85a, 85c, 85d, and 85g and the p-type semiconductor layers 85b, 85e, 85f, and 85h) that absorbs light emitted by the driving thyristor S in the light-absorbing layer 85 is set in accordance with an amount of light to be absorbed. The thickness is, for example, several nanometers (nm) to several hundreds of nanometers (nm).

A semiconductor layer having a high impurity concentration has a smaller resistance and passes current more easily than a semiconductor layer having a low impurity concentration. Thus, voltage (rising voltage) applied to the series connection of the driving thyristor S and the light-emitting diode LED to turn on the light-emitting diode LED is reduced by providing the light-absorbing layer 85 including a semiconductor layer having a high impurity concentration between the n-cathode layer 84 of the driving thyristor S and the p-anode layer 86 of the light-emitting diode LED which form a reverse junction.

As illustrated in FIGS. 8A to 8E, the light-absorbing layer 85 is in contact with (adjacent to) the n-cathode layer 84 of the driving thyristor S on the driving thyristor S side and is in contact with (adjacent to) the p-anode layer 86 of the light-emitting diode LED on the light-emitting diode LED side.

When the light-absorbing layer 85 is constituted by a single layer, the light-absorbing layer 85 may be of n-type that is the same conductivity type as the conductivity type of the n-cathode layer 84 of the driving thyristor S or of p-type that is the same conductivity type as the conductivity type of the p-anode layer 86 of the light-emitting diode LED as illustrated in FIGS. 8A and 8B. In addition, when the light-absorbing layer 85 is constituted by plural layers of the same conductivity type, the light-absorbing layer 85 may be of n-type that is the same conductivity type as the conductivity type of the n-cathode layer 84 of the driving thyristor S or of p-type that is the same conductivity type as the conductivity type of the p-anode layer 86 of the light-emitting diode LED as illustrated in FIGS. 8C and 8D.

Further, when the light-absorbing layer 85 is constituted by two layers of n-type and p-type, the layer located closer to the n-cathode layer 84 of the driving thyristor S in the light-absorbing layer 85 is desirably of n-type and the layer located closer to the p-anode layer 86 of the light-emitting diode LED is desirably of p-type as illustrated in FIG. 8E.

The configuration illustrated in FIG. 8E further reduces the rising voltage than the configurations illustrated in FIGS. 8A to 8D.

That is, the light-absorbing layer 85 is desirably configured to maintain a junction so that the current flows in the same direction as in the case where the adjacent layer (the n-cathode layer 84) of the driving thyristor S and the adjacent layer (the p-anode layer 86) of the light-emitting diode LED are directly in contact with each other (directly joined). That is, the light-absorbing layer 85 is desirably configured so that the number of interfaces that are reverse junctions does not increase compared with the case where the adjacent layer (the n-cathode layer 84) of the driving thyristor S and the adjacent layer (the p-anode layer 86) of the light-emitting diode LED are in direct contact with each other.

If the number of interfaces that are reverse junctions increases between the n-cathode layer 84 of the driving thyristor S and the p-anode layer 86 of the light-emitting diode LED, the flow of current is obstructed or voltage (rising voltage) applied to the series connection of the driving thyristor S and the light-emitting diode LED to turn on the light-emitting diode LED increases.

In other words, in the case where the light-absorbing layer 85 is constituted by plural layers, it is desirable that a layer (the n-cathode layer 84) of the driving thyristor S and a layer that is in contact with the layer (the n-cathode layer 84) of the driving thyristor S among the plural layers of the light-absorbing layer 85 have the same conductivity type and that a layer (the p-anode layer 86) of the light-emitting diode LED and a layer that is in contact with the layer (the p-anode layer 86) of the light-emitting diode LED among the plural layers of the light-absorbing layer 85 have the same conductivity type. In addition, as long as these conditions are met, the number of layers that constitute the light-absorbing layer 85 is not limited to two, and the light-absorbing layer 85 may be constituted by three or four semiconductor layers having higher impurity concentrations than the impurity concentration of the n-cathode layer 84 or the p-anode layer 86. An increase in the rising voltage is suppressed by increasing the impurity concentrations even if the number of reverse junctions increases.

To increase the impurity concentration of the light-absorbing layer 85, some impurity, for example, Tellurium as an n-type dopant or Zinc as a p-type dopant, can be used. In this case, these impurities can diffuse to adjacent layers due to high temperature in a growth reactor among the epitaxial growth. If a large number of the impurities in the light-absorbing layer 85 reach the n-gate layer 82 and the p-gate layer 83 of the driving thyristor S, or the light-emitting layer 87 of the light-emitting diode LED by diffusion, the characteristics of the driving thyristor S or the light-emitting diode LED can deteriorate. To prevent this, a more-than-several-hundred-nanometer-thick spacer layer may be inserted between the light-absorbing layer 85 and the driving thyristor S or the light-absorbing layer 85 and the light-emitting diode LED.

For the same reason, a several-hundred-nanometer-thick spacer layer may be inserted between the driving thyristor S and a p-type GaAs substrate with the Zn dopant.

In another way of preventing the diffusion of the impurities to the n-gate layer 82, the p-gate layer 83, and the light-emitting layer 87, the n-cathode layer 84 or the p-anode layer 86 may have a thickness of several hundred of nanometers. For example, these layers may have a thickness of more than 300 nm.

Operation of Light-Emitting Device 65

An operation of the light-emitting device 65 will be described next.

As described before, the light-emitting device 65 includes the light-emitting chips C1 to C40 (see FIGS. 3 to 4B).

Since the light-emitting chips C1 to C40 are driven in parallel, it is sufficient to describe the operation of the light-emitting chip C1.

Timing Chart

Figure 9:
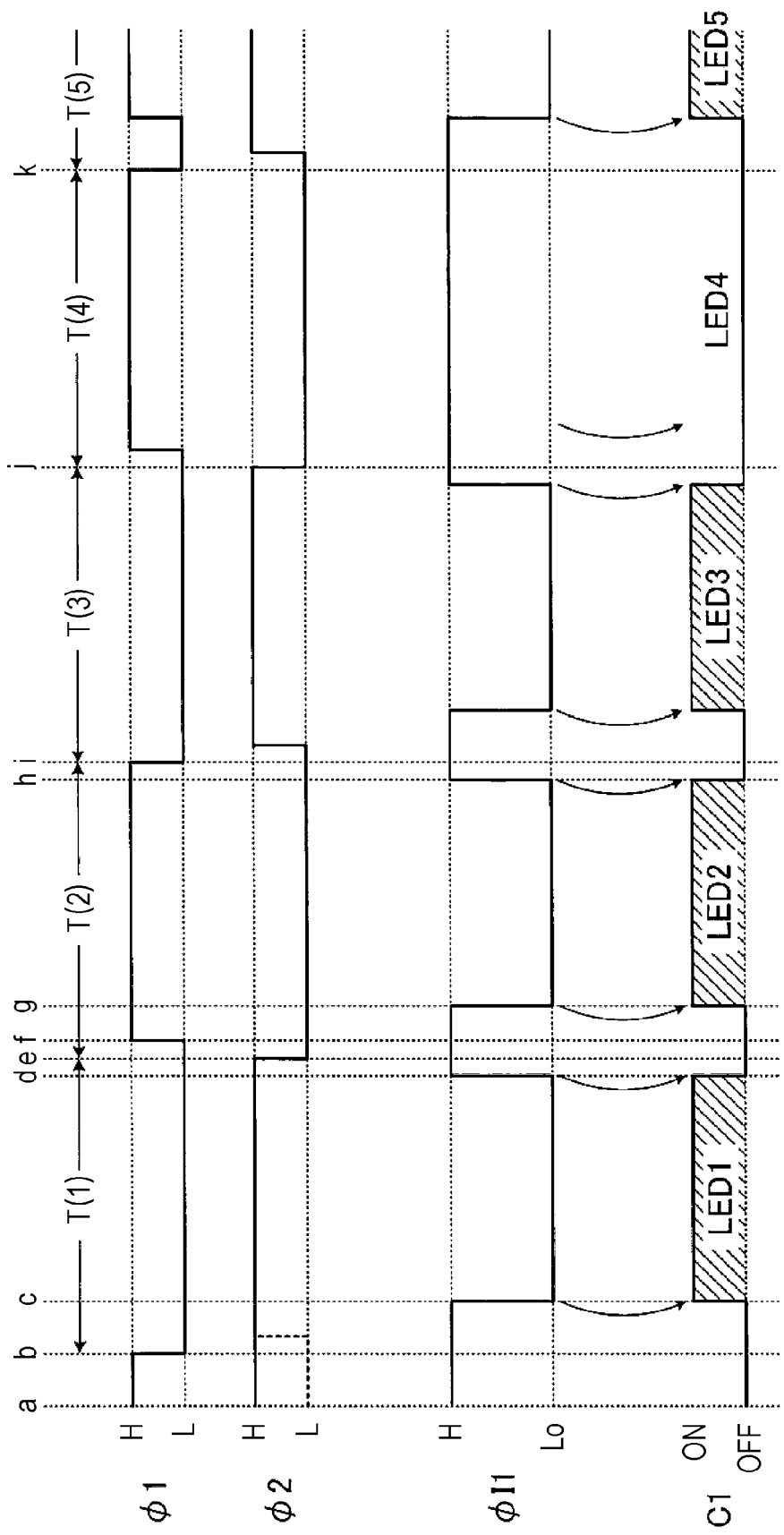
FIG. 9 is a timing chart describing an operation of the light-emitting device and an operation of the light-emitting chip.

FIG. 9 is a timing chart describing the operation of the light-emitting device 65 and the operation of the light-emitting chip C.

FIG. 9 is a timing chart of a period in which on and off of five light-emitting diodes LED (i.e., the light-emitting diodes LED1 to LED5) of the light-emitting chip C1 are controlled (hereinafter, referred to turn-on control). Note that the light-emitting diodes LED1, LED2, LED3, and LED5 of the light-emitting chip C1 are turned on and the light-emitting diode LED4 is maintained to be turned off (off) in FIG. 9.

In FIG. 9, time passes in the alphabetical order from time a to time k. On and off of the light-emitting diodes LED1, LED2, LED3, and LED4 are controlled (turn-on control is performed) in periods T(1), T(2), T(3), and T(4), respectively. Turn-on control is performed on the light-emitting diodes LED assigned the numbers of 5 and greater in the similar manner.

It is assumed here that the periods T(1), T(2), T(3), ... have equal durations and are referred to as periods T when they are not distinguished from one another.

Each of the first transfer signal φ1 that is sent to the terminal φ1 (see FIGS. 5 to 6B) and the second transfer signal φ2 that is sent to the terminal φ2 (see FIGS. 5 to 6B) is a signal having two potentials of "H" (0 V) and "L" (−3.3 V). Each of the first transfer signal φ1 and the second transfer signal φ2 has a waveform that iterates in a unit of two consecutive periods T (for example, the periods T(1) and T(2)).

Hereinafter, the expressions "H" (0 V) and "L" (−3.3 V) are sometimes simply referred to as "H" and "L", respectively.

The first transfer signal φ1 changes from "H" (0V) to "L" (−3.3 V) at start time b of the period T(1) and changes from "L" to "H" at time f. The first transfer signal φ1 then changes from "H" to "L" at end time i of the period T(2).

The second transfer signal φ2 is at "H" (0V) at the start time b of the period T(1) and changes from "H" (0V) to "L" (−3.3 V) at time e. Then, the second transfer signal φ2 changes from "L" to "H" slightly after the end time i of the period T(2).

Comparison of the first transfer signal φ1 and the second transfer signal φ2 indicates that the second transfer signal φ2 is a signal obtained by shifting the first transfer signal φ1 behind by the period T on the time axis. The waveform of the second transfer signal φ2 that is indicated by a dotted line in the period T(1) and the waveform in the period T(2) iterate in the period T(3) and subsequent periods. The waveform of the second transfer signal φ2 in the period T(1) is different from that in the period T(3) and thereafter because the period T(1) is a period in which the light-emitting device 65 starts the operation.

A set of transfer signals (i.e., the first transfer signal φ1 and the second transfer signal φ2) specifies the light-emitting diode LED assigned the same number as the number of the on-state transfer thyristor T to be a target of on/off control (turn-on control) by propagating the on-state of the transfer thyristors T in the numbered order as described later.

The turn-on signal φI1 that is sent to the terminal φI of the light-emitting chip C1 will be described next. Note that turn-on signals φI2 to φI40 are sent to the other light-emitting chips C2 to C40, respectively. The turn-on signal φI1 is a signal having two potentials of "H" (0V) and "Lo" (−5 V).

The turn-on signal φI1 in the period T(1) in which turn-on control is performed on the light-emitting diode LED1 of the light-emitting chip C1 will be described. The turn-on signal φI1 is at "H" (0V) at the start time b of the period T(1) and changes from "H" (0V) to "Lo" (−5V) at time c. Then, the turn-on signal φI1 changes from "Lo" to "H" at time d and maintains "H" at time e.

The operation of the light-emitting device 65 and the operation of the light-emitting chip C1 will be described in accordance with the timing chart illustrated in FIG. 9 with reference to FIGS. 4A to 5. Note that the periods T(1) and T(2) in which turn-on control is performed on the light-emitting diodes LED1 and LED2 will be described below.

(1) Time a

Light-Emitting Device 65

At time a, the reference potential supplying unit 160 of the signal generation circuit 110 of the light-emitting device 65 sets the reference potential Vsub to "H" (0 V). The power supply potential supplying unit 170 sets the power supply potential Vga to "L" (−3.3 V). Then, the power supply line 200a on the circuit board 62 of the light-emitting device 65 has the reference potential Vsub ("H" (0 V)), and each of the terminals Vsub of the light-emitting chips C1 to C40 has "H". Likewise, the power supply line 200b has the power supply potential Vga ("L" (−3.3 V)), and each of the terminals Vga of the light-emitting chips C1 to C40 has "L" (see FIG. 4B). As a result, each of the power supply lines 71 of the light-emitting chips C1 to C40 has "L" (see FIG. 5).

Then, the transfer signal generation unit 120 of the signal generation circuit 110 sets the first transfer signal φ1 and the second transfer signal φ2 to "H" (0 V). Then, the first transfer signal line 201 and the second transfer signal line 202 have "H" (see FIG. 4B). Consequently, the terminals φ1 and φ2 of each of the light-emitting chips C1 to C40 have "H". The first transfer signal line 72 that is connected to the terminal φ1 through the current-limiting resistor R1 has "H", and the second transfer signal line 73 that is connected to the terminal φ1 through the current-limiting resistor R2 also has "H" (see FIG. 5).

Further, the turn-on signal generation unit 140 of the signal generation circuit 110 sets the turn-on signals φI1 to φI40 to "H" (0 V). Then, the turn-on signal lines 204-1 to 204-40 have "H" (see FIG. 4B). Consequently, the terminal φI of each of the light-emitting chips C1 to C40 has "H" through the current-limiting resistor RI, and the turn-on signal line 75 connected to the terminal φI also has "H" (0 V) (see FIG. 5).

Light-Emitting Chip C1

Since the anode terminals of the transfer thyristors T and the driving thyristors S are connected to the terminal Vsub, the potentials of the anode terminals are set to "H".

Since the cathodes of the odd-numbered transfer thyristors T1, T3, T5, ... are connected to the first transfer signal line 72, the potentials thereof are set to "H" (0 V). Since the cathodes of the even-numbered transfer thyristors T2, T4, T6, ... are connected to the second transfer signal line 73, the potentials thereof are set to "H". Since both the anode and the cathode of each of the transfer thyristors T have "H", the transfer thyristor T is in the off-state.

The cathode terminals of the light-emitting diodes LED are connected to the turn-on signal line 75 having "H" (0 V).

That is, each light-emitting diode LED and the corresponding driving thyristor S are connected in series to each other with the light-absorbing layer 85 interposed therebetween. Since the cathode of the light-emitting diode LED has "H" and the anode of the driving thyristor S has "H", the light-emitting diode LED and the driving thyristor S are in the off-state.

The gate Gt1 is connected to the cathode of the start diode SD as described before. The gate Gt1 is connected to the power supply line 71 having the power supply potential Vga ("L" (−3.3 V)) through the power supply line resistor Rg1. The anode terminal of the start diode SD is connected to the second transfer signal line 73 and is connected to the terminal φ2 having "H" (0 V) through the current-limiting resistor R2. Thus, the start diode SD is forward biased, and the cathode (gate Gt1) of the start diode SD has a potential (−1.5 V) obtained by subtracting the forward potential Vd (1.5 V) of the pn junction from the potential ("H" (0 V)) of the anode of the start diode SD. If the potential of the gate Gt1 changes to −1.5 V, the coupling diode D1 is forward biased since the anode (gate Gt1) thereof has −1.5 V and the cathode thereof is connected to the power supply line 71 ("L" (−3.3 V)) through the power supply line resistor Rg2. Thus, the potential of the gate Gt2 becomes equal to −3 V obtained by subtracting the forward potential Vd (1.5 V) of the pn junction from the potential (−1.5 V) of the gate Gt1. However, there is no influence of the anode of the start diode SD having "H" (0 V) on the gates Gt assigned the numbers of 3 and greater, and these gates Gt have "L" (−3.3 V) which is the potential of the power supply line 71.

Since the gates Gt serve as the gates Gs, the gates Gs have a potential equal to the potential of the gates Gt. Thus, the threshold voltages of the transfer thyristors T and the driving thyristors S are equal to a value obtained by subtracting the forward potential Vd (1.5 V) of the pn junction from the potential of the gates Gt and Gs. That is, the threshold voltages of the transfer thyristor T1 and the driving thyristor S1 are equal to −3 V, the threshold voltages of the transfer thyristor T2 and the driving thyristor S2 are equal to −4.5 V, and the threshold voltages of the transfer thyristors T and the driving thyristors S assigned the numbers of 3 and greater are equal to −4.8 V.

(2) Time b

At the time b illustrated in FIG. 9, the first transfer signal φ1 changes from "H" (0 V) to "L" (−3.3 V). In response to this, the light-emitting device 65 starts the operation.

Upon the first transfer signal φ1 changing from "H" to "L", the potential of the first transfer signal line 72 changes from "H" (0 V) to "L" (−3.3 V) through the terminal φ1 and the current-limiting resistor R1. Then, the transfer thyristor T1 whose threshold voltage is equal to −3 V turns on. However, since the transfer thyristors T that have the cathode terminal connected to the first transfer signal line 72 and that are assigned odd numbers of 3 and greater have the threshold voltage of −4.8 V, they do not turn on. In addition, the odd-numbered transfer thyristors T do not turn because the second transfer signal φ2 is at "H" (0 V) and the second transfer signal line 73 has "H" (0 V).

In response to turn-on of the transfer thyristor T1, the potential of the first transfer signal line 72 becomes equal to −1.5 V obtained by subtracting the forward potential Vd (1.5V) of the pn junction from the potential ("H" (0 V)) of the anode.

In response to turn-on of the transfer thyristor T, the potential of the gate Gt1/Gs1 becomes equal to "H" (0 V) that is the potential of the anode of the transfer thyristor T1. In addition, the potential of the gate Gt2 (gate Gs2) becomes equal to −1.5 V, the potential of the gate Gt3 (gate Gs3) becomes equal to −3 V, and the potential of the gate Gt (gate Gs) assigned the number of 4 or greater becomes equal to "L".

Consequently, the threshold voltage of the driving thyristor S1 becomes equal to −1.5 V, the threshold voltages of the transfer thyristor T2 and the driving thyristor S2 become equal to −3 V, the threshold voltages of the transfer thyristor T3 and the driving thyristor S3 become equal to −4.5 V, and the threshold voltages of the transfer thyristor T and the driving thyristor S assigned the number of 4 or greater become equal to −4.8 V.

However, since the first transfer signal line 72 has −1.5 V due to the on-state transfer thyristor T1, the odd-numbered transfer thyristors T that are in the off-state do not turn on. Since the second transfer signal line 73 has "H" (0 V), the even-numbered transfer thyristors T do not turn on. In addition, the turn-on signal line 75 has "H" (0 V), none of the light-emitting diodes LED turn on.

Immediately after the time b (indicating time at which a steady state is achieved after a change in the thyristor and the like has occurred in response to a change in the potential of the signal at the time b), the transfer thyristor T1 is in the on-state and the other transfer thyristors T, the driving thyristors S, and the light-emitting diodes LED are in the off-state.

(3) Time c

At the time c, the turn-on signal φI1 changes from "H" (0 V) to "Lo" (−5V).

Upon the turn-on signal φI1 changing from "H" to "Lo", the potential of the turn-on signal line 75 changes from "H" (0 V) to "Lo" (−5 V) through the current-limiting resistor RI and the terminal φI. Then, −3.3 V obtained by adding the voltage of 1.7 V applied to the light-emitting diode LED to −5 V (Lo) is applied to the driving thyristor S1, and the driving thyristor S1 having a threshold voltage of −1.5 V turns on and the light-emitting diode LED1 turns on (emits light). Consequently, the potential of the turn-on signal line 75 becomes equal to a potential close to −3.2 V (a negative potential having an absolute value greater than 3.2 V). Although the threshold voltage of the driving thyristor S2 is equal to −3 V, the voltage applied to the driving thyristor S2 is equal to −1.5 V obtained by adding −3.2 V to the voltage of 1.7 V applied to the light-emitting diode LED and thus the driving thyristor S2 does not turn on.

Immediately after the time c, the transfer thyristor T1 and the driving thyristor S1 are in the on-state, and the light-emitting diode LED1 is on (is emitting light).

Note that the driving thyristor S1 is ready to enter the on-state at the time b as a result of turn-on of the transfer thyristor T1.

(4) Time d

At the time d, the turn-on signal φI1 changes from "Lo" (−5 V) to "H" (0 V).

Upon the turn-on signal φI1 changing from "Lo" to "H", the potential of the turn-on signal line 75 changes from −3.2 V to "H" through the current-limiting resistor RI and the terminal φI. Then, since both the cathode of the light-emitting diode LED1 and the anode of the driving thyristor S1 have "H", the driving thyristor S1 turns off and the light-emitting diode LED1 turns off (off). A period for which the light-emitting diode LED1 is on is a period for which the turn-on signal φI1 is at "Lo" (−5 V) from the time c at which the turn-on signal φI1 changes from "H" to "Lo" to the time d at which the turn-on signal φI1 changes from "Lo" to "H".

Immediately after the time d, the transfer thyristor T1 is in the on-state.

(5) Time e

At the time e, the second transfer signal φ2 changes from "H" (0V) to "L" (−3.3 V). At the time e, the period T(1) in which turn-on control is performed on the light-emitting diode LED1 ends, and the period T(2) in which turn-on control is performed on the light-emitting diode LED2 starts.

Upon the second transfer signal φ2 changes from "H" to "L", the potential of the second transfer signal line 73 changes to −3.3 V through the terminal φ2. As described before, since the threshold voltage of the transfer thyristor T2 is equal to −3 V, the transfer thyristor T2 turns on. Consequently, the potential of the gate terminal Gt2 (gate terminal Gs2) becomes equal to "H" (0 V), the potential of the gate Gt3 (gate Gs3) becomes equal to −1.5 V, and the potential of the gate Gt4 (gate Gs4) becomes equal to −3 V. In addition, the potential of the gate Gt (gate Gs) assigned the number of 5 or greater becomes equal to −3.3 V.

Immediately after the time e, the transfer thyristors T1 and T2 are in the on-state.

(6) Time f

At the time f, the first transfer signal φ1 changes from "L" (−3.3 V) to "H" (0 V).

Upon the first transfer signal φ1 changing from "L" to "H", the potential of the first transfer signal line 72 changes from "L" to "H" through the terminal φ1. Then, both the anode and the cathode of the on-state transfer thyristor T1 have "H", and the transfer thyristor T1 turns off. Then, the potential of the gate Gt1 (gate Gs1) changes toward the power supply voltage Vga ("L" (−3.3 V)) of the power supply line 71 through the power supply line resistor Rg1. Consequently, the coupling diode D1 enters a state in which a potential is applied in a direction in which current does not flow (is reversely biased). Thus, there is no longer an influence of the gate Gt2 (gate Gs2) having "H" (0 V) on the gate Gt1 (gate Gs1). That is, the transfer thyristor T having the gate Gt connected through the reverse-biased coupling diode D has the threshold of −4.8 V and no longer turns on with the first transfer signal φ1 or the second transfer signal φ2 having "L" (−3.3 V).

Immediately after the time f, the transfer thyristor T2 is in the on-state.

(7) Other times

Upon the turn-on signal φI1 changing from "H" (0 V) to "Lo" (−5 V) at time g, the driving thyristor S2 turns on and the light-emitting diode LED2 turns on (emits light) just like the driving thyristor S1 and the light-emitting diode LED1 at the time c.

Then, upon the turn-on signal φI1 changing from "Lo" (−5 V) to "H" (0 V) at time h, the driving thyristor S2 turns off and the light-emitting diode LED2 turns off just like the driving thyristor S1 and the light-emitting diode LED1 at the time d.

Further, upon the first transfer signal φ1 changing from "H" (0 V) to "L" (−3.3 V) at time i, the transfer thyristor T3 having a threshold voltage of −3 V turns on just like the transfer thyristor T1 at the time b or the transfer thyristor T2 at the time e. At the time i, the period T(2) in which turn-on control is performed on the light-emitting diode LED2 ends and the period T(3) in which turn-on control is performed on the light-emitting diode LED3 starts.

The above-described operation is repeated thereafter.

Note that if the light-emitting diode LED is maintained off (turned off) instead of turning on, the turn-on signal φI is maintained at "H" (0 V) just like the turn-on signal φI1 from time j to time k in the period T(4) in which turn-on control is performed on the light-emitting diode LED4 in FIG. 9.

With this configuration, even if the threshold of the driving thyristor S4 is equal to −1.5 V, the driving thyristor S4 does not turn on and the light-emitting diode LED4 is maintained off (turned off).

As described above, the gate terminals Gt of the transfer thyristors T are connected to each other by the corresponding coupling diodes D. Thus, when the potential of the gate Gt changes, the potential of the gate Gt that is connected to the potential-changed gate Gt through the forward-biased coupling diode D also changes. Then, the threshold voltage of the transfer thyristor T having the potential changed gate also changes. The transfer thyristor T turns on at a timing at which the first transfer signal φ1 or the second transfer signal φ2 changes from "H" (0 V) to "L" (−3.3 V) if the threshold voltage thereof is higher than "L" (−3.3 V) (a negative value having a smaller absolute value).

Then, since the driving thyristor S whose gate Gs is connected to the gate Gt of the on-state transfer thyristor T has a threshold of −1.5 V, the driving thyristor S turns on when the turn-on signal φI changes from "H" (0 V) to "Lo" (−5 V), and the light-emitting diode LED that is connected in series with the driving thyristor S turns on (emits light).

That is, the transfer thyristor T enters the on-state to specify the light-emitting diode LED that is the target of turn-on control, and the turn-on signal φI at "Lo" (−5 V) turns on the driving thyristor S connected in series with the light-emitting diode LED that is the target of turn-on control and also turns on the light-emitting diode LED.

Note that the turn-on signal φI at "H" (0 V) maintains the driving thyristor S in the off-state and maintains the light-emitting diode LED off. That is, the turn-on signal φI sets on/off of the light-emitting diodes LED.

On/off of the light-emitting diodes LED is controlled by setting the turn-on signal φI in accordance with image data in this way.

As described above, the driving thyristors S and the respective light-emitting diodes LED are stacked in each of the light-emitting chips C according to the first exemplary embodiment. Such a configuration makes the light-emitting chips C be of self-scanning type that sequentially turns on the light-emitting diodes LED by using the transfer thyristors T and the driving thyristors S. As a result, the number of terminals provided in the light-emitting chips C is reduced, and the light-emitting chips C and the light-emitting device 65 become more compact.

The driving thyristors S are sometimes used as light-emitting elements without disposing the light-emitting diodes LED above the respective driving thyristors S. That is, light emitted at a junction of the n-gate layer 82 and the p-gate layer 83 of the on-state driving thyristors S is sometimes used. In this case, transfer characteristics and light emission characteristics are not separately (independently) settable. Thus, it is difficult to increase the driving speed, increase the output power of light, increase the efficiency, reduce the power consumption, and reduce the cost.

For example, suppose that 780-nm light is extracted by using a thyristor (the driving thyristor S) as a light-emitting element. In this case, when a quantum well structure is formed using AlGaAs, the Al composition ratio is set to 30%. In this case, if etching is performed to expose the p-gate layer 83, Al is oxidized, making it impossible to form the gate terminal (such as the p-ohmic electrode 331 in FIG. 7).

In contrast, in the first exemplary embodiment, the light-emitting diodes LED perform light emission and the transfer thyristors T and the driving thyristors S perform transfer. That is, light emission and transfer are separated from each other. In other words, the driving thyristors S need not emit light. Thus, light emission characteristics are successfully improved by configuring the light-emitting diodes LED to have the quantum well structure, and transfer characteristics of the transfer thyristors T and the driving thyristors S are also successfully improved. That is, the light-emitting diodes LED of the light-emitting unit 102 and the transfer thyristors T and the driving thyristors S of the transfer unit 101 are separately (independently) settable. This makes it easier to achieve a higher driving speed, a higher output power of light, a higher efficiency, a lower power consumption, and a lower cost.

In addition, in the first exemplary embodiment, the light-emitting diode LED and the driving thyristor S are stacked with the light-absorbing layer 85 interposed therebetween. The n-cathode layer 84 of the driving thyristor S and the p-anode layer 86 of the light-emitting diode LED are reverse-biased if they are directly stacked. However, since the light-absorbing layer 85 easily passes current therethrough as described before, current flows more easily by stacking the driving thyristor S and the light-emitting diode LED with the light-absorbing layer 85 interposed therebetween.

If the light-absorbing layer 85 is not provided, a voltage greater than or equal to a breakdown voltage of the reverse-biased junction is applied in order to allow current to flow through the series connection of the driving thyristor S and the light-emitting diode LED. That is, the driving voltage increases.

However, the driving voltage is reduced by stacking the light-emitting diode LED and the driving thyristor S with the light-absorbing layer 85 interposed therebetween, compared with the case where the light-emitting diode LED and the driving thyristor S are stacked without the light-absorbing layer 85 interposed therebetween.

In addition, the light-absorbing layer 85 absorbs light emitted from the driving thyristor S or reduces the amount of light so that the light does not affect image formation even if the driving thyristor S emits light. Thus, it does not matter if the driving thyristor S emits light.

Note that the current constriction layer 86*b* provided in the p-anode layer 86 of the light-emitting diode LED may be provided in the n-cathode layer 88 of the light-emitting diode LED.

Modifications of the light-emitting chips C according to the first exemplary embodiment will be described below. In the modifications described below, a portion in which the driving thyristor S and the light-emitting diode LED are stacked in the island 301 of the light-emitting chips C differs. Since the rest of the configuration is substantially the same as that of the light-emitting chips C described above, the different part will be described and a description of the substantially the same part is omitted.

Figure 10:
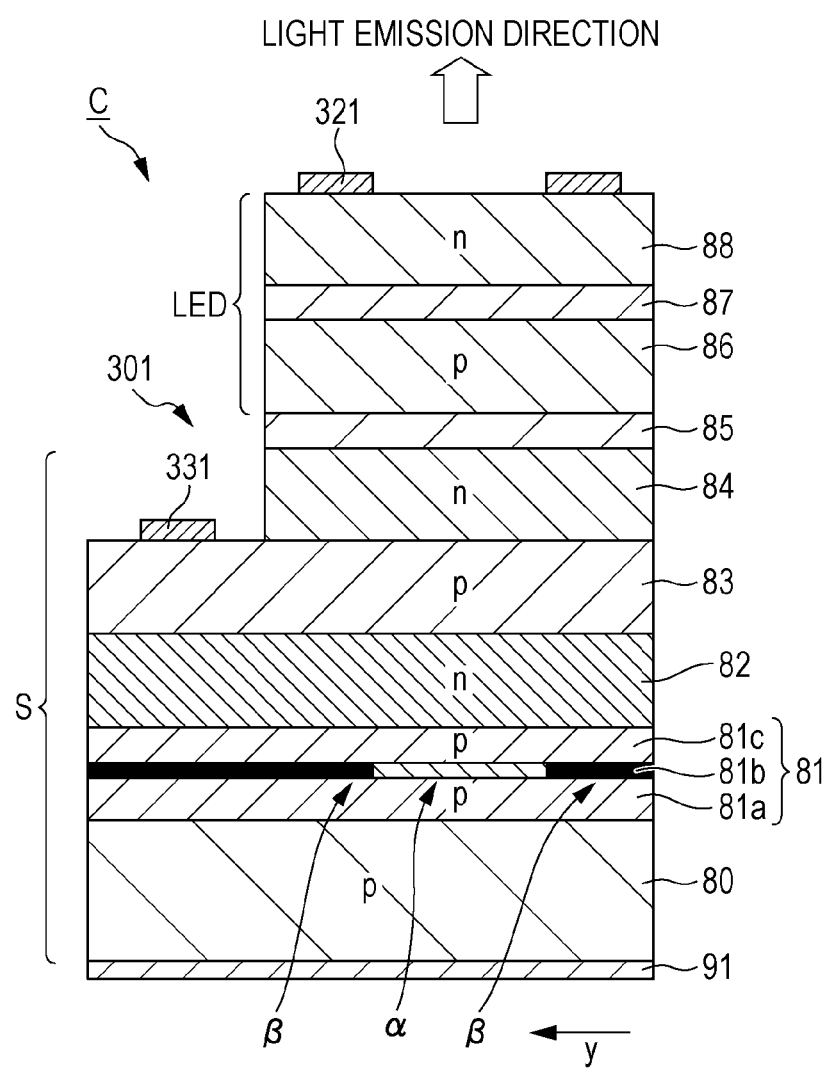
FIG. 10 illustrates a first modification of the first exemplary embodiment and is an enlarged cross-sectional view of an island in which a driving thyristor and a light-emitting diode are stacked.

First Modification of Light-Emitting Chip C According to First Exemplary Embodiment FIG. 10 illustrates a first modification of the first exemplary embodiment and is an enlarged cross-sectional view of the island 301 in which the driving thyristor S and the light-emitting diode LED are stacked.

In the first modification of the first exemplary embodiment, a current constriction layer (a current constriction layer 81*b* in the first modification of the first exemplary embodiment) is provided in the p-anode layer 81 instead of the p-anode layer 86. That is, the p-anode layer 81 is constituted by a lower p-layer 81*a*, the current constriction layer 81*b*, and an upper p-layer 81*c*. The rest of the configuration is substantially the same as that of the light-emitting chip C according to the first exemplary embodiment.

Since the flow of current is constricted to the current passing portion α located at the central portion of the light-emitting diode LED also in the light-emitting chip C according to the first modification of the first exemplary embodiment, electric power consumed by non-radiative recombination is reduced. Consequently, power consumption is reduced and light extraction efficiency improves.

Note that the current constriction layer 81*b* provided in the p-anode layer 81 of the driving thyristor S may be provided in the n-cathode layer 84 of the driving thyristor S.

Figure 11:
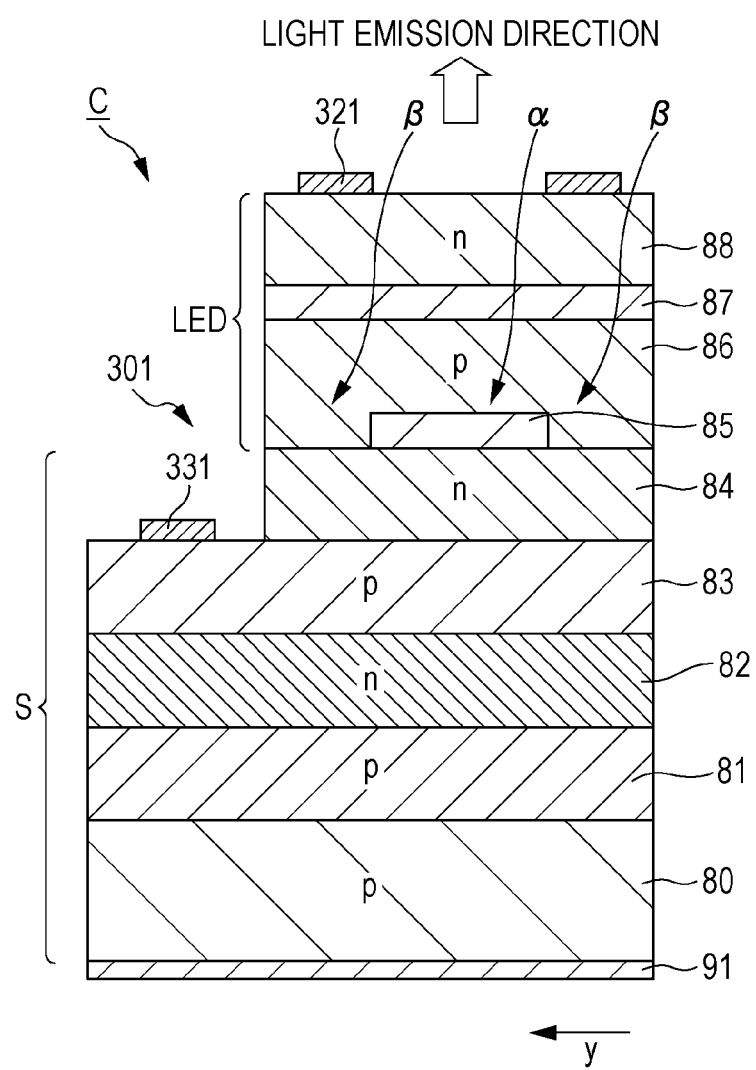
FIG. 11 illustrates a second modification of the first exemplary embodiment and is an enlarged cross-sectional view of an island in which a driving thyristor and a light-emitting diode are stacked.

Second Modification of Light-Emitting Chip C According to First Exemplary Embodiment FIG. 11 illustrates a second modification of the first exemplary embodiment and is an enlarged cross-sectional view of the island 301 in which the driving thyristor S and the light-emitting diode LED are stacked.

In the second modification of the first exemplary embodiment, the light-absorbing layer 85 is disposed at a portion corresponding to the current passing portion α in place of the current constriction layer 86*b*. The rest of the configuration is substantially the same as that of the light-emitting chip C according to the first exemplary embodiment.

As described above, current easily flows through the light-absorbing layer 85 in a reverse-biased state. However, current does not easily flow through a junction of the n-cathode layer 84 and the p-anode layer 86 without the light-absorbing layer 85 interposed therebetween in the reverse-biased state in which breakdown hardly occurs.

Thus, if the light-absorbing layer 85 is provided at the portion corresponding to the current passing portion α, the current flowing through the light-emitting diode LED is constricted to the central portion.

Note that the p-anode layer 86 is disposed to cover the periphery of the light-absorbing layer 85 in FIG. 11. However, the periphery of the light-absorbing layer 85 may be covered with the n-cathode layer 84 in place of the p-anode layer 86.

With such a configuration, light emitted by the light-emitting diode LED is constricted to a portion opposing the light-absorbing layer 85 that serves as the current passing portion α. Thus, light emitted from the light-emitting diode LED is less likely to reach the driving thyristor S, and the amount of light that the driving thyristor S is irradiated with from the light-emitting diode LED is reduced. As a result, excitation and light emission of the driving thyristor S due to light from the light-emitting diode LED is suppressed and the amount of light emitted by the driving thyristor S is reduced. This consequently suppresses mixing of the emission spectrum of the driving thyristor S to the emission spectrum of the light-emitting diode LED.

The light-emitting chip C according to the second modification of the first exemplary embodiment may be used when a semiconductor material to which application of steam oxidation is difficult is used.

Second Exemplary Embodiment

In a light-emitting chip C according to a second exemplary embodiment, the light-emitting layer 87 of a light-emitting diode LED is sandwiched by two distributed Bragg reflector layers (hereinafter, referred to as DBR layers). A DBR layer is constituted by stacking plural semiconductor layers with varying refractive index. A DBR layer reflects light from the light-emitting diode LED.

The configuration of the light-emitting chip C other than the configuration of the island 301 in which the driving thyristor S and the light-emitting diode LED are stacked is substantially the same as that of the first exemplary embodiment. Thus, different part will be described and a description of the substantially the same part is omitted.

Figure 12:
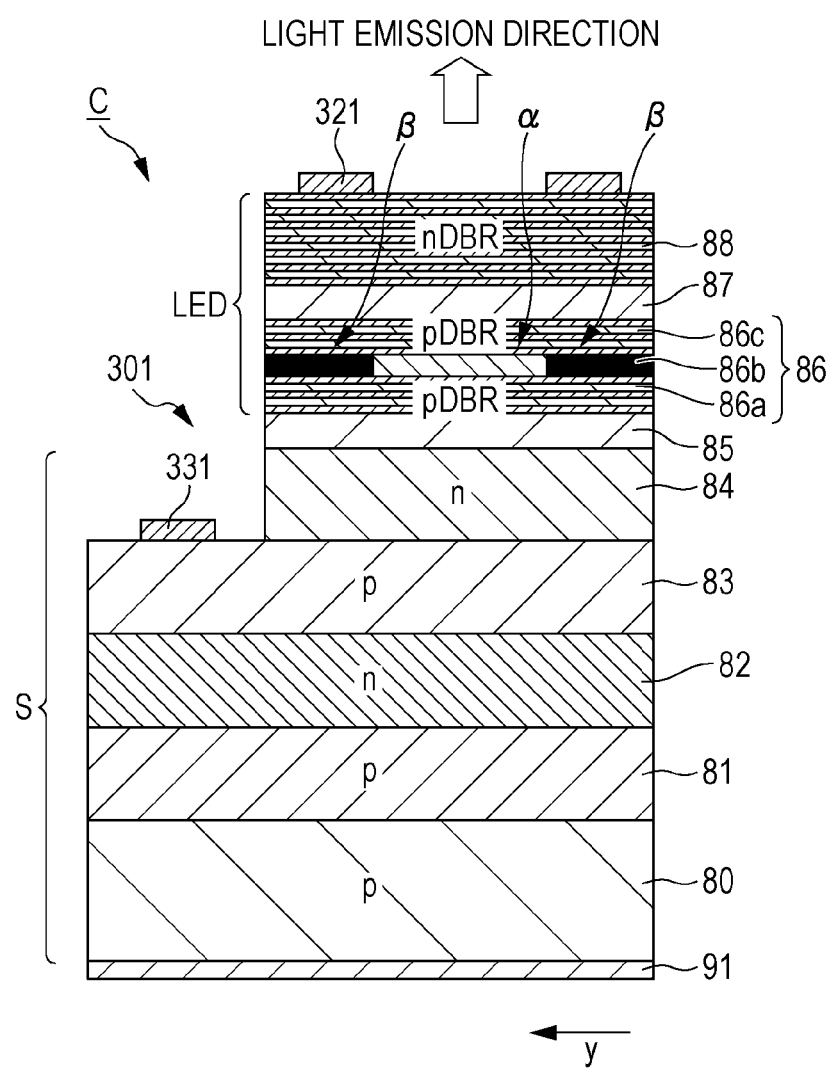
FIG. 12 is an enlarged cross-sectional view of an island in which a driving thyristor and a light-emitting diode are stacked in a light-emitting chip according to a second exemplary embodiment.

FIG. 12 is an enlarged cross-sectional view of the island 301 in which the driving thyristor S and the light-emitting diode LED are stacked in the light-emitting chip C according to the second exemplary embodiment.

The light-emitting chip C according to the second exemplary embodiment includes the p-anode layer 86 and the n-cathode layer 88 that are formed as DBR layers. The p-anode layer 86 includes the current constriction layer 86b. That is, the lower p-layer 86a, the current constriction layer 86b, and the upper p-layer 86c are stacked in this order in the p-anode layer 86, and the lower p-layer 86a and the upper p-layer 86c are formed as DBR layers.

Note that the lower p-layer 86a, the upper p-layer 86c, and the n-cathode layer 88 are sometimes referred to as a lower p-DBR layer 86a, an upper p-DBR layer 86c, and an n-cathode (n-DBR) layer 88. In the drawings, the terms "pDBR" and "nDBR" are used.

A DBR layer is constituted by a combination of low refractive index layers with a high Al composition ratio of, for example, $Al_{0.9}Ga_{0.1}As$ and high refractive index layers with a low Al composition ratio of, for example, $Al_{0.2}Ga_{0.8}As$. Thicknesses (optical path length) of the low refractive index layers and the high refractive index layers are set to 0.25 (¼) of the center wavelength, for example. Note that the Al composition ratios of the low refractive index layers and the high refractive index layers may be changed within a range of 0 to 1.

Note that the thickness (optical path length) of the current constriction layer 86b is determined by the adopted structure. In the case where importance is placed on extraction efficiency and process reproducibility, the thickness (optical path length) of the current constriction layer 86b is desirably set to an integer multiple of the thickness (optical path length) of the low refractive index layers and the high refractive index layers constituting the DBR layer. The thickness is set to 0.75 (¾) of the center wavelength, for example. In the case of an odd multiple, the current constriction layer 86b is desirably sandwiched by a high refractive index layer and a high refractive index layer. In the case of an even multiple, the current constriction layer 86b is desirably sandwiched by a high refractive index layer and a low refractive index layer. That is, the current constriction layer 86b is desirably provided to suppress a disturbance in the period of the refractive index due to the DBR layer. Conversely, in the case where a reduction of the influences of an oxidized portion (in the refractive index and distortion) is desired, the thickness of the current constriction layer 86b is desirably set to several tens of nanometers (nm) and is desirably inserted at a portion corresponding to a node of a standing wave caused in the DBR layer.

The lower p-layer 86a and the upper p-layer 86c of the p-anode layer 86 and the n-cathode layer 88 are formed as DBR layers in FIG. 12; however, a part of a semiconductor layer, such as one of the lower p-layer 86a and the upper p-layer 86c of the p-anode layer 86 or a portion of the n-cathode layer 88 in the thickness direction, may be formed as a DBR layer. The same applies to the other cases.

The p-anode (p-DBR) layer 86 and the n-cathode (n-DBR) layer 88 constitute a resonator (cavity), and the intensity of light from the light-emitting layer 87 is increased by resonance before the light is output. That is, in the light-emitting chip C according to the second exemplary embodiment, a resonance-type light-emitting diode LED is stacked on the driving thyristor S.

Since the current constriction layer 86b is provided, electric power consumed by non-radiative recombination is reduced. Consequently, power consumption reduces and light extraction efficiency improves.

Note that since light from the driving thyristor S is absorbed or reduced by the light-absorbing layer 85 and is refracted by the p-anode (p-DBR) layer 86 in the light-emitting chip C according to the second exemplary embodiment, mixing of light emitted by the driving thyristor S into the emission spectrum of the light-emitting diode LED is suppressed.

The light-emitting chip C according to the second exemplary embodiment operates in accordance with the timing chart of FIG. 9 just like the light-emitting chip C according to the first exemplary embodiment.

Note that the current constriction layer 86b provided in the p-anode (p-DBR) layer 86 of the light-emitting diode LED may be provided in the n-cathode (n-DBR) layer 88 of the light-emitting diode LED or in the p-anode layer 81 or the n-cathode layer 84 of the driving thyristor S.

Modifications of the light-emitting chip C according to the second exemplary embodiment will be described below. In the modifications described below, a portion in which the driving thyristor S and the light-emitting diode LED are stacked in the island 301 of the light-emitting chip C is different. Since the rest of the configuration is substantially the same as that of the light-emitting chip C described above, a description of the substantially the same part is omitted and different part will be described.

Figure 13:
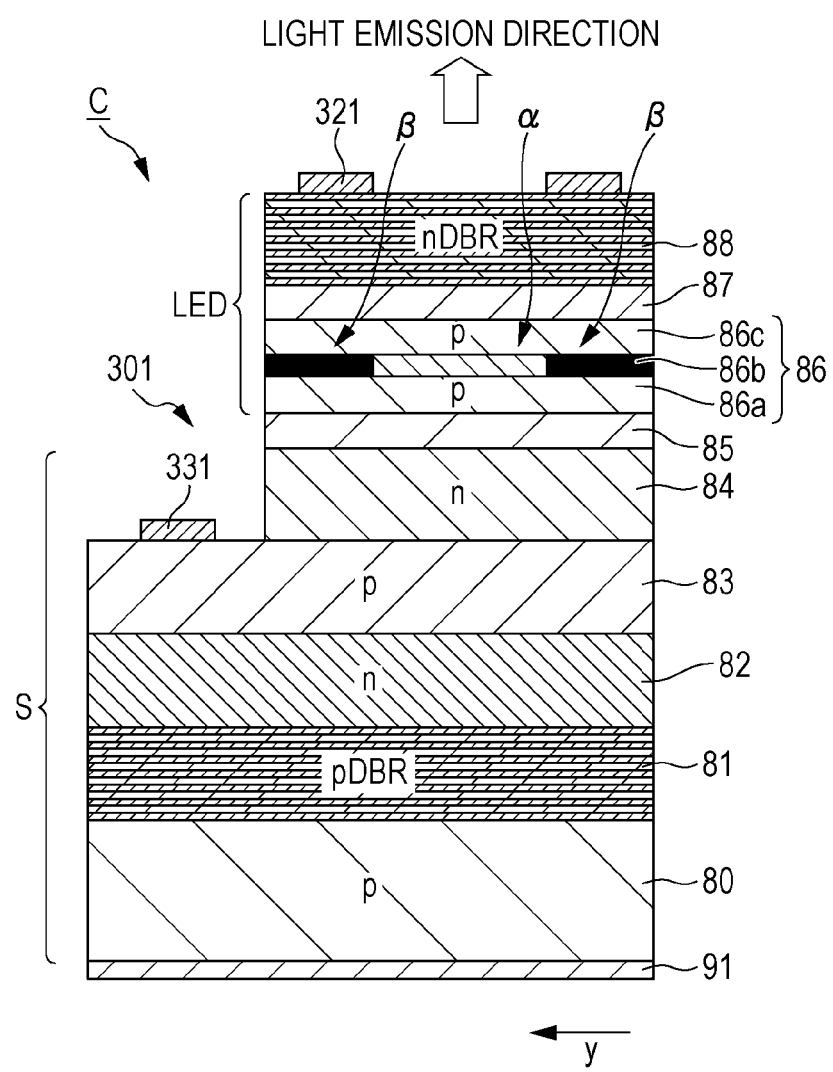
FIG. 13 illustrates a first modification of the second exemplary embodiment and is an enlarged cross-sectional view of an island in which a driving thyristor and a light-emitting diode are stacked.

First Modification of Light-Emitting Chip C According to Second Exemplary Embodiment FIG. 13 illustrates a first modification of the second exemplary embodiment and is an enlarged cross-sectional view of the island 301 in which the driving thyristor S and the light-emitting diode LED are stacked.

In the first modification of the second exemplary embodiment, the p-anode (p-DBR) layer 86 of the light-emitting chip C illustrated in FIG. 12 is replaced with the p-anode layer 86 that is not a DBR layer; instead, the p-anode layer 81 is formed as a DBR layer. Thus, the p-anode layer 81 is referred to as a p-anode (p-DBR) layer 81. The rest of the configuration is substantially the same as that of the light-emitting chip C according to the second exemplary embodiment.

In the first modification of the second exemplary embodiment, the p-anode (p-DBR) layer 81 and the n-cathode (n-DBR) layer 88 constitute a resonator (cavity), and the intensity of light from the light-emitting layer 87 is increased by resonance before the light is output. In this case, light emitted by the light-emitting diode LED has a wavelength that is not absorbed by the light-absorbing layer 85 and resonates between the p-anode (p-DBR) layer 81 and the n-cathode (n-DBR) layer 88. On the other hand, light emitted by the driving thyristor S has a wavelength that is absorbed by the light-absorbing layer 85 and is absorbed by the light-absorbing layer 85.

That is, mixing of the light emitted by the driving thyristor S to the emission spectrum of the light-emitting diode LED is suppressed.

Note that the current constriction layer 86b provided in the p-anode layer 86 of the light-emitting diode LED may be provided in the n-cathode (n-DBR) layer 88 of the light-emitting diode LED or in the p-anode (p-DBR) layer 81 or the n-cathode layer 84 of the driving thyristor S.

Further, the current may be constricted using the light-absorbing layer 85 as in the second modification of the light-emitting chip C according to the first exemplary embodiment (see FIG. 11).

Figure 14:
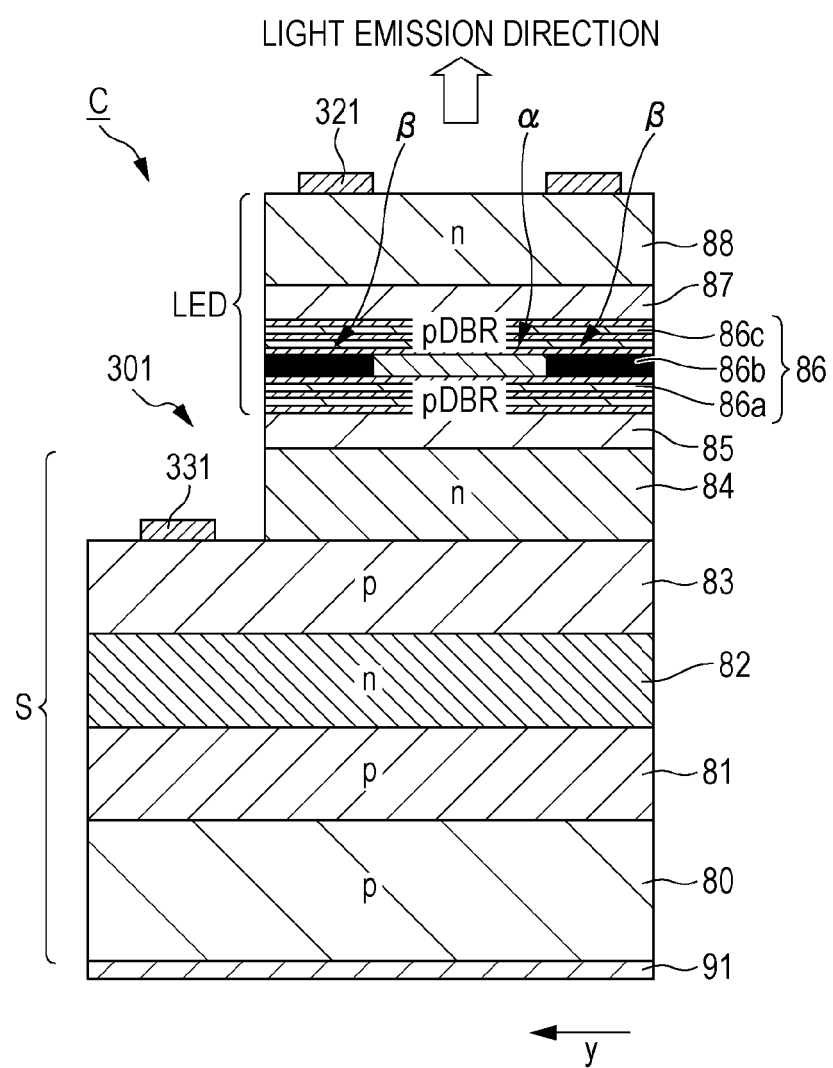
FIG. 14 illustrates a second modification of the second exemplary embodiment and is an enlarged cross-sectional view of an island in which a driving thyristor and a light-emitting diode are stacked.

Second Modification of Light-Emitting Chip C According to Second Exemplary Embodiment FIG. 14 illustrates a second modification of the second exemplary embodiment and is an enlarged cross-sectional view of the island 301 in which the driving thyristor S and the light-emitting diode LED are stacked.

In the second modification of the second exemplary embodiment, the n-cathode (n-DBR) layer 88 of the light-emitting chip C illustrated in FIG. 12 is replaced with the n-cathode layer 88 that is not a DBR layer. The rest of the configuration is substantially the same as that of the light-emitting chip C according to the second exemplary embodiment.

In the light-emitting chip C according to the second modification of the second exemplary embodiment, the p-anode (p-DBR) layer 86 is disposed under the light-emitting layer (on the side closer to the substrate 80). In this case, since a reflectance of 30% is achieved at an interface of the n-cathode layer 88 and air, the intensity of light from the light-emitting layer 87 is increased by resonance before the light is output.

In addition, light that travels toward the substrate 80 out of light from the light-emitting layer 87 is reflected and then travels towards the exit. Thus, the light use efficiency increases compared with the case where the p-anode layer 86 is not a DBR layer.

Note that the current constriction layer 86b provided in the p-anode (p-DBR) layer 86 of the light-emitting diode LED may be provided in the n-cathode layer 88 of the light-emitting diode LED or in the p-anode layer 81 or the n-cathode layer 84 of the driving thyristor S.

Further, the current may be constricted using the light-absorbing layer 85 as in the second modification of the light-emitting chip C according to the first exemplary embodiment (see FIG. 11).

Third Exemplary Embodiment

A light-emitting chip C according to a third exemplary embodiment uses laser diodes, which are an example of light-emitting elements, in place of the light-emitting diodes LED used in the first and second exemplary embodiments.

The configuration other than the light-emitting chip C is substantially the same as that of the first exemplary embodiment. Thus, the light-emitting chip C will be described, and a description of the substantially the same part is omitted.

Figure 15:
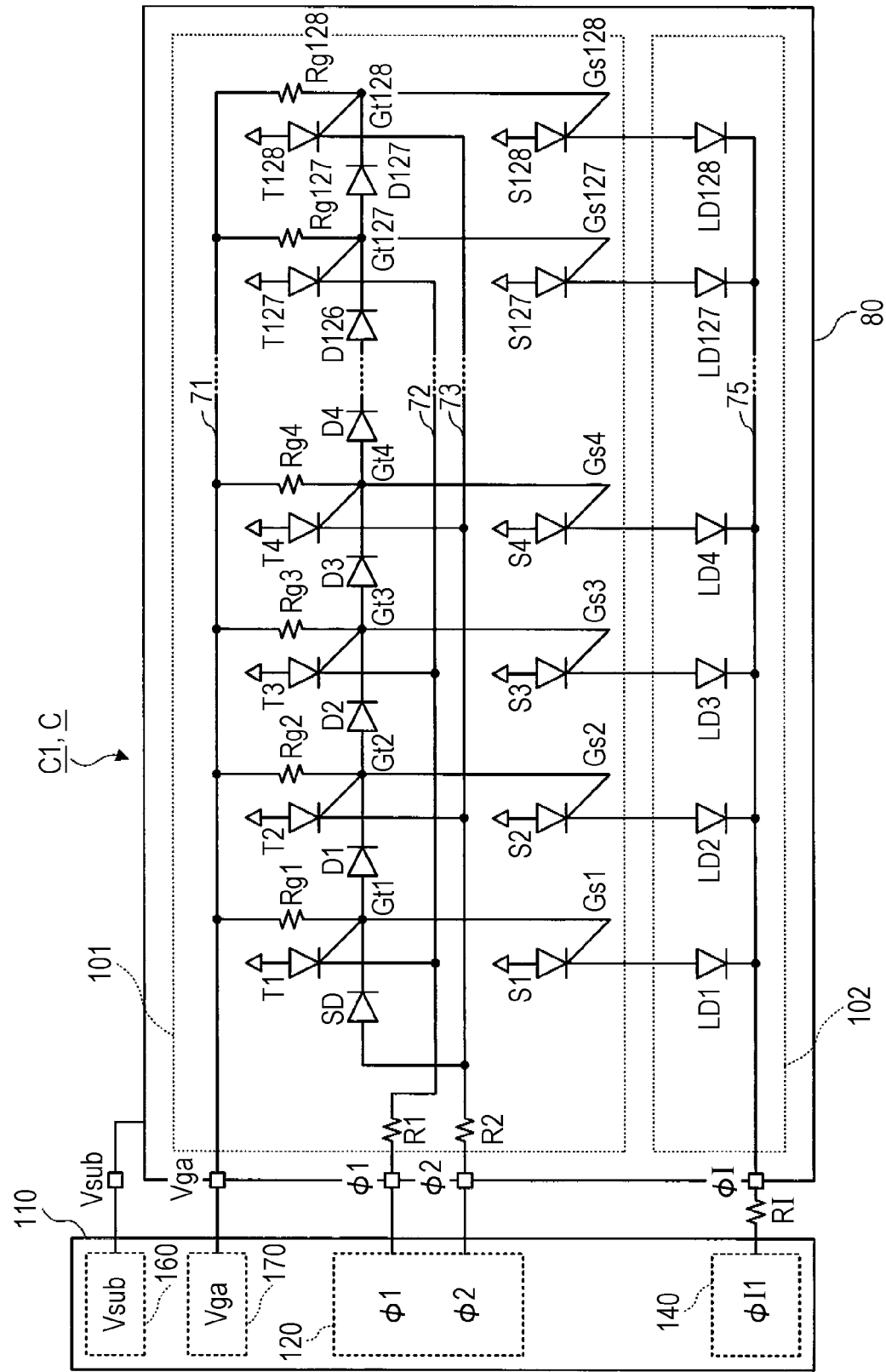
FIG. 15 is an equivalent circuit diagram illustrating a circuit configuration of a light-emitting chip in which an SLED array according to a third exemplary embodiment is mounted.

FIG. 15 is an equivalent circuit diagram illustrating a circuit configuration of the light-emitting chip C in which an SLED array according to the third exemplary embodiment is mounted. The light-emitting diodes LED1 to LED128 illustrated in FIG. 5 in the first exemplary embodiment are replaced with laser diodes LD1 to LD128. The laser diodes LD1 to LD128 are referred to as laser diodes LD when they are not distinguished from one another. Since the rest of the configuration is substantially the same as that illustrated in FIG. 5, a description thereof is omitted.

In addition, as for the plan layout view and the cross-sectional view of the light-emitting chip C according to the third exemplary embodiment, the light-emitting diodes LED illustrated in FIGS. 6A and 6B in the first exemplary embodiment just need to be replaced with the laser diodes LD. Thus, the plan layout view and the cross-sectional view of the light-emitting chip C according to the third exemplary embodiment are omitted.

In the light-emitting chip C according to the third exemplary embodiment, the driving thyristor S and the laser diode LD are stacked.

The laser diode LD includes the light-emitting layer 87 sandwiched by two cladding layers (hereinafter, referred to as cladding layers). The cladding layers are layers having a greater refractive index than the light-emitting layer 87. Light from the light-emitting layer 87 is reflected by interfaces between the light-emitting layer 87 and the cladding layers to confine the light in the light-emitting layer 87. Then, the confined light is resonated by a resonator constituted by side faces of the light-emitting layer 87 to cause laser oscillation. The light-emitting layer 87 is sometimes referred to as an active layer.

Figure 16:
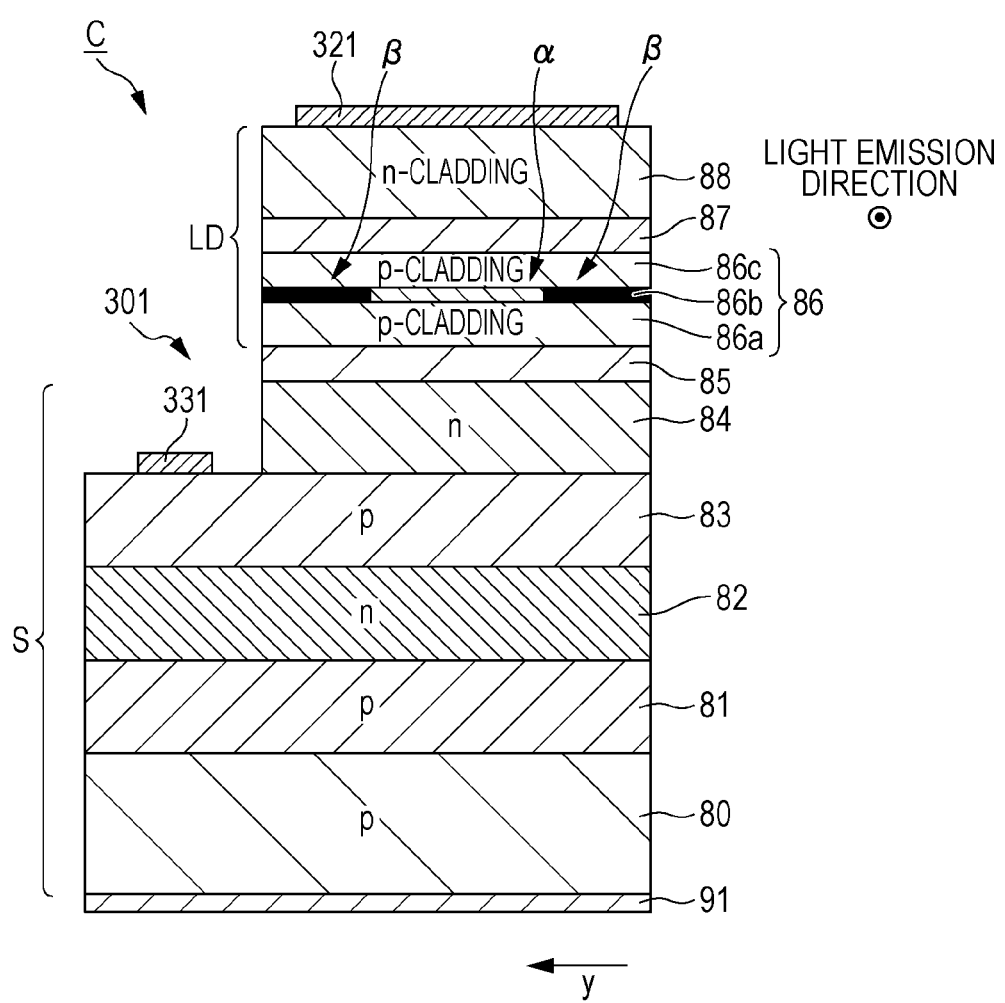
FIG. 16 is an enlarged cross-sectional view of an island in which a driving thyristor and a laser diode are stacked in the light-emitting chip according to the third exemplary embodiment.

FIG. 16 is an enlarged cross-sectional view of the island 301 in which the driving thyristor S and the laser diode LD are stacked in the light-emitting chip C according to the third exemplary embodiment.

In the light-emitting chip C, the p-anode layer 86 is constituted by p-cladding layers and the current constriction layer 86b. Specifically, the lower p-layer 86a and the upper p-layer 86c of the p-anode layer 86 are formed as cladding layers. In addition, the n-cathode layer 88 is formed as a cladding layer. Note that the lower p-layer 86a, the upper p-layer 86c, and the n-cathode layer 88 are sometimes referred to as a lower p-cladding layer 86a, an upper p-cladding layer 86c, and an n-cathode (n-cladding) layer 88, respectively. In addition, the entire p-anode layer 86 is sometimes referred to as a p-anode (p-cladding) layer 86. The terms "p-CLADDING" and "n-CLADDING" are used in the drawings.

The lower p-cladding layer 86a and the upper p-cladding layer 86c of the p-anode (p-cladding) layer 86 are formed of p-type $Al_{0.9}GaAs$ with an impurity concentration of $5\times10^{17}/cm^3$, for example. The Al composition ratio may be changed within a range of 0 to 1. Note that GaInP or the like may be alternatively used.

The n-cathode (n-cladding) layer 88 is formed of n-type $Al_{0.9}GaAs$ with an impurity concentration of $5\times10^{17}/cm^3$, for example. The Al composition ratio may be changed within a range of 0 to 1. Note that GaInP or the like may be used instead of $Al_{0.9}GaAs$.

The p-anode (p-cladding) layer 86, the n-cathode (n-cladding) layer 88, and the light-emitting layer 87 are configured so that light from the light-emitting layer 87 is confined between the p-anode (p-cladding) layer 86 and the n-cathode (n-cladding) layer 88 and laser oscillation is caused between the side faces (end faces) of the light-emitting layer 87. In this case, the light is emitted from the side faces (end faces) of the light-emitting layer 87.

Thus, the n-ohmic electrode 321 is disposed on substantially the entire surface of the n-cathode (n-cladding) layer 88.

Note that the direction in which the light is emitted is a direction perpendicular to the y direction in FIG. 16, that is, the −x direction illustrated in FIG. 6A for convenience of explanation. Thus, the light may be emitted in the −y direction. In addition, the light may be directed in a direction perpendicular to the substrate 80 using a mirror or the like. The same applies to the other light-emitting chips C and modifications thereof.

Since electric power consumed by non-radiative recombination is reduced by providing the current constriction layer 86b, power consumption reduces and light extraction efficiency improves.

The light-emitting chip C according to the third exemplary embodiment operates in accordance with the timing chart illustrated in FIG. 9 just like the light-emitting chip C according to the first exemplary embodiment.

Note that the current constriction layer 86b provided in the p-anode (p-cladding) layer 86 of the laser diode LD may be provided in the n-cathode (n-cladding) layer 88 of the laser diode LD or in the p-anode layer 81 or the n-cathode layer 84 of the driving thyristor S.

Modifications of the light-emitting chip C according to the third exemplary embodiment will be described below. In the modifications described below, the portion in which the driving thyristor S and the laser diode LD are stacked in the island 301 of the light-emitting chip C is different. Since the rest of the configuration is substantially the same as that of the light-emitting chip C described above, the different part is described and a description of the substantially the same part is omitted.

Figure 17:
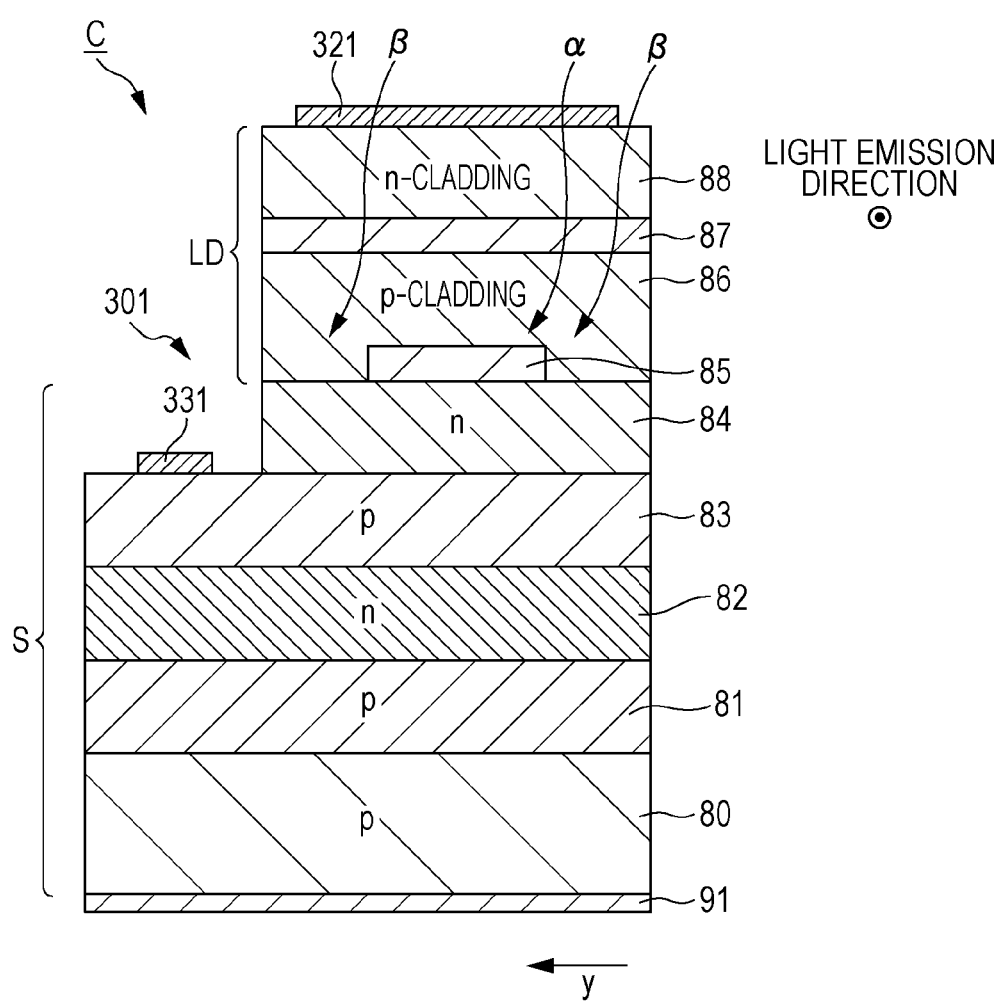
FIG. 17 illustrates a first modification of the third exemplary embodiment and is an enlarged cross-sectional view of an island in which a driving thyristor and a laser diode are stacked.

First Modification of Light-Emitting Chip C According to Third Exemplary Embodiment FIG. 17 illustrates a first modification of the third exemplary embodiment and is an enlarged cross-sectional view of the island 301 in which the driving thyristor S and the laser diode LD are stacked.

In the first modification of the third exemplary embodiment, the light-absorbing layer 85 is disposed at a portion corresponding to the current passing portion α in place of the current constriction layer 86b as in the second modification of the first exemplary embodiment illustrated in FIG. 11. The rest of the configuration is substantially the same as that of the light-emitting chip C according to the third exemplary embodiment.

As described above, current easily flows through the light-absorbing layer 85. However, current does not easily flow through a junction of the n-cathode layer 84 and the p-anode layer 86 in the reverse-biased state in which breakdown hardly occurs.

Thus, if the light-absorbing layer 85 is disposed at the portion corresponding to the current passing portion α located at the central portion of the laser diode LD, the current flowing through the laser diode LD is constricted to the central portion of the laser diode LD.

Figure 18:
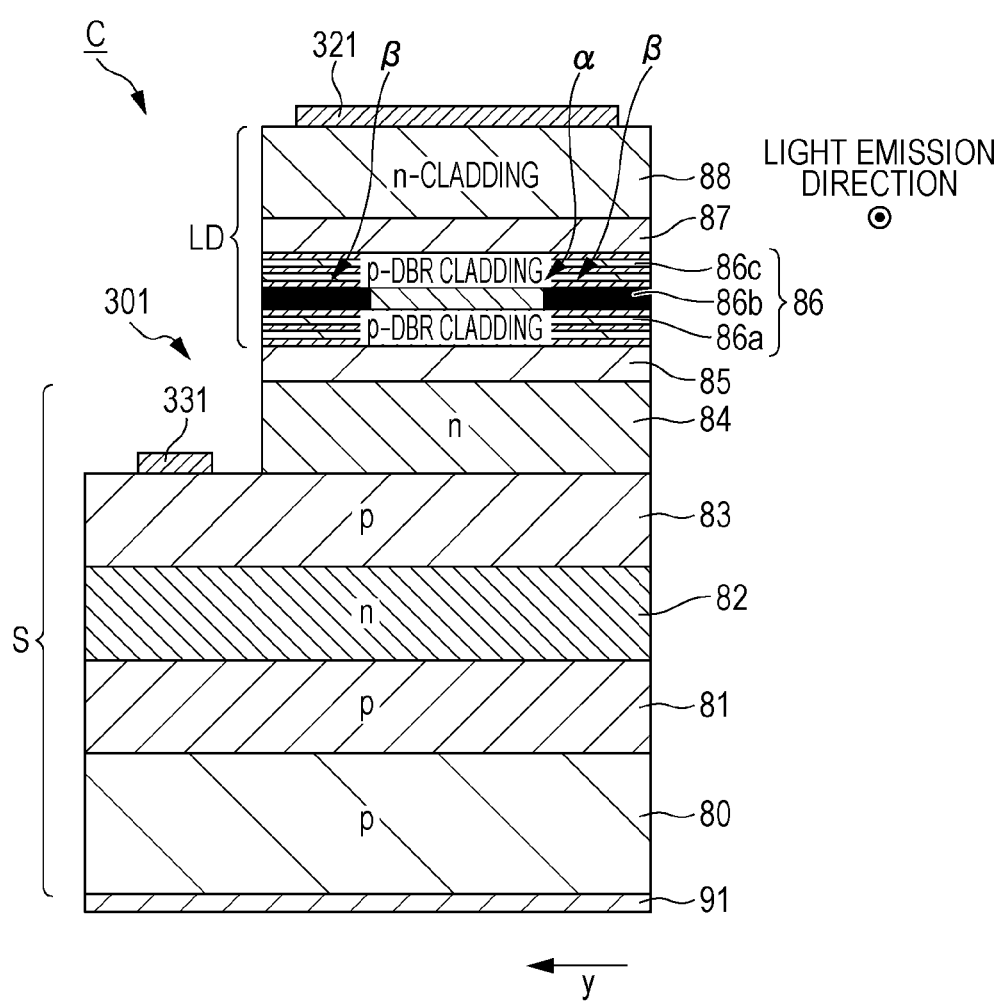
FIG. 18 illustrates a second modification of the third exemplary embodiment and is an enlarged cross-sectional view of an island in which a driving thyristor and a laser diode are stacked.

Second Modification of Light-Emitting Chip C According to Third Exemplary Embodiment FIG. 18 illustrates a second modification of the third exemplary embodiment and is an enlarged cross-sectional view of the island 301 in which the driving thyristor S and the laser diode LD are stacked.

In the second modification of the third exemplary embodiment, the lower p-cladding layer 86a and the upper p-cladding layer 86c of the p-anode (p-cladding) layer 86 are formed as DBR layers (p-DBR cladding) as in the second modification of the light-emitting chip C according to the second exemplary embodiment. The rest of the configuration is substantially the same as that of the light-emitting chip C according to the third exemplary embodiment.

If a semiconductor material having a smaller bandgap than a bandgap equivalent to the wavelength oscillated by the laser diode LD is used for the light-absorbing layer 85, light that has reached the light-absorbing layer 85 is subjected to band-edge absorption, resulting in a loss. Thus, in the second modification of the third exemplary embodiment, DBR layers are provided between the light-emitting layer 87 and the light-absorbing layer 85 and the light-absorbing layer 85 is provided at a position equivalent to the node of the standing wave caused in the DBR layers. Such a configuration greatly reduces band-edge absorption by a semiconductor material used for the light-absorbing layer 85.

Note that the current constriction layer 86b provided in the p-anode (p-cladding) layer 86 of the laser diode LD may be provided in the n-cathode (n-cladding) layer 88 of the laser diode LD or in the p-anode layer 81 or the n-cathode layer 84 of the driving thyristor S.

Figure 19:
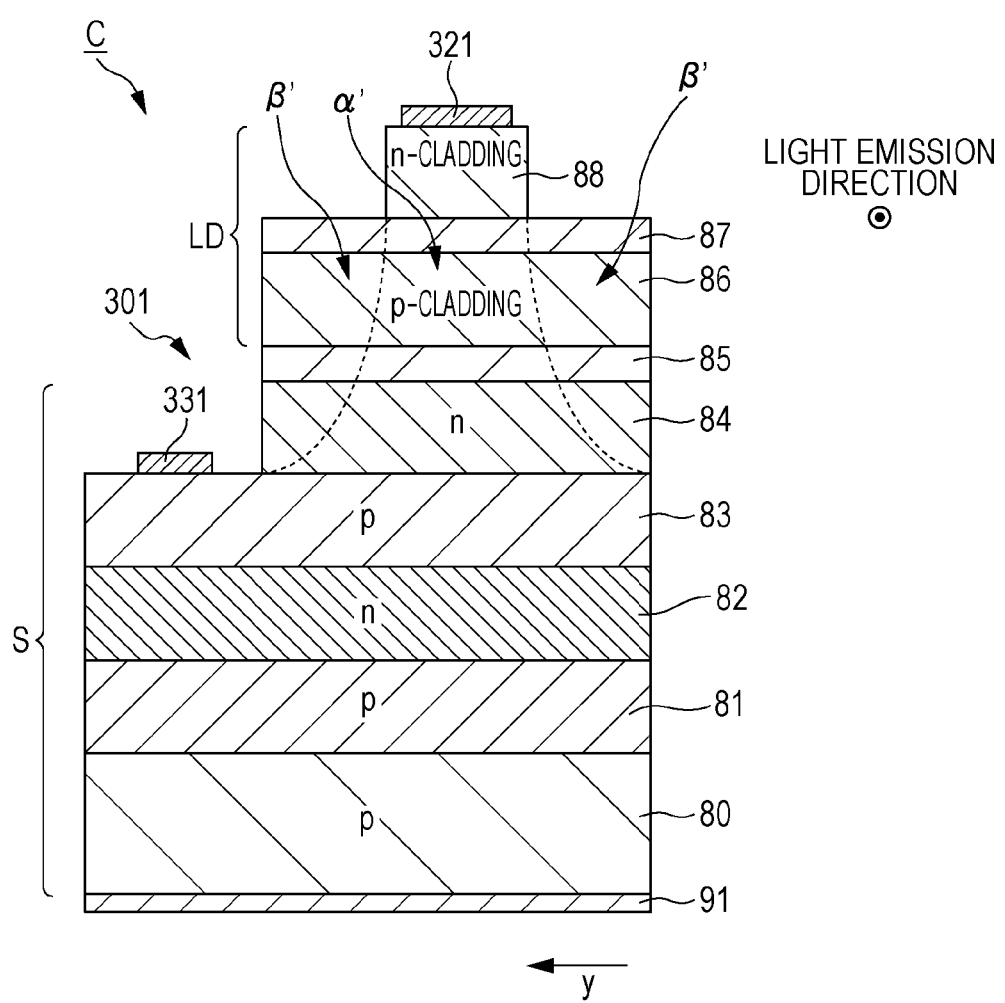
FIG. 19 illustrates a third modification of the third exemplary embodiment and is an enlarged cross-sectional view of an island in which a driving thyristor and a laser diode are stacked.

Third Modification of Light-Emitting Chip C According to Third Exemplary Embodiment FIG. 19 illustrates a third modification of the third exemplary embodiment and is an enlarged cross-sectional view of the island 301 in which the driving thyristor S and the laser diode LD are stacked.

In the third modification of the third exemplary embodiment, the current constriction layer 86b is not used in the light-emitting chip C according to the third exemplary embodiment; instead, the surface area of the n-cathode (n-cladding) layer 88 is reduced. The rest of the configuration is substantially the same as that of the light-emitting chip C according to the third exemplary embodiment.

Such a structure is substantially the same as the ridge waveguide.

With such a configuration, current flows from the n-cathode (n-cladding) layer 88 in the laser diode LD. Thus, the central portion of the laser diode LD serves as a current passing portion (area) a' and the circumferential portion serves as a current blocking portion (area) 1' as illustrated in FIG. 19. That is, the current path is constricted as in the light-emitting chip C according to the third exemplary embodiment that uses the current constriction layer 86b (see FIG. 16) and the first modification of the third exemplary embodiment in which the light-absorbing layer 85 is disposed at the central portion of the laser diode LD.

Since the current constriction layer 86b is not used in the third modification of the third exemplary embodiment, the fabrication process is simplified.

In addition, since the current constriction layer 86b is not used in the configuration according to the third modification of the third exemplary embodiment, the configuration is suitable for a semiconductor material on a substrate of InP, GaN, or sapphire for which application of steam oxidation is difficult.

Figure 20:
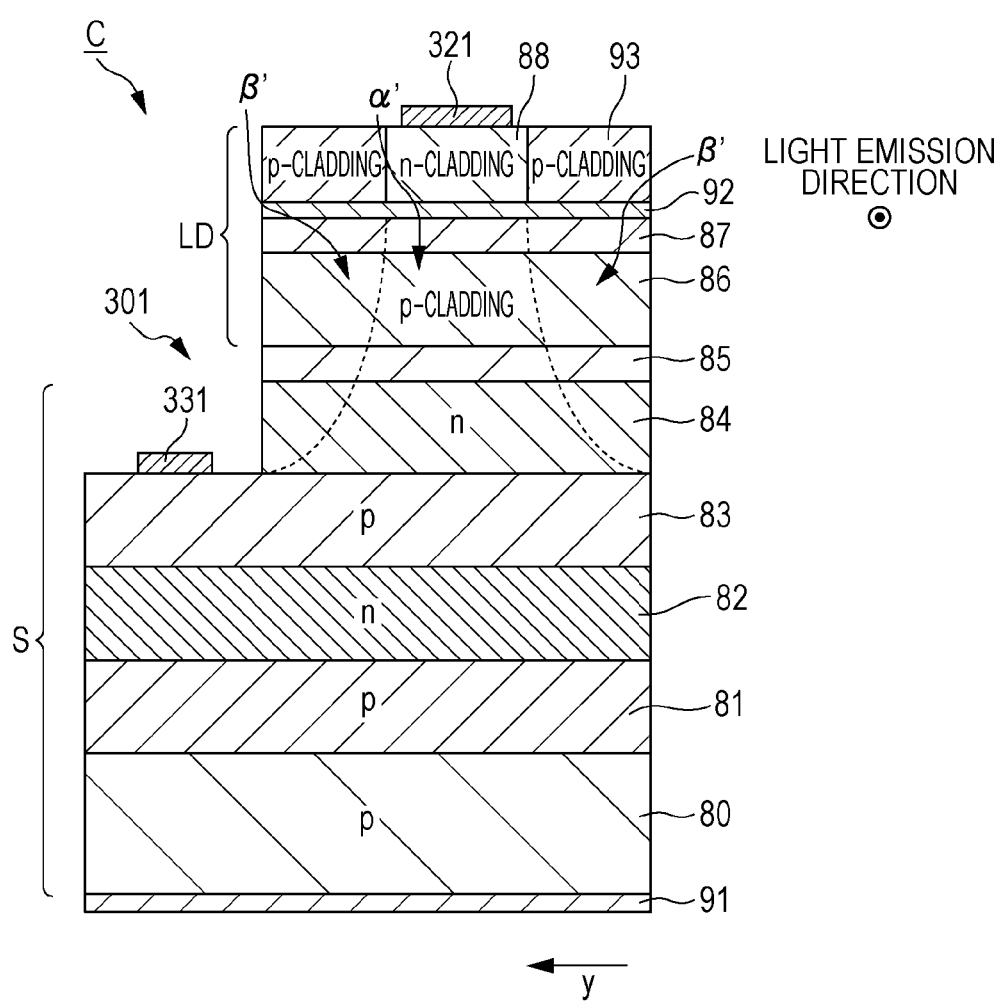
FIG. 20 illustrates a fourth modification of the third exemplary embodiment and is an enlarged cross-sectional view of an island in which a driving thyristor and a laser diode are stacked.

Fourth Modification of Light-Emitting Chip C According to Third Exemplary Embodiment FIG. 20 illustrates a fourth modification of the third exemplary embodiment and is an enlarged cross-sectional view of the island 301 in which the driving thyristor S and the laser diode LD are stacked.

In the fourth modification of the third exemplary embodiment, an n-cathode (n-cladding) layer 92 is disposed on the light-emitting layer 87 according to the third modification of the third exemplary embodiment and the n-cathode (n-cladding) layer 88 with a smaller area is disposed on the n-cathode (n-cladding) layer 92. The n-cathode (n-cladding) layer 88 is surrounded by a p-anode (p-cladding) layer 93 that is substantially the same as the p-anode (p-cladding) layer 86. The rest of the configuration is substantially the same as that of the light-emitting chip C according to the third exemplary embodiment.

Since the n-cathode (n-cladding) layer 88 and the n-cathode (n-cladding) layer 92 and the p-anode (p-cladding) layer 93 form pn junctions, current is constricted to the n-cathode (n-cladding) layer 88. Thus, electric power consumed by non-radiative recombination is reduced, and consequently power consumption reduces and light extraction efficiency improves, as in the case where the current constriction layer 86b is provided.

Such a structure is substantially the same as a buried waveguide.

Since the current constriction layer 86b of the light-emitting chip C according to the third exemplary embodiment (see FIG. 18) is not used in the fourth modification of the third exemplary embodiment, the configuration is suitable for a semiconductor material on the substrate of InP, GaN, or sapphire for which application of steam oxidation is difficult.

Fourth Exemplary Embodiment

An light-emitting chip C according to a fourth exemplary embodiment uses vertical-cavity surface-emitting lasers (VCSEL), each of which is an example of a light-emitting element, in place of the light-emitting diodes LED according to the first and second exemplary embodiments and the laser diodes LD according to the third exemplary embodiment.

The configuration other than the light-emitting chip C is substantially the same as that of the first exemplary embodiment. Thus, the light-emitting chip C will be described, and a description of the substantially the same part is omitted.

Figure 21:
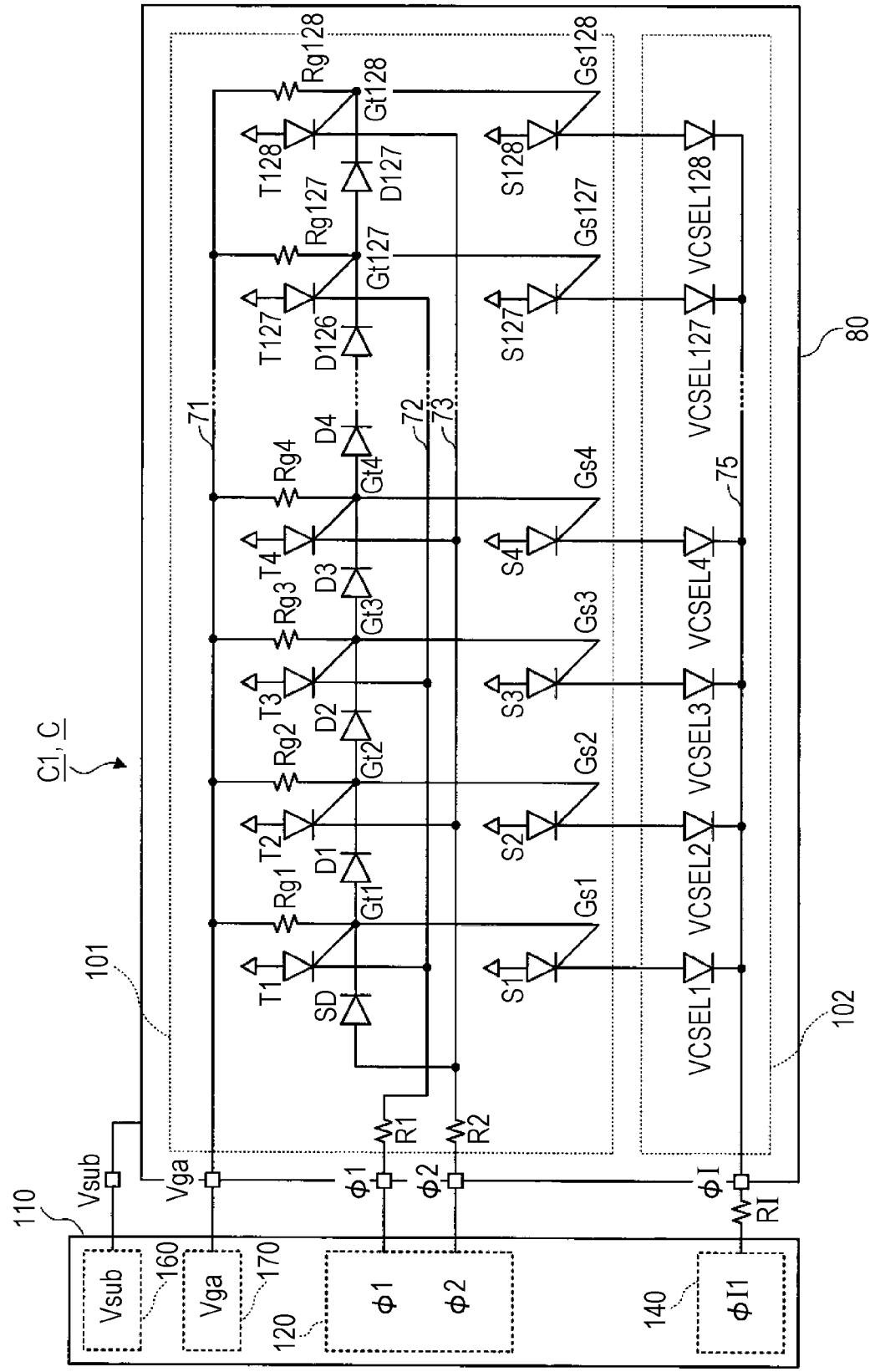
FIG. 21 is an equivalent circuit diagram illustrating a circuit configuration of a light-emitting chip in which an SLED array according to a fourth exemplary embodiment is mounted.

FIG. 21 is an equivalent circuit diagram illustrating a circuit configuration of the light-emitting chip C in which an SLED array according to the fourth exemplary embodiment is mounted. In FIG. 21, the light-emitting diodes LED1 to LED128 illustrated in FIG. 5 in the first exemplary embodiment are replaced with the vertical-cavity surface-emitting lasers VCSEL1 to VCSEL128. The vertical-cavity surface-emitting lasers VCSEL1 to VCSEL128 are referred to as vertical-cavity surface-emitting lasers VCSEL when they are not distinguished from one another. Since the rest of the configuration is substantially the same as that illustrated in FIG. 5, a description thereof is omitted.

In addition, as for the plan layout view and the cross-sectional view of the light-emitting chip C according to the fourth exemplary embodiment, the light-emitting diodes LED illustrated in FIGS. 6A and 6B in the first exemplary embodiment are replaced with the vertical-cavity surface-emitting lasers VCSEL. Thus, the plan layout view and the cross-sectional view of the light-emitting chip C according to the fourth exemplary embodiment are omitted.

Figure 22:
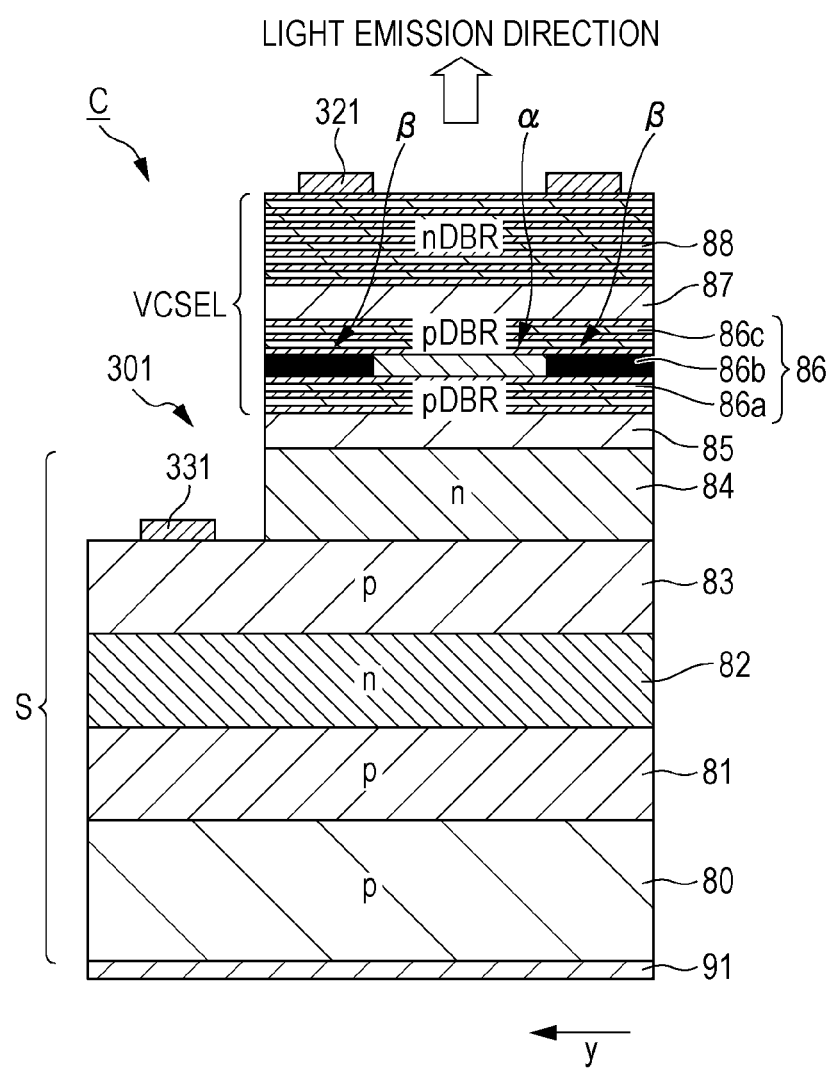
FIG. 22 is an enlarged cross-sectional view of an island in which a driving thyristor and a vertical-cavity surface-emitting laser are stacked in the light-emitting chip according to the fourth exemplary embodiment.

FIG. 22 is an enlarged cross-sectional view of the island 301 in which the driving thyristor S and the vertical-cavity surface-emitting laser VCSEL are stacked in the light-emitting chip C according to the fourth exemplary embodiment.

The driving thyristor S and the vertical-cavity surface-emitting laser VCSEL are stacked.

Since a basic configuration is substantially the same as that of the light-emitting chip C according to the second exemplary embodiment illustrated in FIG. 12, a description thereof is omitted.

The vertical-cavity surface-emitting laser VCSEL resonates light at the light-emitting layer 87 sandwiched by two DBR layers (the p-anode (p-DBR) layer 86 and the n-cathode (n-DBR) layer 88) to cause laser oscillation. Laser oscillation occurs when the reflectance between the light-emitting layer 87 and the two DBR layers (the p-anode (p-DBR) layer 86 and the n-cathode (n-DBR) layer 88) becomes greater than or equal to 99%, for example. The vertical-cavity surface-emitting laser VCSEL emits light in the z direction indicated as an arrow with a light emission direction.

Note that the terms "pDBR" and "nDBR" are used in the drawings.

In this vertical-cavity surface-emitting laser VCSEL, the p-anode (p-DBR) layer 86 is located between the light-absorbing layer 85 and the light-emitting layer 87. Thus, since light does not reach the light-absorbing layer 85, the bandgap of the light-absorbing layer 85 may be smaller than the bandgap equivalent to the wavelength of light emitted by the driving thyristor S and may be smaller than the bandgap equivalent to the oscillation wavelength of the vertical-cavity surface-emitting laser VCSEL. Consequently, resistance of the light-absorbing layer 85 is successfully reduced.

The light-emitting chip C according to the fourth exemplary embodiment operates in accordance with the timing chart illustrated in FIG. 9 just light the light-emitting chip C according to the first exemplary embodiment.

The current constriction layer 86b provided in the p-anode (p-DBR) layer 86 of the vertical-cavity surface-emitting laser VCSEL may be provided in the n-cathode (n-DBR) layer 88 of the vertical-cavity surface-emitting laser VCSEL or in the p-anode layer 81 or the n-cathode layer 84 of the driving thyristor S.

Modifications of the light-emitting chip C according to the fourth exemplary embodiment will be described below. In the modifications described below, a portion in which the driving thyristor S and the vertical-cavity surface-emitting laser VCSEL are stacked in the island 301 of the light-emitting chip C is different. Since the rest of the configuration is substantially the same as that of the light-emitting chip C described above, the different part is described and a description of the substantially the same part is omitted.

Figure 23:
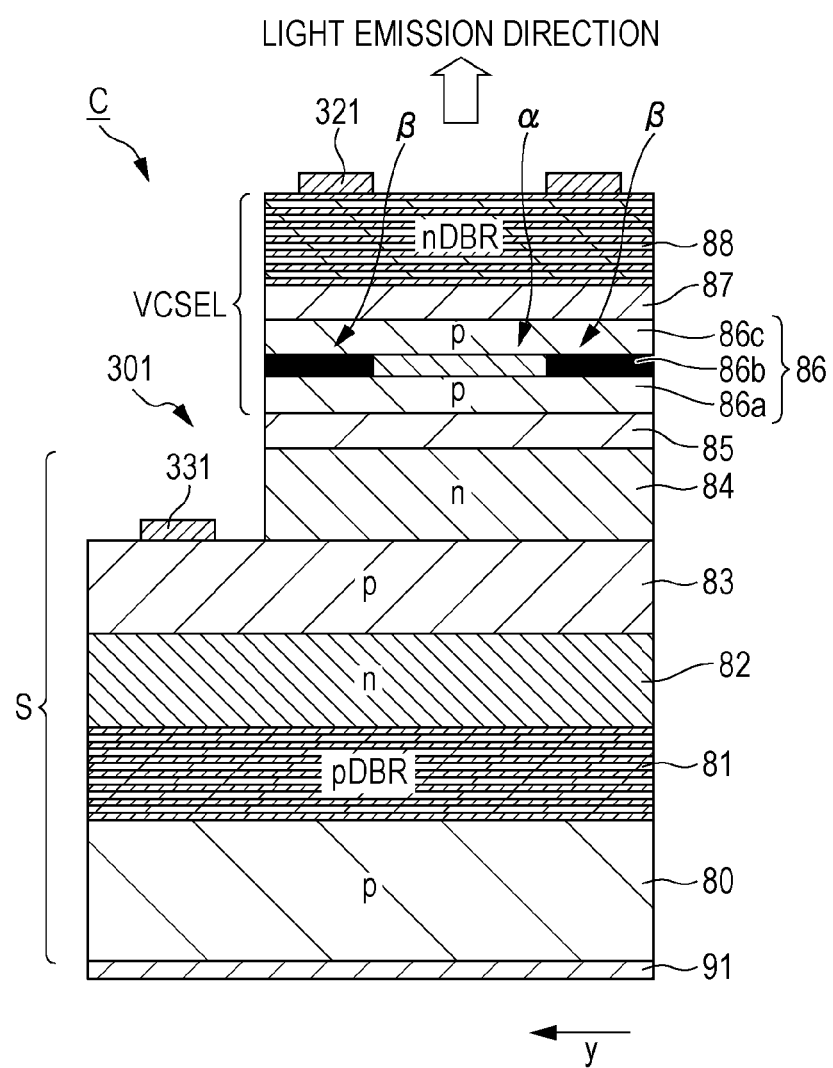
FIG. 23 illustrates a first modification of the fourth exemplary embodiment and is an enlarged cross-sectional view of an island in which a driving thyristor and a vertical-cavity surface-emitting laser are stacked.

First Modification of Light-Emitting Chip C According to Fourth Exemplary Embodiment FIG. 23 illustrates a first modification of the fourth exemplary embodiment and is an enlarged cross-sectional view of the island 301 in which the driving thyristor S and the vertical-cavity surface-emitting laser VCSEL are stacked.

Since a basic configuration of the first modification of the fourth exemplary embodiment is substantially the same as that of the first modification of the light-emitting chip C according to the second exemplary embodiment illustrated in FIG. 13, a description thereof is omitted.

The vertical-cavity surface-emitting laser VCSEL resonates light from the light-emitting layer 87 between two DBR layers (the p-anode (p-DBR) layer 81 and the n-cathode (n-DBR) layer 88) to cause laser oscillation.

In this modification, the light-absorbing layer 85 does not absorb (passes) light oscillated by the vertical-cavity surface-emitting laser VCSEL but absorbs light from the driving thyristor S.

Note that the current constriction layer 86b provided in the p-anode layer 86 of the vertical-cavity surface-emitting laser VCSEL may be provided in the n-cathode (n-DBR) layer 88 of the vertical-cavity surface-emitting laser VCSEL or in the p-anode layer 81 or the n-cathode layer 84 of the driving thyristor S.

Figure 24:
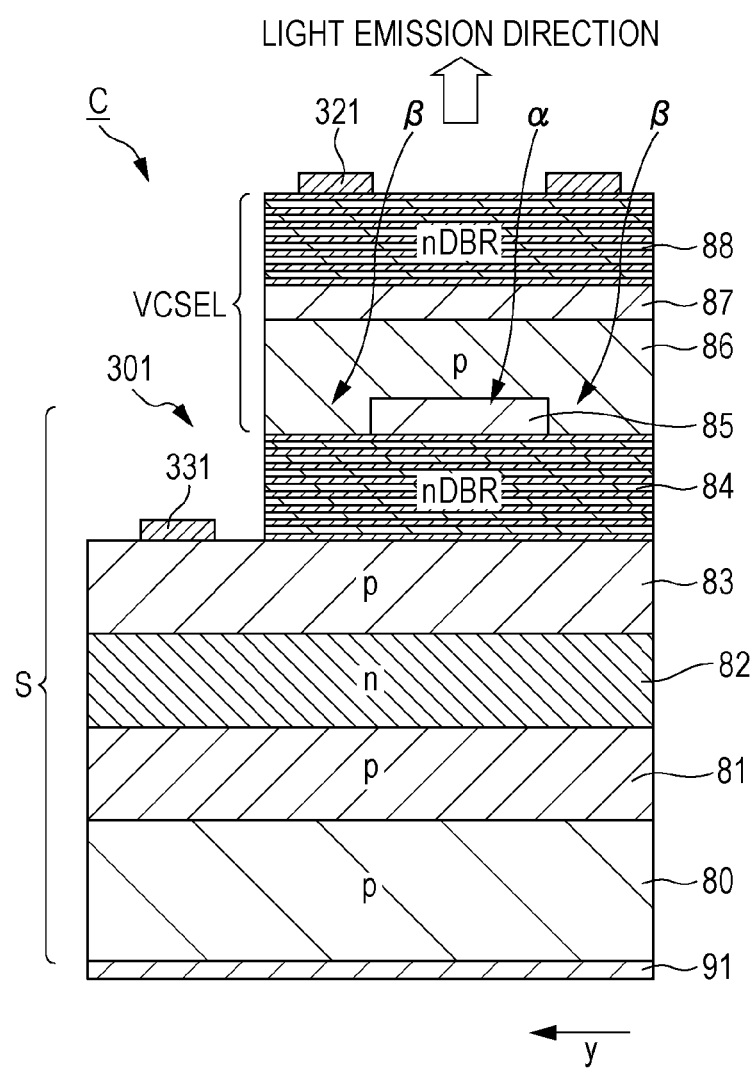
FIG. 24 illustrates a second modification of the fourth exemplary embodiment and is an enlarged cross-sectional view of an island in which a driving thyristor and a vertical-cavity surface-emitting laser are stacked.

Second Modification of Light-Emitting Chip C According to Fourth Exemplary Embodiment FIG. 24 illustrates a second modification of the fourth exemplary embodiment and is an enlarged cross-sectional view of the island 301 in which the driving thyristor S and the vertical-cavity surface-emitting laser VCSEL are stacked.

A basic configuration of the second modification of the fourth exemplary embodiment is such that the n-cathode layer 84 and the n-cathode layer 88 in the second modification of the light-emitting chip C according to the first exemplary embodiment illustrated in FIG. 11 are formed as DBR layers. Since the rest of the configuration is substantially the same as that of the second modification of the first exemplary embodiment, a description thereof is omitted.

The vertical-cavity surface-emitting laser VCSEL resonates light from the light-emitting layer 87 between two DBR layers (the n-cathode (n-DBR) layer 84 and the n-cathode (n-DBR) layer 88) that sandwich the light-emitting layer 87 and the p-anode layer 86 to cause laser oscillation.

Also in this modification, the light-absorbing layer 85 does not absorb (passes) light oscillated by the vertical-cavity surface-emitting laser VCSEL but absorbs light from the driving thyristor S.

In addition, since the current constriction layer 86b of the light-emitting chip C according to the fourth exemplary embodiment (see FIG. 22) is not used in the second modification of the fourth exemplary embodiment, the configuration is suitable for a semiconductor material on the substrate of InP, GaN, or sapphire for which application steam oxidation is difficult.

Note that since the light-absorbing layer 85 is used to constrict current, electric power consumed by non-radiative recombination is reduced. Consequently, power consumption reduces and light extraction efficiency improves.

In the first to fourth exemplary embodiments, the conductivity types of the light-emitting elements (the light-emitting diodes LED, the laser diodes LD, and the vertical-cavity surface-emitting lasers VCSEL) and of the thyristors (the transfer thyristors T and the driving thyristors S) may be reversed, and the polarity of the circuit may be changed. That is, the anode-common circuit may be changed to a cathode-common circuit.

In addition, in the first to fourth exemplary embodiments, the description has been given of the case where the driving thyristor S, the light-absorbing layer 85, and the light-emitting element (the light-emitting diode LED, the laser diode LD, or the vertical-cavity surface-emitting laser VCSEL) are sequentially stacked on the substrate 80 from the bottom. Conversely, the light-emitting element (the light-emitting diode LED, the laser diode LD, or the vertical-cavity surface-emitting laser VCSEL), the light-absorbing layer 85, and the driving thyristor S may be sequentially stacked on the substrate 80 from the bottom. In such a case, if the light emission direction is the z direction in the first to fourth exemplary embodiments, the −z direction may be set as the light emission direction and light may be emitted through the substrate 80.

To reduce light emission delay and relaxation oscillation at the time of turn-on of the light-emitting elements (the light-emitting diodes LED, the laser diodes LD, and the vertical-cavity surface-emitting lasers VCSEL), a small current that is greater than or equal to a threshold current may be caused to flow through the light-emitting elements in advance to set the light-emitting elements in a light-emitting state or an oscillation-state. That is, the light-emitting elements may be caused to emit weak light before the respective driving thyristors S turn on, and the amount of light emitted by the light-emitting elements may be increased when the respective driving thyristors S turn on so that a predetermined amount of light is emitted. Examples of such a configuration may include the following. For example, an electrode is formed at the anode layer of each light-emitting element (the light-emitting diode LED, the laser diode LD, or the vertical-cavity surface-emitting laser VCSEL). A voltage or current source may be connected to this electrode, and a weak current may be supplied to the light-emitting element from this voltage or current source before the driving thyristor S turns on.

Further, the SLED array constituted by the light-emitting elements (the light-emitting diodes LED, the laser diodes LD, or the vertical-cavity surface-emitting lasers VCSEL) and the thyristors (the transfer thyristors T and the driving thyristors S) has been described above. The SLED array may include other members such as thyristors, diodes, or resistors for control in addition to the aforementioned components.

In addition, the transfer thyristors T are connected to each other by the respective coupling diodes D. However, the transfer thyristors T may be connected to each other by respective members capable of transferring a change in the potential, such as resistors.

In addition, the transfer thyristors T and the driving thyristors S used in each of the exemplary embodiments may have a structure other than the pnpn four-layer structure as long as the structure implements functions of the transfer thyristors T and the driving thyristors S in the exemplary embodiment. For example, the transfer thyristors T and the driving thyristors S may have a pinin structure, a pipin structure, an npip structure, or a pnin structure having properties of the thyristors. In this case, one of the i-layer, the n-layer, and the i-layer sandwiched by the p-layer and the n-layer in the pinin structure and one of the n-layer and the i-layer sandwiched by the p-layer and the p-layer in the pnin structure may serve as a gate layer, and the n-ohmic electrode disposed on the gate layer may serve as the terminal of the gate Gt (gate Gs). Alternatively, one of the i-layer, the p-layer, and the i-layer sandwiched by the n-layer and the p-layer in the npip structure and one of the p-layer and the i-layer sandwiched by the n-layer and the p-layer in the npip structure may serve as the gate layer and the p-ohmic electrode 332 disposed on the gate layer may serve as the terminal of the gate Gt (gate Gs).

Further, the semiconductor structure in which plural semiconductor layers constituting a thyristor and plural semiconductor layers constituting a light-emitting element are stacked with one or more semiconductor layers constituting a light-absorbing layer interposed therebetween in accordance with each of the exemplary embodiments is usable for a component other than the SLED array. For example, the semiconductor structure is usable as a single light-emitting element or a light-emitting element array other than the SLED array that turns on in response to input of an electric signal or optical signal from the outside.

In addition, the light-emitting diodes LED, the laser diodes LD, and the vertical-cavity surface-emitting lasers VCSEL are described as the light-emitting elements in the exemplary embodiments. However, other light-emitting elements may be used. For example, the light-emitting elements may be laser transistors each including an anode terminal, a cathode terminal, and a control terminal that controls on/off of laser oscillation or intensity of laser light.

The above description has been given mainly of the case where the substrate 80 is formed of p-type GaAs by way of example. An example of semiconductor layers constituting a semiconductor stack when a substrate of another type is used will be described by using the light-emitting chip C illustrated in FIG. 7. Note that the light-absorbing layer 85 is substantially the same as that described above.

First, an example of the semiconductor stack in the case where a GaN substrate is used is as described below.

The p-anode layer 81 is formed of p-type $Al_{0.9}GaN$ with an impurity concentration of $1\times10^{18}/cm^3$, for example. The Al composition ratio may be changed within a range of 0 to 1.

The n-gate layer 82 is formed of n-type $Al_{0.9}GaN$ with an impurity concentration of $1\times10^{17}/cm^3$, for example. The Al composition ratio may be changed within a range of 0 to 1.

The p-gate layer 83 is formed of p-type $Al_{0.9}GaN$ with an impurity concentration of $1\times10^{17}/cm^3$, for example. The Al composition ratio may be changed within a range of 0 to 1.

The n-cathode layer 84 is formed of n-type $Al_{0.9}GaN$ with an impurity concentration of $1\times10^{18}/cm^3$, for example. The Al composition ratio may be changed within a range of 0 to 1.

When the light-absorbing layer 85 is a layer having a smaller bandgap than the bandgap equivalent to light emitted by the driving thyristor S, a ternary/quaternary mixed crystal material having a lattice constant that substantially matches that of GaN may be used for the light-absorbing layer 85. For example, GaNP may be used. In addition, (1) an InN layer or an InGaN layer obtained by metamorphic growth, for example; (2) quantum dots of InN, InGaN, InNAs, or InNSb; or (3) an InAsSb layer having a lattice constant equivalent to the doubled lattice constant of GaN (the a-plane) may be used. These may contain Al, Ga, N, As, P, Sb, etc. In the case of quantum dots, the lattice constants need not necessarily match and a binary mixed crystal material may be used.

In addition, when the light-absorbing layer 85 is a layer with a high impurity concentration, for example, $n^{++}GaN$, $p^{++}GaN$, $n^{++}GaInN$, $p^{++}GaInN$, $n^{++}AlGaN$, or $p^{++}AlGaN$ may be used for the light-absorbing layer 85. The expression "$n^{++}$" or "$p^{++}$" indicates a high impurity concentration that is in a range from $1\times10^{19}/cm^3$ to $3\times10^{20}/cm^3$.

The p-anode layer 86 is constituted by the lower p-layer 86a, the current constriction layer 86b, and the upper p-layer 86c that are sequentially stacked. The lower p-layer 86a and the upper p-layer 86c are formed of p-type $Al_{0.9}GaN$ with an impurity concentration of $1\times10^{18}/cm^3$, for example. The Al composition ratio may be changed within a range of 0 to 1.

Since it is difficult to use an oxidized constriction layer as the current constriction layer 86b on a GaN substrate, a desirable structure in this case is those illustrated in FIGS. 11, 17, 19, 20, and 24 in which the light-absorbing layer 85, the ridge structure, or the buried structure is used as the current constriction layer. Alternatively, it is effective to use ion implantation as a current constriction method.

The light-emitting layer 87 has a quantum well structure in which well layers and barrier layers are alternately stacked. The well layers are formed of GaN, InGaN, or AlGaN, for example, and the barrier layers are formed of AlGaN or GaN, for example. When the well layers of the light-emitting layer 87 of the light-emitting diode LED is formed of GaN, the light-absorbing layer 85 is desirably formed of InGaN. Note that the light-emitting layer 87 may have a quantum wire structure or a quantum dot structure.

The n-cathode layer 88 is formed of n-type $Al_{0.9}GaN$ with an impurity concentration of $1\times10^{18}/cm^3$, for example. The Al composition ratio may be changed within a range of 0 to 1.

An example of a semiconductor stack in the case where an InP substrate is used is as described below.

The p-anode layer 81 is formed of p-type InGaAsP with an impurity concentration of $1\times10^{18}/cm^3$, for example. The Ga composition ratio may be changed within a range of 0 to 1.

The n-gate layer 82 is formed of n-type InGaAsP with an impurity concentration of $1\times10^{17}/cm^3$, for example. The Ga composition ratio may be changed within a range of 0 to 1.

The p-gate layer 83 is formed of p-type InGaAsP with an impurity concentration of $1\times10^{17}/cm^3$, for example. The Ga composition ratio may be changed within a range of 0 to 1.

The n-cathode layer 84 is formed of n-type InGaAsP with an impurity concentration of $1\times10^{18}/cm^3$, for example. The Ga composition ratio may be changed within a range of 0 to 1.

When the light-absorbing layer 85 is a layer having a bandgap smaller than the bandgap equivalent to light emitted by the driving thyristor S, InAs having a lattice constant that substantially matches the lattice constant of InP or a ternary/quaternary mixed crystal material such as a compound of GaAs and InP, a compound of InN and InSb, and a compound of InN and InAs may be used for the light-absorbing layer 85. A ternary/quaternary mixed crystal material having small bandgap energy may be used. In particular, a quaternary mixed crystal material mainly formed of GaInNAs is suitably used. These may contain Al, Ga, As, P, Sb, or the like. In addition, (1) an InAs layer or InGaAs layer obtained by metamorphic growth, for example; and (2) quantum dots of InAs, InGaAs, InNAs, InNSb, GaSb, GaSbP, or GaSbAs may be used. These may contain Al, Ga, N, As, P, Sb, or the like. Note that in the case of quantum dots, the lattice constants need not necessarily match and a binary mixed crystal material may be used.

In addition, when the light-absorbing layer 85 is a layer having a high impurity concentration, for example, $n^{++}InP$, $p^{++}InP$, $n^{++}InAsP$, $p^{++}InAsP$, $n^{++}InGaAsP$, $p^{++}InGaAsP$, $n^{++}InGaAsPSb$, or $p^{++}InGaAsPSb$ may be used. The expression "$n^{++}$" or "$p^{++}$" indicates a high impurity concentration that is in a range from $1\times10^{19}/cm^3$ to $3\times10^{20}/cm^3$.

The p-anode layer 86 is constituted by the lower p-layer 86a, the current constriction layer 86b, and the upper p-layer 86c that are sequentially stacked. The lower p-layer 86a and the upper p-layer 86c are formed of p-type InGaAsP with an impurity concentration of $1\times10^{18}/cm^3$, for example. The Ga composition ratio may be changed within a range of 0 to 1.

Since it is difficult to use an oxidized constriction layer as the current constriction layer on the InP substrate, a desirable structure is those illustrated in FIGS. 11, 17, 19, 20, and 24 in which the light-absorbing layer 85, the ridge structure, or the buried structure is used as the current constriction layer. Alternatively, it is effective to use ion implantation as a current constriction method.

The light-emitting layer 87 has a quantum well structure in which well layers and barrier layers are alternately stacked. The well layers are formed of InAs, InGaAsP, AlGaInAs, or GaInAsPSb, for example, and the barrier layers are formed of InP, InAsP, InGaAsP, or AlGaInAsP, for example. When the well layers of the light-emitting layer 87 of the light-emitting diode LED are formed of InGaAsP, the light-absorbing layer 85 is desirably formed of InGaAs. Note that the light-emitting layer 87 may have a quantum wire stricture or a quantum dot structure.

The n-cathode layer 88 is formed of n-type InGaAsP with an impurity concentration of $1\times10^{18}/cm^3$, for example. The Ga composition ratio may be changed within a range of 0 to 1.

These semiconductor layers are stacked using MOCVD or MBE, for example. Consequently, a semiconductor stack is formed.

In each of the exemplary embodiments, the cases where the light-emitting chips are used in a printhead and in an image forming apparatus that uses the printhead have been described. However, the light-emitting chips may be used in a light-emitting device other than these devices. For example, the light-emitting chips may be used in a light-emitting device for a projector or a three-dimensional printer or in a light-emitting device used for object shape recognition or distance measurement. In the cases where the light-emitting chips are used for these applications, a line of light emitted from the light-emitting chips may be reflected in a direction crossing this line. That is, light emitted from the light-emitting chips arranged in a line in the main scanning direction may be reflected in a sub-scanning direction crossing the line, so that the light is emitted two dimensionally. A polygon mirror, a micro electro mechanical systems (MEMS) mirror, or the like may be used as a reflector. In addition, in the case where light is emitted from the light-emitting chips two dimensionally, the light may be emitted only through an optical system, such as a lens, without using the reflector.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting component comprising:
    a light-emitting element having at least two layers and configured to emit light of a predetermined wavelength;
    a driving thyristor having at least four layers and configured to cause the light-emitting element to emit light or to cause an amount of light emitted by the light-emitting element to increase, upon entering an on-state; and
    a light-absorbing layer that is disposed between the light-emitting element and the driving thyristor and that absorbs light emitted by the driving thyristor,
    wherein the light-emitting element, the driving thyristor, and the light-absorbing layer are stacked on a substrate in a direction perpendicular to the substrate.

2. The light-emitting component according to claim 1, wherein the light-absorbing layer includes a semiconductor layer having a bandgap that is smaller than a bandgap equivalent to the light emitted by the driving thyristor.

3. The light-emitting component according to claim 2, wherein
    each of the light-emitting element and the driving thyristor includes a plurality of semiconductor layers that are stacked, and
    the light-absorbing layer includes a semiconductor layer having a conductivity type identical to a conductivity type of one of a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor, and having an impurity concentration that is higher than an impurity concentration of the one of the light-emitting-element-side semiconductor layer and the driving-thyristor-side semiconductor layer.

4. The light-emitting component according to claim 3, wherein
    each of the light-emitting element and the driving thyristor includes a plurality of semiconductor layers that are stacked, and
    the light-absorbing layer is configured to maintain a direction in which current easily flows in a case where a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor are directly joined.

5. The light-emitting component according to claim 3, wherein
    each of the light-emitting element, the driving thyristor, and the light-absorbing layer includes a plurality of semiconductor layers that are stacked,
    a layer that is in contact with the light-absorbing layer among the plurality of semiconductor layers of the driving thyristor and a layer that is in contact with the driving thyristor among the plurality of semiconductor layers of the light-absorbing layer have an identical conductivity type,
    a layer that is in contact with the light-absorbing layer among the plurality of semiconductor layers of the light-emitting element and a layer that is in contact with the light-emitting element among the plurality of semiconductor layers of the light-absorbing layer have an identical conductivity type,
    the layer that is in contact with the driving thyristor among the plurality of semiconductor layers of the light-absorbing layer has an impurity concentration higher than an impurity concentration of the layer that is in contact with the light-absorbing layer among the plurality of semiconductor layers of the driving thyristor, and
    the layer that is in contact with the light-emitting element among the plurality of semiconductor layers of the light-absorbing layer has an impurity concentration higher than an impurity concentration of the layer that is in contact with the light-absorbing layer among the plurality of semiconductor layers of the light-emitting element.

6. The light-emitting component according to claim 2, wherein
    each of the light-emitting element and the driving thyristor includes a plurality of semiconductor layers that are stacked, and
    the light-absorbing layer is configured to maintain a direction in which current easily flows in a case where a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor are directly joined.

7. The light-emitting component according to claim 2, wherein
    each of the light-emitting element, the driving thyristor, and the light-absorbing layer includes a plurality of semiconductor layers that are stacked, a layer that is in contact with the light-absorbing layer among the plurality of semiconductor layers of the driving thyristor and a layer that is in contact with the driving thyristor among the plurality of semiconductor layers of the light-absorbing layer have an identical conductivity type, a layer that is in contact with the light-absorbing layer among the plurality of semiconductor layers of the light-emitting element and a layer that is in contact with the light-emitting element among the plurality of semiconductor layers of the light-absorbing layer have an identical conductivity type, the layer that is in contact with the driving thyristor among the plurality of semiconductor layers of the light-absorbing layer has an impurity concentration higher than an impurity concentration of the layer that is in contact with the light-absorbing layer among the plurality of semiconductor layers of the driving thyristor, and the layer that is in contact with the light-emitting element among the plurality of semiconductor layers of the light-absorbing layer has an impurity concentration higher than an impurity concentration of the layer that is in contact with the light-absorbing layer among the plurality of semiconductor layers of the light-emitting element.

8. The light-emitting component according to claim 1, wherein each of the light-emitting element and the driving thyristor includes a plurality of semiconductor layers that are stacked, and the light-absorbing layer includes a semiconductor layer having a conductivity type identical to a conductivity type of one of a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor, and having an impurity concentration that is higher than an impurity concentration of the one of the light-emitting-element-side semiconductor layer and the driving-thyristor-side semiconductor layer.

9. The light-emitting component according to claim 8, wherein each of the light-emitting element and the driving thyristor includes a plurality of semiconductor layers that are stacked, and the light-absorbing layer is configured to maintain a direction in which current easily flows in a case where a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor are directly joined.

10. The light-emitting component according to claim 8, wherein each of the light-emitting element, the driving thyristor, and the light-absorbing layer includes a plurality of semiconductor layers that are stacked, a layer that is in contact with the light-absorbing layer among the plurality of semiconductor layers of the driving thyristor and a layer that is in contact with the driving thyristor among the plurality of semiconductor layers of the light-absorbing layer have an identical conductivity type, a layer that is in contact with the light-absorbing layer among the plurality of semiconductor layers of the light-emitting element and a layer that is in contact with the light-emitting element among the plurality of semiconductor layers of the light-absorbing layer have an identical conductivity type, the layer that is in contact with the driving thyristor among the plurality of semiconductor layers of the light-absorbing layer has an impurity concentration higher than an impurity concentration of the layer that is in contact with the light-absorbing layer among the plurality of semiconductor layers of the driving thyristor, and the layer that is in contact with the light-emitting element among the plurality of semiconductor layers of the light-absorbing layer has an impurity concentration higher than an impurity concentration of the layer that is in contact with the light-absorbing layer among the plurality of semiconductor layers of the light-emitting element.

11. The light-emitting component according to claim 1, wherein each of the light-emitting element and the driving thyristor includes a plurality of semiconductor layers that are stacked, and the light-absorbing layer is configured to maintain a direction in which current easily flows in a case where a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor are directly joined.

12. The light-emitting component according to claim 1, wherein each of the light-emitting element, the driving thyristor, and the light-absorbing layer includes a plurality of semiconductor layers that are stacked, a layer that is in contact with the light-absorbing layer among the plurality of semiconductor layers of the driving thyristor and a layer that is in contact with the driving thyristor among the plurality of semiconductor layers of the light-absorbing layer have an identical conductivity type, a layer that is in contact with the light-absorbing layer among the plurality of semiconductor layers of the light-emitting element and a layer that is in contact with the light-emitting element among the plurality of semiconductor layers of the light-absorbing layer have an identical conductivity type, the layer that is in contact with the driving thyristor among the plurality of semiconductor layers of the light-absorbing layer has an impurity concentration higher than an impurity concentration of the layer that is in contact with the light-absorbing layer among the plurality of semiconductor layers of the driving thyristor, and the layer that is in contact with the light-emitting element among the plurality of semiconductor layers of the light-absorbing layer has an impurity concentration higher than an impurity concentration of the layer that is in contact with the light-absorbing layer among the plurality of semiconductor layers of the light-emitting element.

13. The light-emitting component according to claim 1, wherein the light-emitting element and the driving thyristor have different emission spectra.

14. A light-emitting device comprising:
a plurality of light-emitting components, each of the plurality of light-emitting components being the light-emitting component according to claim 1;
a plurality of transfer elements that allow the driving thyristors to sequentially enter the on-state upon sequentially entering the on-state; and
an optical system that emits light emitted from the light-emitting components two-dimensionally.

15. An image forming apparatus comprising:
an image bearing member;
a charging member that charges the image bearing member;
the light-emitting device according to claim 14 that exposes the image bearing member that has been charged by the charging member to light;
a developing member that develops an electrostatic latent image formed on the image bearing member that has been exposed to light by the light-emitting device; and
a transfer member that transfers an image developed on the image bearing member onto a transferred-image-receiving medium.

16. The light-emitting component according to claim 1, wherein the at least two layers and the at least four layers are physically different layers.

17. The light-emitting component according to claim 16, wherein the driving thyristor is formed on the substrate, the light-absorbing layer is formed on the driving thyristor, and the light-emitting element is formed on the light-absorbing layer.

18. The light-emitting component according to claim 1, wherein the driving thyristor is formed on the substrate, the light-absorbing layer is formed on the driving thyristor, and the light-emitting element is formed on the light-absorbing layer.

19. A light-emitting component comprising:
a light-emitting element that emits light of a predetermined wavelength;
a driving thyristor that causes the light-emitting element to emit light or that causes an amount of light emitted by the light-emitting element to increase, upon entering an on-state; and
a light-absorbing layer that is disposed between the light-emitting element and the driving thyristor such that the light-emitting element and the driving thyristor are stacked and that absorbs light emitted by the driving thyristor, wherein
each of the light-emitting element and the driving thyristor includes a plurality of semiconductor layers that are stacked, and
the light-absorbing layer includes a semiconductor layer having a conductivity type identical to a conductivity type of one of a light-emitting-element-side semiconductor layer that is in contact with the light-absorbing layer among the plurality of semiconductor layers of the light-emitting element and a driving-thyristor-side semiconductor layer that is in contact with the light-absorbing layer among the plurality of semiconductor layers of the driving thyristor, and having an impurity concentration that is higher than an impurity concentration of the one of the light-emitting-element-side semiconductor layer and the driving-thyristor-side semiconductor layer.

* * * * *